US011955195B2

(12) United States Patent
Kim et al.

(10) Patent No.: US 11,955,195 B2
(45) Date of Patent: Apr. 9, 2024

(54) SEMICONDUCTOR MEMORY DEVICE WITH DEFECT DETECTION CAPABILITY

(71) Applicant: SAMSUNG ELECTRONICS CO., LTD., Suwon-si (KR)

(72) Inventors: Seongkyung Kim, Hwaseong-si (KR); Dahye Min, Suwon-si (KR); Ukjin Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 17/748,441

(22) Filed: May 19, 2022

(65) Prior Publication Data

US 2023/0104520 A1 Apr. 6, 2023

(30) Foreign Application Priority Data

Oct. 6, 2021 (KR) .......................... 10-2021-0132672

(51) Int. Cl.
*G11C 11/412* (2006.01)
*G11C 29/50* (2006.01)

(52) U.S. Cl.
CPC ............ *G11C 29/50* (2013.01); *G11C 11/412* (2013.01); *G11C 2029/5004* (2013.01)

(58) Field of Classification Search
CPC .................. G11C 29/50; G11C 11/412; G11C 2029/5004
See application file for complete search history.

(56) References Cited

U.S. PATENT DOCUMENTS

| | | | |
|---|---|---|---|
| 6,465,266 B1 | 10/2002 | Yassine et al. | |
| 8,575,955 B1 | 11/2013 | Brozek | |
| 9,035,681 B2 | 5/2015 | Lee et al. | |
| 2007/0210306 A1 | 9/2007 | Molinelli Acocella et al. | |
| 2011/0215390 A1* | 9/2011 | Kim | H01L 29/861 257/532 |
| 2012/0168751 A1* | 7/2012 | Tseng | H01L 23/544 257/E23.002 |
| 2013/0292777 A1* | 11/2013 | Liaw | G11C 11/412 257/369 |
| 2014/0264476 A1* | 9/2014 | Tseng | H01L 29/66545 257/256 |

(Continued)

FOREIGN PATENT DOCUMENTS

CN 107293503 A 10/2017
JP 3153023 B2 4/2001

*Primary Examiner* — Min Huang
(74) *Attorney, Agent, or Firm* — Sughrue Mion, PLLC

(57) ABSTRACT

According to various embodiments, a semiconductor memory device includes a substrate that includes a memory cell region and a test region. The semiconductor memory device further includes an active pattern on the memory cell region, a source/drain pattern on the active pattern, a dummy pattern on the test region, a first gate electrode on the dummy pattern, a first common contact, and a first wiring layer. The first wiring layer includes a first test line electrically connected to the first common contact. The first common contact includes a first contact pattern in contact with the dummy pattern, and a first gate contact connected to the first gate electrode. The first gate contact includes a body and a protrusion part. A lowermost level of a top surface of the active pattern is lower than a lowermost level of a top surface of the dummy pattern.

20 Claims, 58 Drawing Sheets

(56) References Cited

U.S. PATENT DOCUMENTS

2016/0133623 A1* 5/2016 Xie ................. H01L 23/528
                                                    438/586
2021/0210479 A1* 7/2021 Kang ............... H01L 27/0207

* cited by examiner

SEMICONDUCTOR MEMORY DEVICE WITH DEFECT DETECTION CAPABILITY

CROSS-REFERENCE TO RELATED APPLICATIONS

This application claims benefit of priority under 35 U.S.C § 119 to Korean Patent Application No. 10-2021-0132672, filed on Oct. 6, 2021, in the Korean Intellectual Property Office, the disclosure of which is incorporated herein by reference in its entirety.

BACKGROUND

1. Technical Field

The present disclosure relates to a semiconductor memory device, and more particularly, to a semiconductor memory device including a static random access memory (SRAM) cell.

2. Description of Related Art

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually becoming more complicated and more integrated to meet these requested characteristics.

SUMMARY

Some embodiments of the present disclosure provide a semiconductor memory device capable of detecting defects.

According to some embodiments of the present disclosure, a semiconductor memory device includes a substrate that includes a memory cell region and a test region. The semiconductor memory device further includes an active pattern on the memory cell region. The semiconductor memory device further includes a source/drain pattern on the active pattern. The semiconductor memory device further includes a dummy pattern on the test region. The semiconductor memory device further includes a first gate electrode that extends in a first direction on the dummy pattern. The semiconductor memory device further includes a first common contact in contact with the dummy pattern and the first gate electrode. The semiconductor memory device further includes a first wiring layer on the first common contact. The first wiring layer includes a first test line electrically connected to the first common contact. The first common contact includes a first contact pattern in contact with the dummy pattern. The first common contact further includes a first gate contact electrically connected to the first gate electrode. The first gate contact includes a body part coupled to the first gate electrode. The first gate contact includes a protrusion part that extends from the body part and into the first contact pattern. A lowermost level of a top surface of the active pattern may be lower than a lowermost level of a top surface of the dummy pattern.

According to some embodiments of the present disclosure, a semiconductor memory device includes a memory cell region and a test region on a substrate. The semiconductor memory device further includes a dummy pattern on the test region. The semiconductor memory device further includes a first gate electrode that extends in a first direction on the dummy pattern. The semiconductor memory device further includes a first common contact in contact with the dummy pattern and the first gate electrode. The semiconductor memory device further includes a second gate electrode spaced apart from the first gate electrode in a second direction that intersects the first direction. The semiconductor memory device further includes a second common contact spaced apart in the first direction from the first common contact. The semiconductor memory device further includes a first wiring layer provided on and coupled to the first and second common contacts. The first wiring layer includes a first test line and a second test line that extend in the second direction. The first and second test lines are respectively electrically connected to the first and second common contacts. The first common contact includes a first contact pattern in contact with the dummy pattern. The first common contact further includes a first gate contact electrically connected to the first gate electrode. The second common contact includes a second contact pattern in contact with the dummy pattern. The second common contact further includes a second gate contact electrically connected to the second gate electrode. The first gate contact includes a first body part coupled to the first gate electrode. The first gate contact further includes a first protrusion part that extends from the first body part and into the first contact pattern.

According to some embodiments of the present disclosure, a semiconductor memory device includes a substrate that includes a memory cell region and a test region. The semiconductor memory device further includes an active pattern on the memory cell region. The semiconductor memory device further includes a source/drain pattern on the active pattern. The semiconductor memory device further includes a dummy pattern on the test region. The semiconductor memory device further includes a device isolation layer on the substrate. The device isolation layer covers a lower sidewall of each of the active pattern and the dummy pattern. An upper portion of each of the active pattern and the dummy pattern protrudes upwardly from the device isolation layer. The semiconductor memory device further includes a first gate electrode on the active pattern and extending in a first direction. The first gate electrode and the source/drain pattern are adjacent to each other in a second direction that intersects the first direction. The semiconductor memory device further includes a first common contact coupled to the source/drain pattern and the first gate electrode. The first common contact electrically connects the source/drain pattern and the first gate electrode to each other. The semiconductor memory device further includes a second gate electrode that extends in the first direction on the dummy pattern. The semiconductor memory device further includes a second common contact in contact with the dummy pattern and the second gate electrode. The semiconductor memory device further includes a gate spacer on a sidewall of each of the first and second gate electrodes. The semiconductor memory device further includes a gate capping pattern on a top surface of each of the first and second gate electrodes. The semiconductor memory device further includes an interlayer dielectric layer on the gate capping pattern. The semiconductor memory device further includes a first wiring layer, a second wiring layer, and a third wiring layer that are sequentially stacked on the interlayer dielectric layer. The first common contact includes an active contact that penetrates the interlayer dielectric layer and electrically connects with the source/drain pattern. The first common contact further includes a first gate contact that penetrates the gate capping pattern and electrically connects with the first gate electrode. The second common contact includes a first contact pattern that penetrates the interlayer dielectric layer and contacts the dummy pattern. The second common contact further includes a second gate contact that penetrates the gate capping pattern and electrically connects with the second gate electrode. The first gate contact includes a first body part coupled to the first gate electrode. The first gate contact further includes a first protrusion part that extends from the first body part and into the active pattern. The second gate contact includes a second body part coupled to the second gate electrode. The second gate contact further includes a second protrusion part that extends from the second body part and into the first contact pattern. The first wiring layer includes a first test line electrically connected to the second common contact. The first test line may extend in the second direction. A lowermost level of a top surface of the active pattern may be lower than a lowermost level of a top surface of the dummy pattern.

DETAILED DESCRIPTION

The embodiments described herein are example embodiments, and thus, the disclosure is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
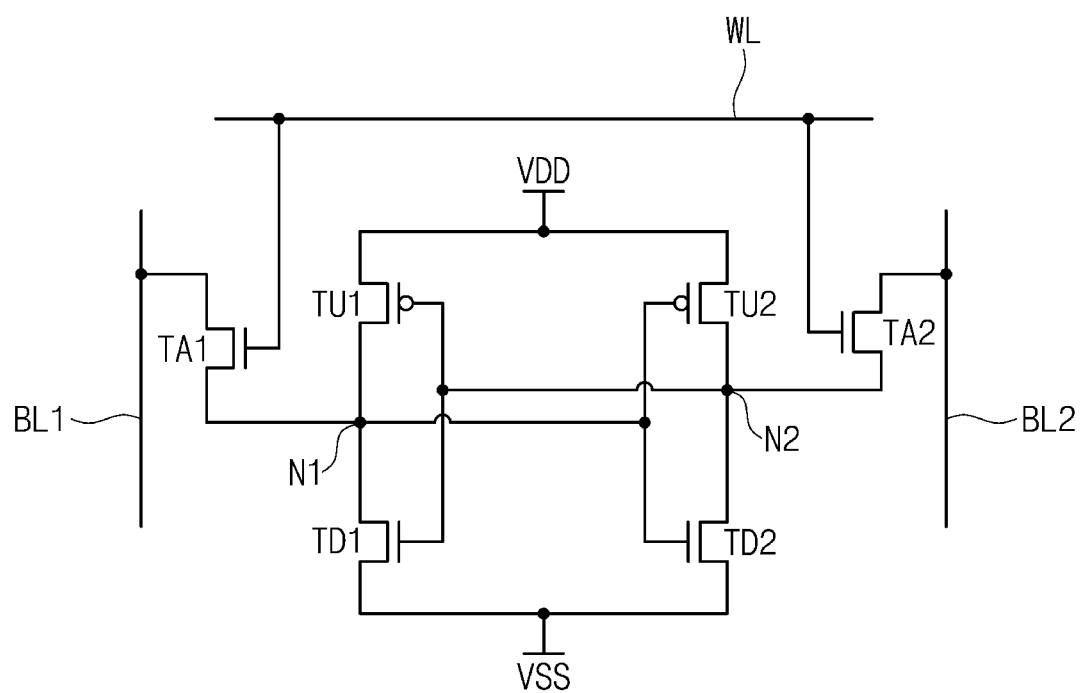
FIG. 1 illustrates an equivalent circuit diagram showing a static random access memory (SRAM) cell according to some embodiments of the present disclosure.

FIG. 1 illustrates an equivalent circuit diagram showing a static random access memory (SRAM) cell according to some embodiments of the present disclosure.

Referring to FIG. 1, an SRAM cell according to some embodiments of the present disclosure may include a first pull-up transistor TU1, a first pull-down transistor TD1, a second pull-up transistor TU2, a second pull-down transistor TD2, a first pass-gate transistor TA1, and a second pass-gate transistor TA2. The first and second pull-up transistors TU1 and TU2 may be positive metal oxide semiconductor (PMOS) transistors. The first and second pull-down transistors TD1 and TD2 and the first and second pass-gate transistors TA1 and TA2 may be negative metal oxide semiconductor (NMOS) transistors.

A first node N1 may be connected to a first source/drain of the first pull-up transistor TU1 and a first source/drain of the first pull-down transistor TD1. A power line VDD may be connected to a second source/drain of the first pull-up transistor TU1, and a ground line VSS (e.g., zero (0) volts and/or other reference voltage) may be connected to a second source/drain of the first pull-down transistor TD1. The first pull-up transistor TU1 may have a gate electrically connected to that of the first pull-down transistor TD1. The first pull-up transistor TU1 and the first pull-down transistor TD1 may constitute a first inverter. The first inverter may have an input terminal that corresponds to the connected gates of the first pull-up and pull-down transistors TU1 and TD1, and may have an output terminal that corresponds to the first node N1.

A second node N2 may be connected to a first source/drain of the second pull-up transistor TU2 and a first source/drain of the second pull-down transistor TD2. The power line VDD may be connected to a second source/drain of the second pull-up transistor TU2, and the ground line VSS may be connected to a second source/drain of the second pull-down transistor TD2. The second pull-up and pull-down transistors TU2 and TD2 may have their gates that are electrically connected to each other. The second pull-up transistor TU2 and the second pull-down transistor TD2 may thus constitute a second inverter. The second inverter may have an input terminal that corresponds to the connected gates of the second pull-up and pull-down transistors TU2 and TD2, and may have an output terminal that corresponds to the second node N2.

The first and second inverters may be connected to each other to constitute a latch structure. In this configuration, the gates of the first pull-up and pull-down transistors TU1 and TD1 may be electrically connected to the second node N2, and the gates of the second pull-up and pull-down transistors TU2 and TD2 may be electrically connected to the first node N1. The first pass-gate transistor TA1 may have a first source/drain connected to the first node N1 and a second source/drain connected to a first bit line BL1. The second pass-gate transistor TA2 may have a first source/drain connected to the second node N2 and a second source/drain connected to a second bit line BL2. The first and second pass-gate transistors TA1 and TA2 may have their gates electrically connected to a word line WL. The configuration above may achieve the SRAM cell according to some embodiments of the present disclosure.

It may be understood that the exemplary equivalent circuit diagram of the SRAM cell illustrated in FIG. 1 is only one example of an SRAM cell configuration that may be utilized without departing from the scope described herein. For example, other configurations may incorporate different types and/or quantities of transistors and/or other electronic elements arranged and/or connected in different structures.

Figure 2:
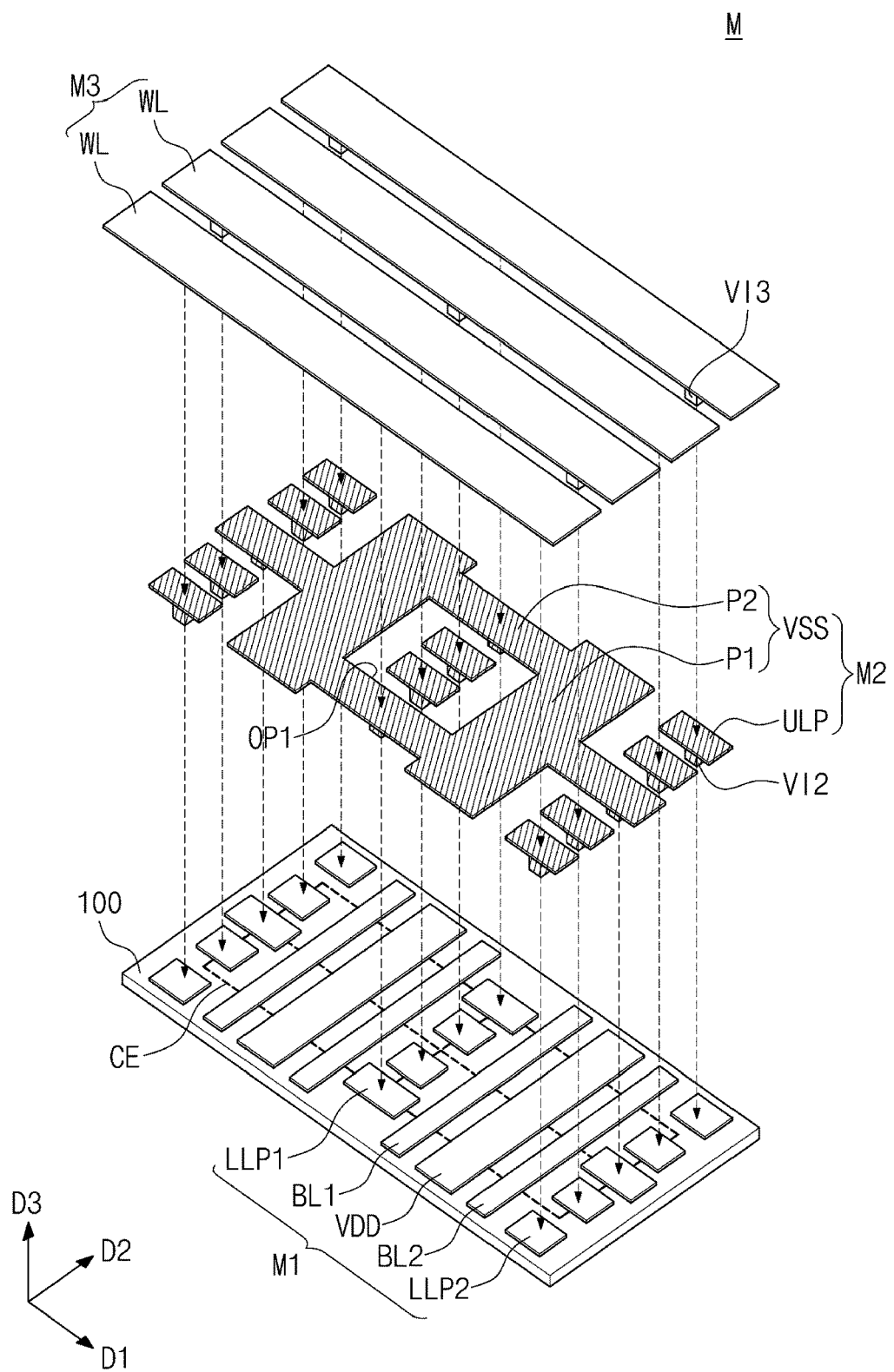
FIG. 2 illustrates a perspective view showing wiring layers of a semiconductor memory device according to some embodiments of the present disclosure.
Figure 3:
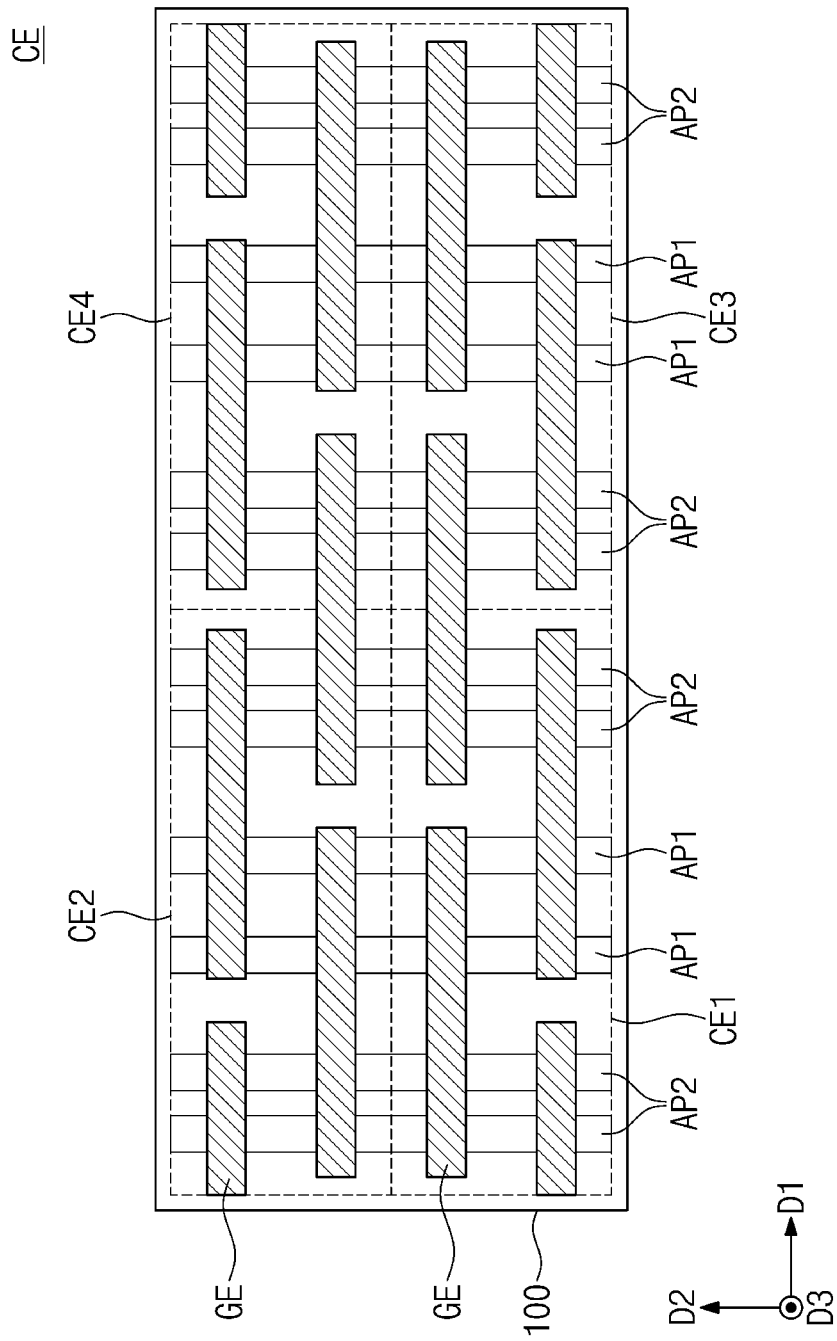
FIG. 3 illustrates a plan view showing a memory cell of FIG. 2.

FIG. 2 illustrates a perspective view showing wiring layers of a semiconductor memory device according to some embodiments of the present disclosure. FIG. 3 illustrates a plan view showing a memory cell of FIG. 2.

Referring to FIGS. 2 and 3, a memory cell CE may be provided on the substrate 100. Referring to FIG. 3, the memory cell CE may include a first to fourth bit cells CE1 to CE4 that are arranged in a two-by-two grid. Each of the first to fourth bit cells CE1 to CE4 may be the SRAM cell discussed above with reference to FIG. 1. For example, a detailed structure of the first bit cell CE1 is discussed below with reference to FIGS. 4 and 5A to 5E. Each of the second, third, and fourth bit cells CE2, CE3, and CE4 may have a structure symmetrical, and/or at least similar, to that of the first bit cell CE1, and, as such, a specific description of the second, third, and fourth bit cells CE2, CE3, and CE4 is omitted for the sake of brevity.

The memory cell CE may be provided thereon with a first wiring layer M1, a second wiring layer M2, and a third wiring layer M3. The first, second, and third wiring layers M1, M2, and M3 may be sequentially stacked. Alternatively or additionally, the first, second, and third wiring layers M1, M2, and M3 may be arranged in a different order and/or configuration. The disclosure is not limited in this manner. The first, second, and third wiring layers M1, M2, and M3 may include at least one compound selected from a conductive metal nitride (e.g., titanium nitride or tantalum nitride) and a metal (e.g., titanium, tantalum, tungsten, copper, or aluminum), or a combination thereof.

The first wiring layer M1 may include a first bit line BL1, a second bit line BL2, and a power line VDD that extend in a second direction D2. The power line VDD may be interposed between the first bit line BL1 and the second bit line BL2. When viewed in a plan view, the first bit line BL1, the second bit line BL2, and the power line VDD may each have a linear shape. The power line VDD may have a width in a first direction D1 greater than a width in the first direction D1 of each of the first and second bit lines BL1 and BL2. Alternatively or additionally, the power line VDD may have a width in the first direction D1 less than or equal to the width in the first direction D1 of each of the first and second bit lines BL1 and BL2.

The first wiring layer M1 may further include a first lower landing pad LLP1 and a second lower landing pad LLP2 that may be adjacent to the first and second bit lines BL1 and BL2, respectively. The first and second lower landing pads LLP1 and LLP2 may be arranged along the second direction D2. When viewed in a plan view, the first and second lower landing pads LLP1 and LLP2 may each have an island shape.

The first wiring layer M1 may further include first vias (not shown) that are correspondingly provided below the first bit line BL1, the second bit line BL2, the power line VDD, the first lower landing pad LLP1, and the second lower landing pad LLP2. The memory cell CE and the first wiring layer M1 may be electrically connected to each other through the first vias.

The second wiring layer M2 may include a ground line VSS and an upper landing pad ULP. The ground line VSS may be a mesh-typed conductive structure. The ground line VSS may have at least one first opening OP1. For example, the ground line VSS may include a first part P1 that extends in the second direction D2 and a second part P2 that extends in the first direction D1. The first part P1 may have a width greater than that of the second part P2. The first opening OP1 may be defined by a pair of neighboring first parts P1 and a pair of neighboring second parts P2.

A pair of upper landing pads ULP may be disposed in the first opening OP1. The pair of upper landing pads ULP in the first opening OP1 may be arranged in the second direction D2. The upper landing pads ULP may each have an island shape when viewed in a plan view.

The second parts P2 of the ground line VSS may vertically overlap corresponding first lower landing pads LLP1. The upper landing pads ULP may vertically overlap corresponding second lower landing pads LLP2.

The second wiring layer M2 may further include a plurality of second vias VI2 that are correspondingly provided below the ground line VSS and the upper landing pad ULP. The ground line VSS may be electrically connected through at least one second via VI2 to the first lower landing pad LLP1 of the first wiring layer M1. Because a plurality of second vias VI2 are provided below the ground line VSS, a plurality of first lower landing pads LLP1 may be connected in common to a single ground line VSS. The upper landing pad ULP may be electrically connected through at least one second via VI2 to the second lower landing pad LLP2 of the first wiring layer M1.

According to some embodiments of the present disclosure, the second wiring layer M2 may consist only of the ground line VSS, the upper landing pads ULP, and the plurality of second vias VI2. For example, the second wiring layer M2 may not include any of lines (e.g., bit line, power line, and word line) other than the ground line VSS.

The third wiring layer M3 may include word lines WL that extend in the first direction D1. The word lines WL may be arranged in the second direction D2. The word lines WL may each have a linear shape when viewed in a plan view.

The third wiring layer M3 may further include a plurality of third vias VI3 provided below the word line WL. The word line WL may be electrically connected through the plurality of third vias VI3 to the upper landing pad ULP of the second wiring layer M2. For example, the word line WL may be electrically connected through the plurality of third vias VI3, the upper landing pad ULP, and the plurality of second vias VI2 to the second lower landing pad LLP2 of the first wiring layer M1.

According to some embodiments of the present disclosure, the third wiring layer M3 may consist only of the word lines WL and the plurality of third vias VI3. For example, the third wiring layer M3 may not include any of lines (e.g., bit line, power line, and ground line) other than the word line WL.

It may be understood that the wiring layers of the semiconductor memory device illustrated in FIG. 2 is only one example of a wiring layer configuration that may be utilized without departing from the scope described herein. For example, other configurations may incorporate more or less wiring layers that may include different types and/or quantities of elements arranged and/or connected in different structures.

Figure 4:
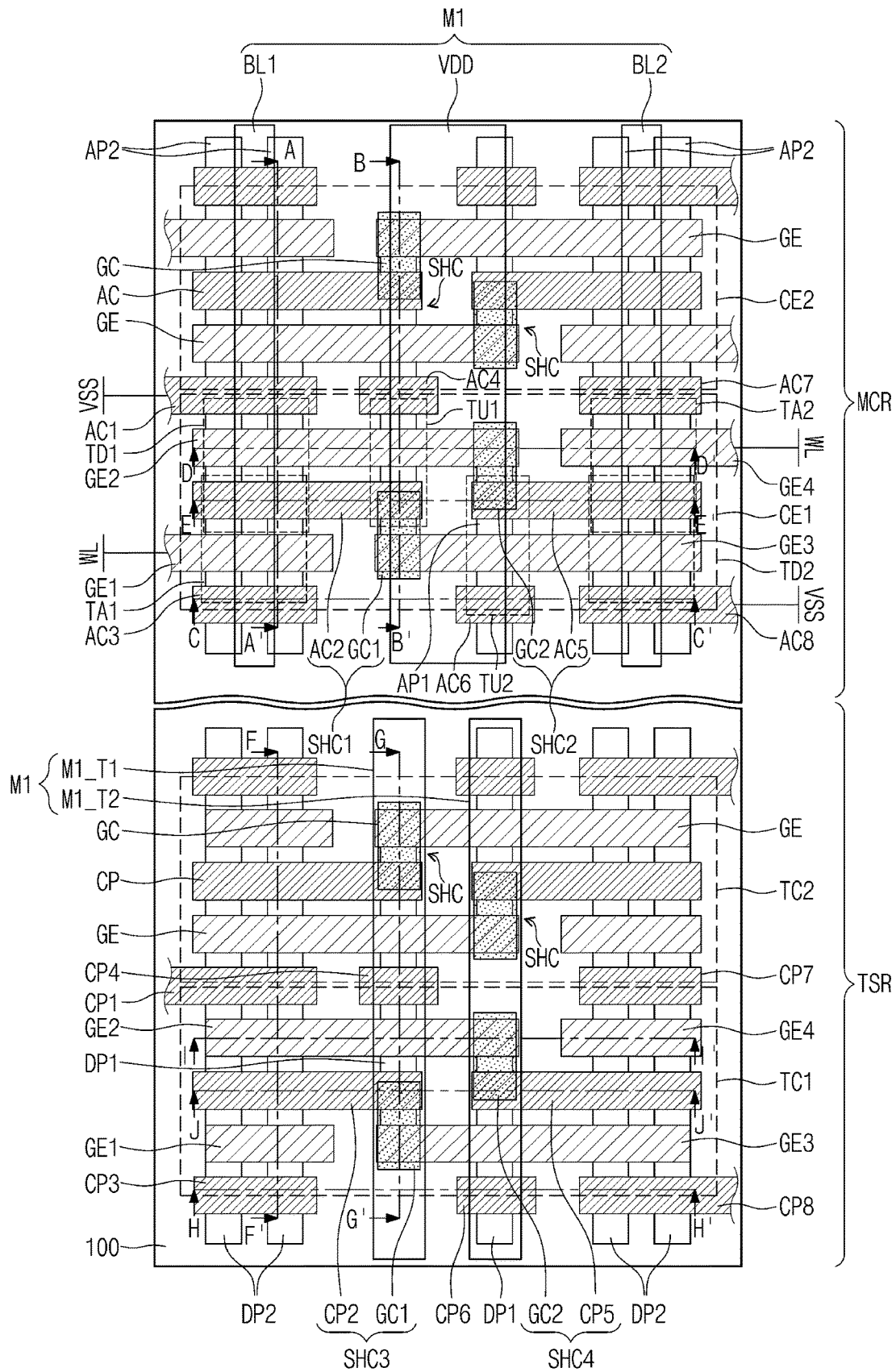
FIG. 4 illustrates a plan view showing a semiconductor memory device according to some embodiments of the present disclosure.
Figure 5A:
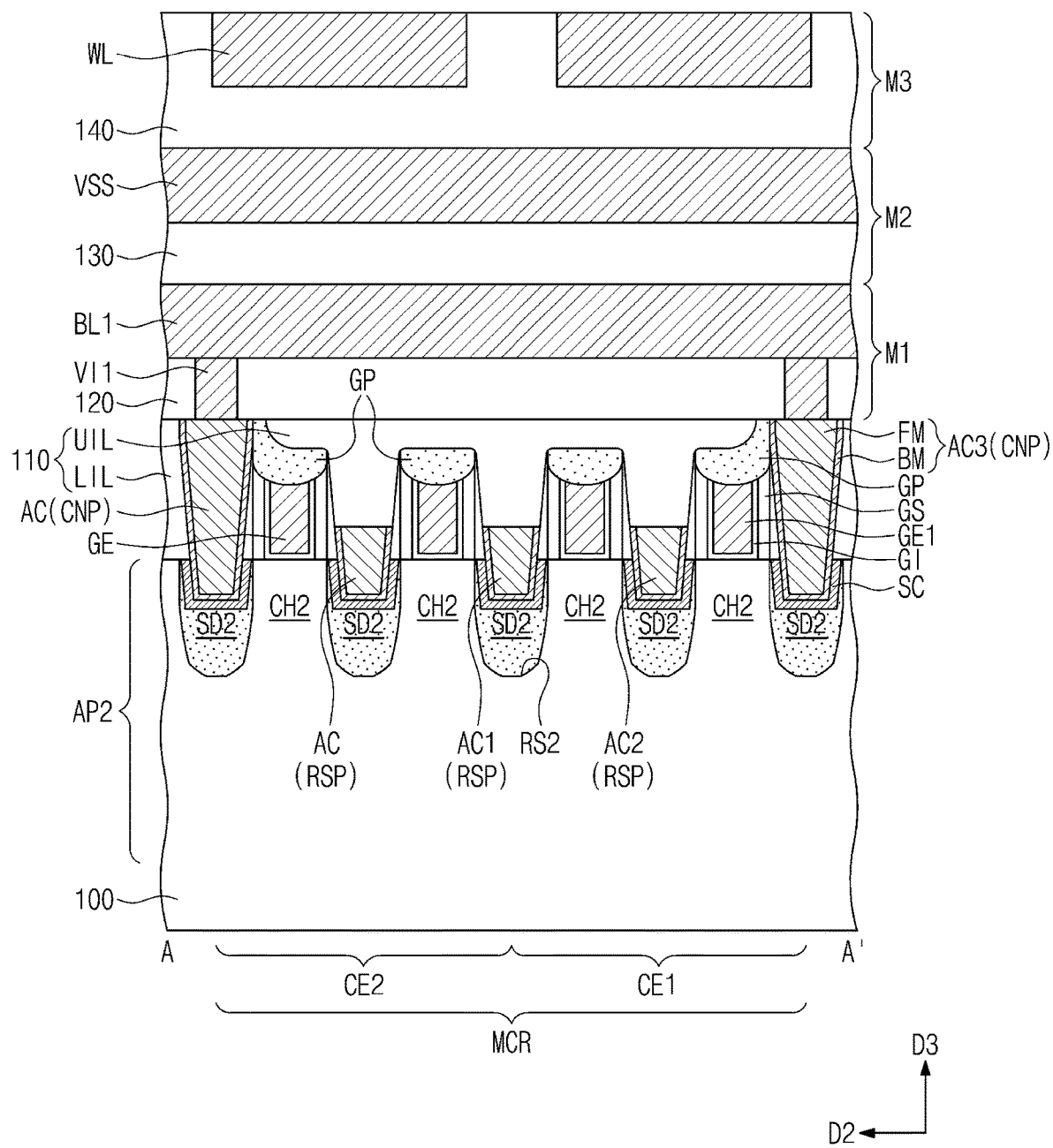
FIGS. 5A, 5B, 5C, 5D, 5E, 5F, 5G, 5H, 5I, and 5J illustrate cross-sectional views respectively taken along lines A-A', B-B', C-C', D-D', E-E', F-F', G-G', H-H', I-I', and J-J' of FIG. 4.
Figure 5B:
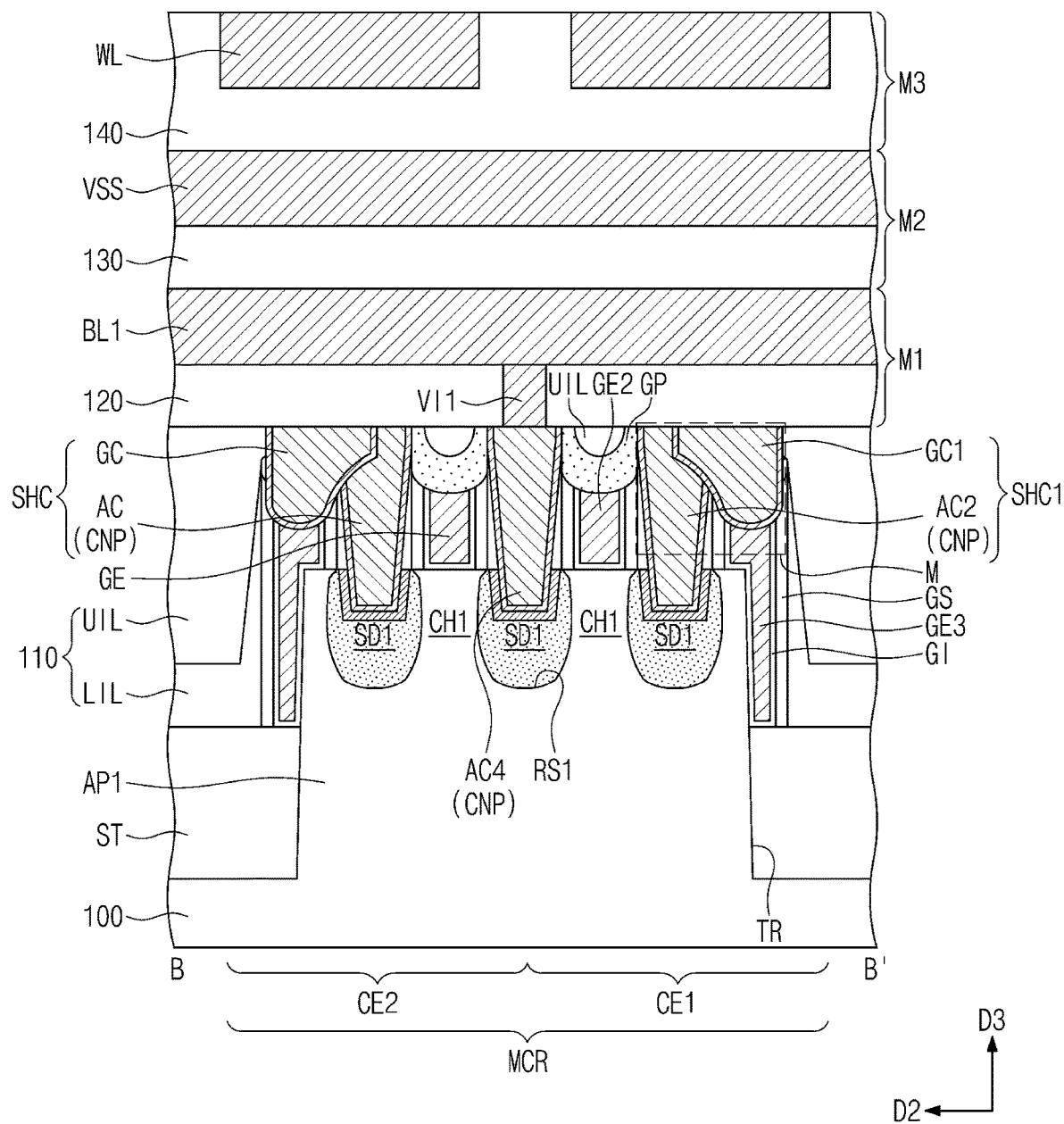
Figure 5C:
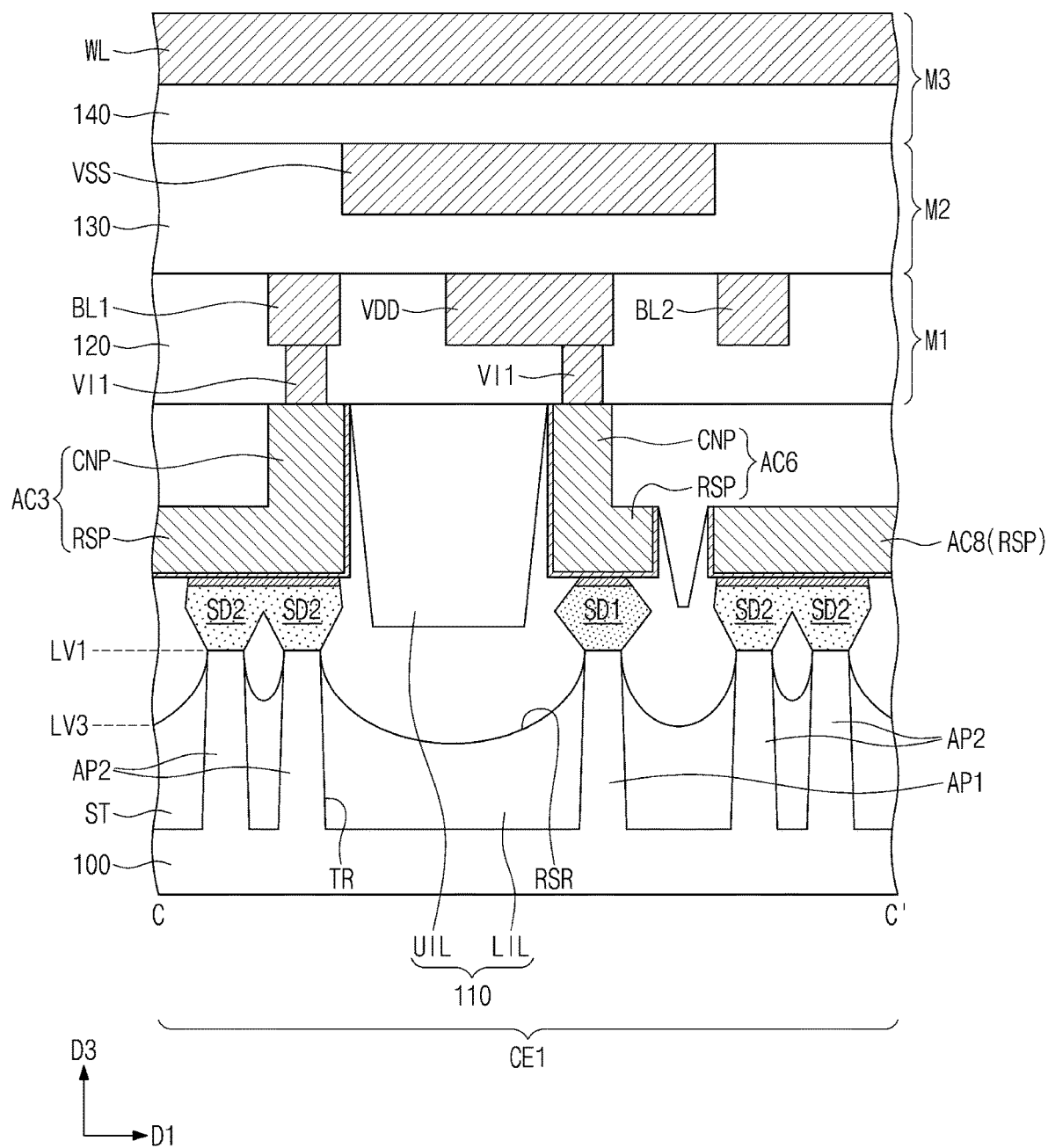
Figure 5D:
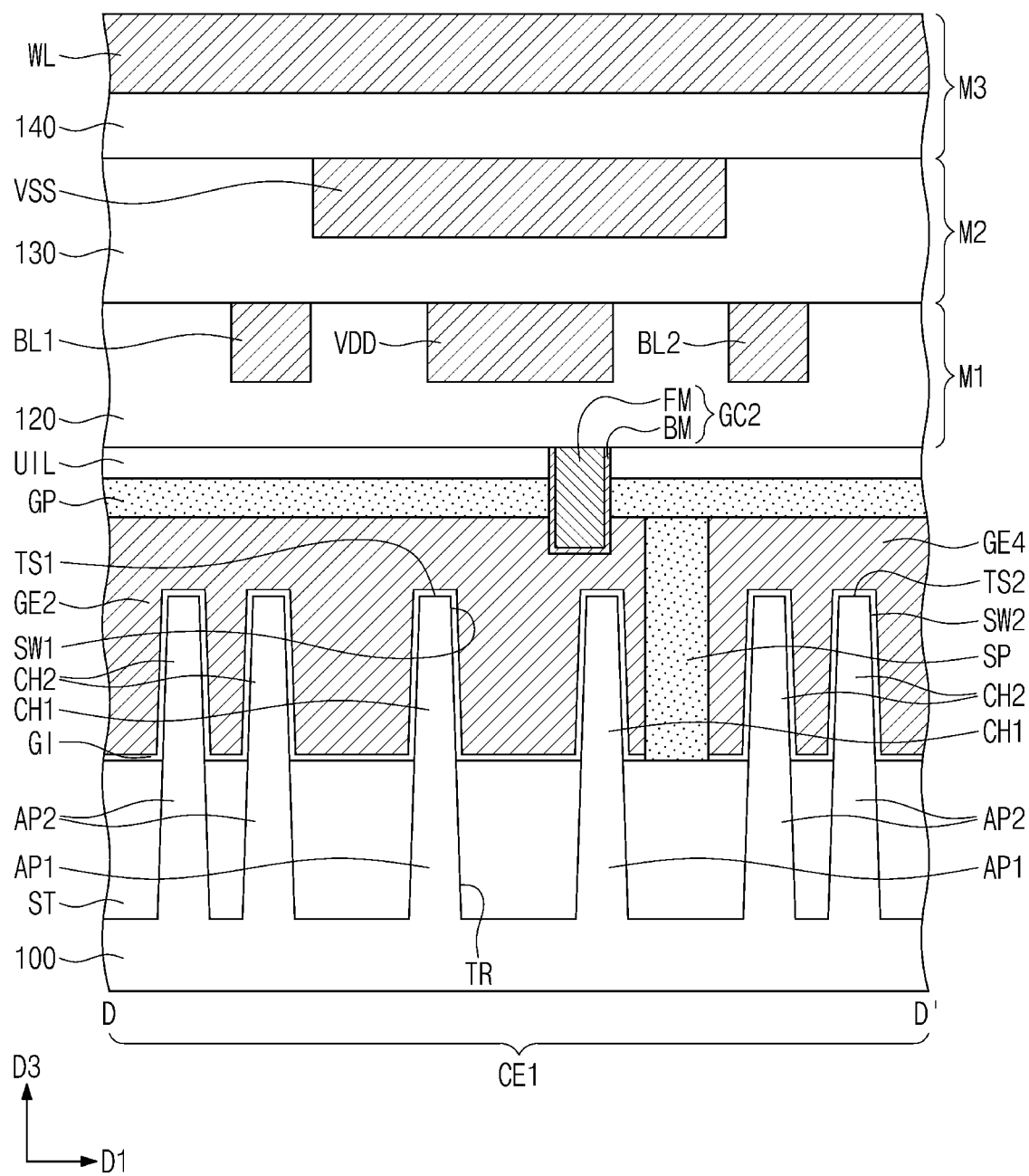
Figure 5E:
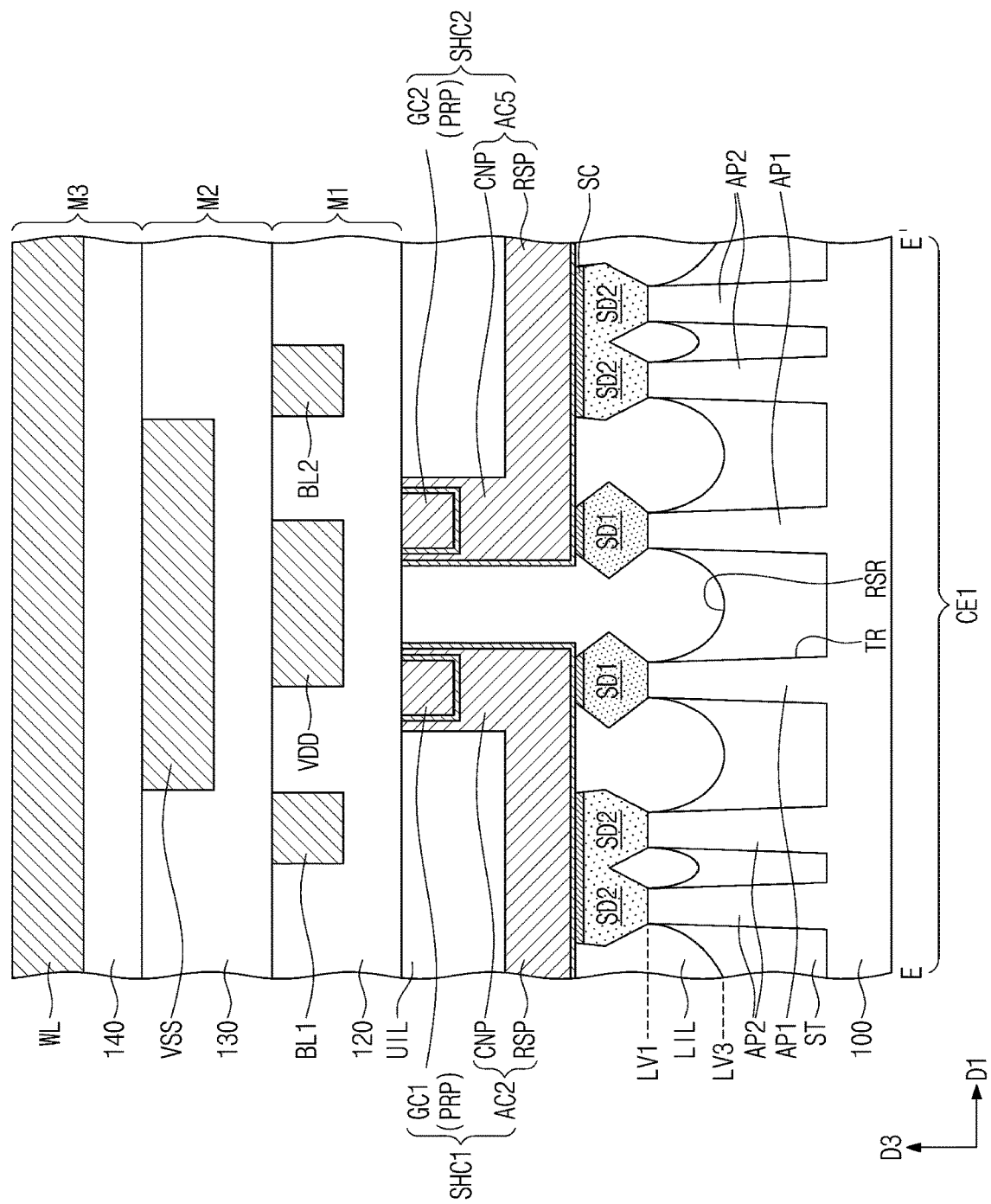
Figure 5F:
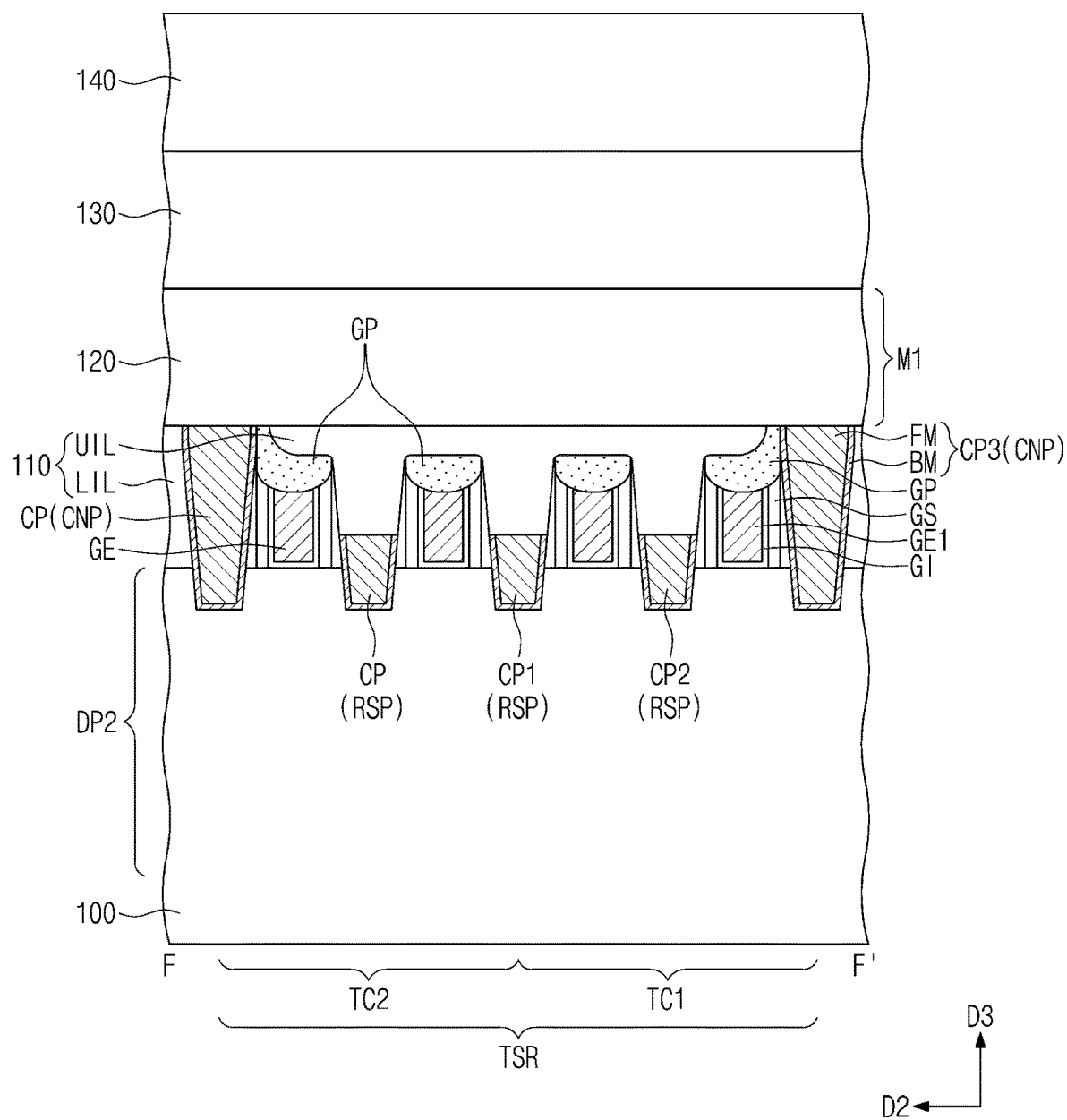
Figure 5G:
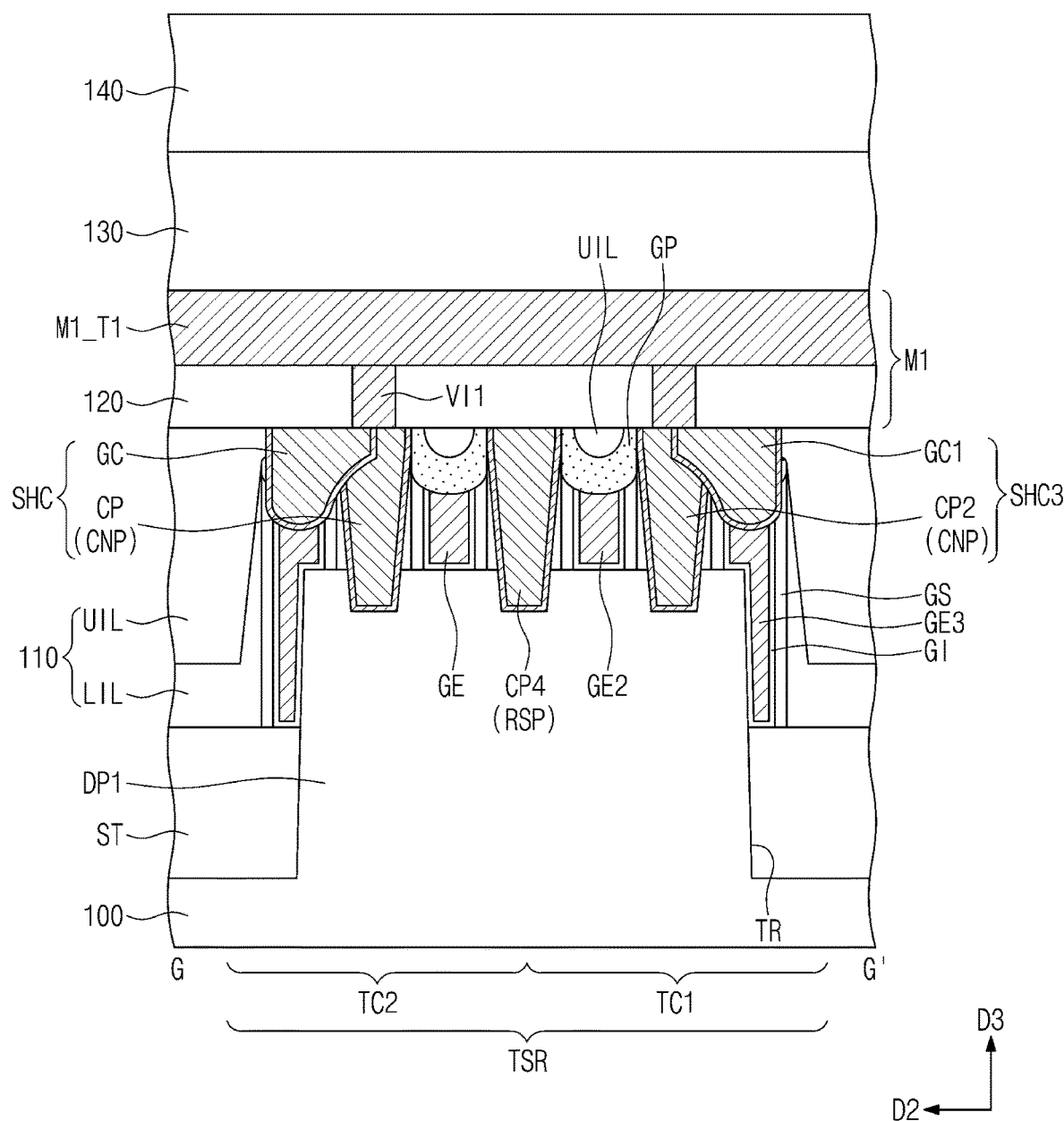
Figure 5H:
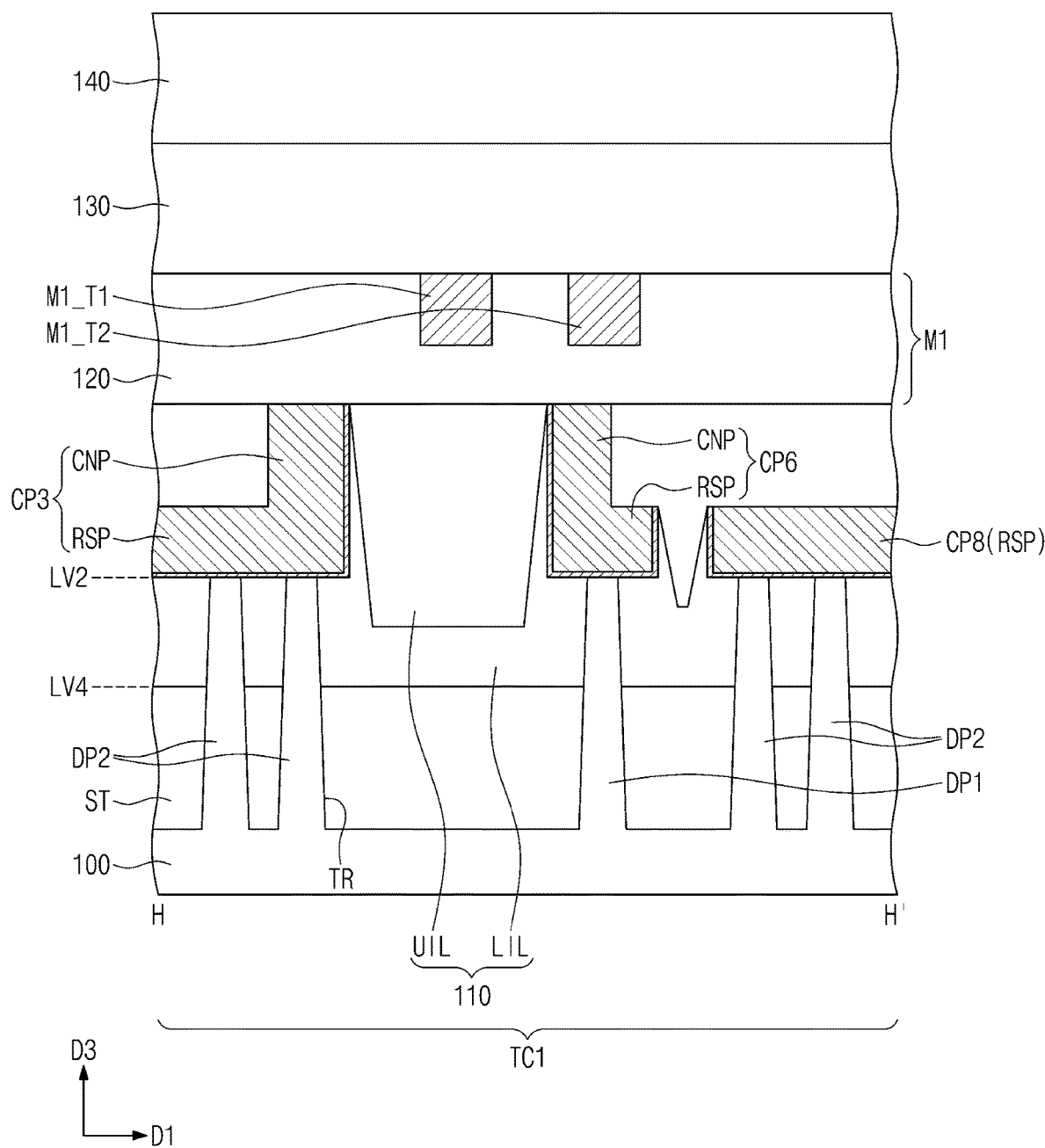

FIG. 4 illustrates a plan view showing a semiconductor memory device according to some embodiments of the present disclosure. FIGS. 5A, 5B, 5C, 5D, 5E, 5F, 5G, 5H, 5I, and 5J illustrate cross-sectional views respectively taken along lines A-A', B-B', C-C', D-D', E-E', F-F', G-G', H-H', I-I', and J-J' of FIG. 4. FIG. 6A illustrates an enlarged cross-sectional view showing section M of FIG. 5B. FIG. 6B illustrates a simplified perspective view showing a first common contact of FIG. 6A.

Referring to FIGS. 1, 3, 4, and 5A to 5J, a substrate 100 may be provided which includes a memory cell region MCR and a test region TSR. The memory cell region MCR may include a first bit cell CE1 and a second bit cell CE2. The test region TSR may include a first test cell TC1 and a second test cell TC2. Each of the first and second bit cells CE1 and CE2 on the substrate 100 may include the SRAM cell of FIG. 1. For example, the substrate 100 may include an area within the memory cell region MCR where an SRAM cell is disposed. Alternatively or additionally, the substrate 100 may include an area within the test region TSR where no SRAM cell is disposed. Alternatively or additionally, the test region TSR may include an area where a scribe line is formed.

The second bit cell CE2 may be disposed adjacent in the second direction D2 to the first bit cell CE1. The first and second bit cells CE1 and CE2 may be provided thereon with first and second active patterns AP1 and AP2, gate electrodes GE, active contacts AC, and gate contacts GC. The following description focuses on the first bit cell CE1 with reference to FIGS. 1, 3, 4, and 5A to 5E.

A device isolation layer ST may be provided on the substrate 100. The device isolation layer ST may define the first and second active patterns AP1 and AP2. The substrate 100 may be a compound semiconductor substrate or a semiconductor substrate including silicon, germanium, or silicon-germanium. The device isolation layer ST may include a dielectric material, such as a silicon oxide layer.

The first and second active patterns AP1 and AP2 may be portions of the substrate 100. A trench TR may be defined between the first and second active patterns AP1 and AP2 that are adjacent to each other. The device isolation layer ST may fill the trench TR. The first and second active patterns AP1 and AP2 may have their upper portions that vertically protrude beyond the device isolation layer ST. Each of the upper portions of the first and second active patterns AP1 and AP2 may have a fin shape that vertically protrudes upwards from the device isolation layer ST. For example, each of the first and second active patterns AP1 and AP2 may be a fin.

A top surface of the device isolation layer ST may include a recess region RSR that is recessed toward one of the trenches TR. The recess region RSR may be formed only on the memory cell region MCR where first and second source/drain patterns SD1 and SD2 are formed.

According to some embodiments, the first bit cell CE1 may include a pair of first active patterns AP1 and two pairs of second active patterns AP2. One of the two pairs of second active patterns AP2 may constitute a body of a first pass-gate transistor TA1 and a body of a first pull-down transistor TD1. The other of the two pairs of second active patterns AP2 may constitute a body of a second pass-gate transistor TA2 and a body of a second pull-down transistor TD2. One of the pair of first active patterns AP1 may constitute a body of a first pull-up transistor TU1. The other of the pair of first active patterns AP1 may constitute a body of a second pull-up transistor TU2. An interval between a pair of neighboring first active patterns AP1 may be greater than that between a pair of neighboring second active patterns AP2.

According to some embodiments of the present disclosure, two pairs of second active patterns AP2 may be replaced with two second active patterns AP2. For example, a pair of neighboring second active patterns AP2 may be merged to provide a single second active pattern AP2.

The first active patterns AP1 may have first channel patterns CH1 and first source/drain patterns SD1 on the upper portions of the first active patterns AP1. The second active patterns AP2 may have second channel patterns CH2 and second source/drain patterns SD2 on the upper portions of the second active patterns AP2. The first source/drain patterns SD1 may be p-type impurity regions. The second source/drain patterns SD2 may be n-type impurity regions. Each of the first channel patterns CH1 may be interposed between a pair of first source/drain patterns SD1, and each of the second channel patterns CH2 may be interposed between a pair of second source/drain patterns SD2.

The first and second source/drain patterns SD1 and SD2 may be epitaxial patterns formed by a selective epitaxial growth process. The first and second source/drain patterns SD1 and SD2 may have their top surfaces located at a higher level than that of top surfaces of the first and second channel patterns CH1 and CH2. The first and second source/drain patterns SD1 and SD2 may include a semiconductor element that is the same as or different from that of the substrate 100. For example, the first source/drain patterns SD1 may include a semiconductor element whose lattice constant is greater than that of a semiconductor element of the substrate 100. Therefore, the first source/drain patterns SD1 may provide the first channel patterns CH1 with compressive stresses. For example, the second source/drain patterns SD2 may include the same semiconductor element as that of the substrate 100.

The second source/drain patterns SD2 on a pair of neighboring second active patterns AP2 may be merged to constitute a single second source/drain pattern SD2. For example, the second source/drain patterns SD2 may be merged if or when a relatively small interval is provided between a pair of second active patterns AP2 (e.g., see FIG. 5C).

The gate electrodes GE may include first to fourth gate electrodes GE1 to GE4 on the first bit cell CE1. The first to fourth gate electrodes GE1 to GE4 may extend in the first direction D1, while running across the first and second active patterns AP1 and AP2. The first to fourth gate electrodes GE1 to GE4 may vertically overlap the first and second channel patterns CH1 and CH2. The first gate electrode GE1 may be symmetric with respect to the fourth gate electrode GE4, and the second gate electrode GE2 may be symmetric with respect to the third gate electrode GE3.

The second gate electrode GE2 and the fourth gate electrode GE4 may be linearly aligned in the first direction D1. A dielectric pattern SP may intervene between and separate from each other the second gate electrode GE2 and the fourth gate electrode GE4. The first gate electrode GE1 and the third gate electrode GE3 may be linearly aligned in the first direction D1. A dielectric pattern SP may intervene between and separate from each other the first gate electrode GE1 and the third gate electrode GE3.

A pair of gate spacers GS may be disposed on opposite sidewalls of the gate electrode GE. The pair of gate spacers GS may extend in the first direction D1 along the gate electrode GE. The pair of gate spacers GS may have their top surfaces higher than that of the gate electrode GE. The top surfaces of the pair of gate spacers GS may be covered with a gate capping pattern GP which is discussed below in reference to FIG. 5D.

The gate spacer GS may include at least one compound selected from SiO, SiCN, SiCON, and SiN, or a combination thereof. Alternatively or additionally, the gate spacer GS may include a multi-layer formed of at least two compounds selected from SiON, SiCN, SiCON, and SiN, or a combination thereof.

A gate dielectric layer GI may be interposed between the gate electrode GE and the first active pattern AP1 and between the gate electrode GE and the second active pattern AP2. The gate dielectric layer GI may extend along a bottom surface of the gate electrode GE.

In some embodiments of the present disclosure, the gate dielectric layer GI may include a high-k dielectric layer or a combination of a silicon oxide layer and a high-k dielectric layer. The high-k dielectric layer may include a high-k dielectric material whose dielectric constant is greater than that of a silicon oxide layer. For example, the high-k dielectric material may include at least one compound selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate, or a combination thereof.

Alternatively or additionally, a semiconductor memory device according to the present disclosure may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing (SS) of less than about 60 mV/decade at room temperature.

The ferroelectric material layer may have ferroelectric properties. The ferroelectric material layer may include, for example, at least one compound selected from hafnium oxide, hafnium zirconium oxide, barium strontium titanium oxide, and lead zirconium titanium oxide, or a combination thereof. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one element selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn), or a combination thereof. The type of impurities included in the ferroelectric material layer may be changed depending on the ferroelectric material that is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y), or a combination thereof.

When the impurities include aluminum (Al), the ferroelectric material layer may include about 3 to 8 atomic percent aluminum. In this description, the ratio of impurities may be a ratio of aluminum to the sum of hafnium and aluminum.

When the impurities include silicon (Si), the ferroelectric material layer may include about 2 to about 10 atomic percent silicon. When the impurities include yttrium (Y), the ferroelectric material layer may include about 2 to about 10 atomic percent yttrium. When the impurities include gadolinium (Gd), the ferroelectric material layer may include about 1 to about 7 atomic percent gadolinium. When the impurities include zirconium (Zr), the ferroelectric material layer may include about 50 to about 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one compound selected from hafnium oxide, zirconium oxide, and aluminum oxide, but the present disclosure is not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but disclosure is not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and may be adjacent to the first and second channel patterns CH1 and CH2. The first metal pattern may include a work-function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo), or a combination thereof. The first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta), or a combination thereof.

Referring back to FIG. 5D, the second gate electrode GE2 may be provided on a first top surface TS1 of the first channel pattern CH1 and on at least one first sidewall SW1 of the first channel pattern CH1. The fourth gate electrode GE4 may be provided on a second top surface TS2 of the second channel pattern CH2 and on at least one second sidewall SW2 of the second channel pattern CH2. In this sense, a transistor according to some embodiments may be a three-dimensional field effect transistor (e.g., FinFET) in which a gate electrode three-dimensionally surrounds a channel.

Gate capping patterns GP may be provided on corresponding gate electrodes GE. The gate capping pattern GP may extend in the first direction D1 along the gate electrode GE. The gate capping pattern GP may include a material having an etch selectivity with respect to first, second, third, and fourth interlayer dielectric layers 110, 120, 130, and 140, which are discussed below in reference to FIGS. 4 and 5B. For example, the gate capping pattern GP may include at least one compound selected from SiON, SiCN, SiCON, and SiN, or a combination thereof.

A first interlayer dielectric layer 110 may be provided on the substrate 100. The first interlayer dielectric layer 110 may cover the gate spacers GS and the first and second source/drain patterns SD1 and SD2.

The first interlayer dielectric layer 110 may include a lower dielectric layer LIL and an upper dielectric layer UIL. The upper dielectric layer UIL may cover the gate capping patterns GP and a recess part RSP of an active contact AC which is discussed below in reference to FIGS. 4 and 11A to 11H. The upper dielectric layer UIL may include a dielectric material the same as or different from that of the lower dielectric layer LIL. For example, the lower dielectric layer LIL may include SiO, and the upper dielectric layer UIL may include SiO, SiOC, or SiC, or a combination thereof.

Active contacts AC may penetrate the first interlayer dielectric layer 110 to be coupled to the first and second source/drain patterns SD1 and SD2. The active contacts AC may have their top surfaces coplanar with that of the first interlayer dielectric layer 110. The active contacts AC may include first to eighth active contacts AC1 to AC8 on the first bit cell CE1. A reduction in size of semiconductor memory devices may induce short failures between the active contact AC and its adjacent gate electrode GE. The short failures may be determined based on a distance between the active contact AC and its adjacent gate electrode GE.

The active contact AC may be a self-aligned contact. For example, the gate capping pattern GP and the gate spacer GS may be used to form the active contact AC in a self-alignment manner. For example, the active contact AC may cover at least a portion of a sidewall of the gate capping pattern GP.

The active contact AC may include a connection part CNP and a recess part RSP. The connection part CNP of the active contact AC may have a top surface higher than that of the recess part RSP. The top surface of the connection part CNP included in the active contact AC may be coplanar with the top surface of the first interlayer dielectric layer 110. The upper dielectric layer UIL may be provided on the top surface of the recess part RSP included in the active contact AC.

A first via VI1 may be disposed on the connection part CNP. For example, the connection part CNP may extend in a vertical direction or a third direction D3 to contact the first via VI1. The active contact AC may be electrically connected to a first wiring layer M1 through the connection part CNP and the first via VI1.

The connection part CNP of the second active contact AC2 among the active contacts AC may be in contact with a first gate contact GC1 which is discussed below in reference to FIG. 5B. The second active contact AC2 may be electrically connected through the connection part CNP to the first gate contact GC1. The connection part CNP of the fifth active contact AC5 among the active contacts AC may be in contact with a second gate contact GC2 which is discussed below in reference to FIG. 5B. The fifth active contact AC5 may be electrically connected through the connection part CNP to the second gate contact GC2.

A silicide pattern SC may be interposed between the active contact AC and its connected one of the first and second source/drain patterns SD1 and SD2. The active contact AC may be electrically connected through the silicide pattern SC to one of the first and second source/drain patterns SD1 and SD2. The silicide pattern SC may include metal silicide, for example, at least one compound selected from titanium silicide, tantalum silicide, tungsten silicide, nickel silicide, and cobalt silicide, or a combination thereof.

A gate contact GC may be provided on the gate electrode GE electrically connected thereto. The gate contact GC may penetrate the first interlayer dielectric layer 110, the gate spacers GS, and the gate capping pattern GP, and may thus be coupled to the gate electrode GE.

The gate contact GC and the connection part CNP of the active contact AC may have their top surfaces coplanar with that of the first interlayer dielectric layer 110. The gate contact GC may have a bottom surface higher than that of the active contact AC. The bottom surface of the gate contact GC may be located higher than the top surface of the recess part RSP included in the active contact AC and lower than the top surface of the connection part CNP included in the active contact AC.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal nitride layer or a combination of metal and metal nitride layers. The metal layer may include at least one selected from titanium, tantalum, tungsten, nickel, cobalt, and platinum. The metal nitride layer may include at least one material selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer, or a combination thereof.

The gate contacts GC may include first and second gate contacts GC1 and GC2 on the first bit cell CE1. The first gate contact GC1 may be coupled to the third gate electrode GE3, and the second gate contact GC2 may be coupled to the second gate electrode GE2.

Referring back to FIGS. 4 and 5B, on the first bit cell CE1, a first common contact SHC1 may be constituted by the first gate contact GC1 and the second active contact AC2 in contact with the first gate contact GC1. The third gate electrode GE3 may be electrically connected to its adjacent first source/drain pattern SD1 through the first common contact SHC1. A second common contact SHC2 may be constituted by the second gate contact GC2 and the fifth active contact AC5 in contact with the second gate contact GC2.

A second interlayer dielectric layer 120, a third interlayer dielectric layer 130, and a fourth interlayer dielectric layer 140 may be sequentially provided on the first interlayer dielectric layer 110. The second, third, and fourth interlayer dielectric layers 120, 130, and 140 may include, for example, a silicon oxide layer.

A first wiring layer M1 may be provided in the second interlayer dielectric layer 120. As discussed above with reference to FIG. 2, the first wiring layer M1 may include the first bit line BL1, the second bit line BL2, the power line VDD, the first lower landing pads LLP1, the second lower landing pads LLP2, and the first vias VI1.

A second wiring layer M2 may be provided in the third interlayer dielectric layer 130. As discussed above with reference to FIG. 2, the second wiring layer M2 may include the ground line VSS, the upper landing pads ULP, and the plurality of second vias VI2.

A third wiring layer M3 may be provided in the fourth interlayer dielectric layer 140. As discussed above with reference to FIG. 2, the third wiring layer M3 may include the word lines WL and the plurality of third vias VI3. The second wiring layer M2 and the third wiring layer M3 may be provided only on the memory cell region MCR, and may not be provided on the test region TSR. The second wiring layer M2 is horizontally offset from the test region TSR. The second wiring layer M2 is not connected with the first test line M1_T1 and the second test line M1_T2 which is described below in reference to FIGS. 4 and 5G. The third wiring layer M3 is horizontally offset from the test region TSR. The third wiring layer M3 is not connected with the first test line M1_T1 and the second test line M1_T2 which are described below in reference to FIGS. 4 and 5G.

On the first bit cell CE1, memory transistors may be constituted by the first and second active patterns AP1 and AP2 and the first to fourth gate electrodes GE1 to GE4. The memory cell transistors on the first bit cell CE1 may include the first pull-up transistor TU1, the first pull-down transistor TD1, the second pull-up transistor TU2, the second pull-down transistor TD2, the first pass-gate transistor TA1, and the second pass-gate transistor TA2 that are discussed above with reference to FIG. 1.

The first gate electrode GE1 may be a gate of the first pass-gate transistor TA1. The first gate electrode GE1 may be electrically connected to the word line WL. The second gate electrode GE2 may be a common gate of the first pull-up and pull-down transistors TU1 and TD1. The third gate electrode GE3 may be a common gate of the second pull-up and pull-down transistors TU2 and TD2. The fourth gate electrode GE4 may be a gate of the second pass-gate transistor TA2. The fourth gate electrode GE4 may be electrically connected to the word line WL.

The first active contact AC1 may be electrically connected to the second source/drain of the first pull-down transistor TD1. The first active contact AC1 may be electrically connected to the ground line VSS.

The second active contact AC2 may be electrically connected to the common source/drain (or the first source/drain) of the first pull-down and pass-gate transistors TD1 and TA1. The second active contact AC2 may extend in the first direction D1 to electrically connect with the first source/drain of the first pull-up transistor TU1.

The first gate contact GC1 and the second active contact AC2 may constitute the first common contact SHC1. The second active contact AC2 and the third gate electrode GE3 may be electrically connected to each other through the first common contact SHC1. For example, the common source/drain of the first pull-up and pull-down transistors TU1 and TD1 may be electrically connected through the first common contact SHC1 to the common gate of the second pull-up and pull-down transistors TU2 and TD2. The first common contact SHC1 may correspond to the first node N1 of FIG. 1.

The third active contact AC3 may be electrically connected to the second source/drain of the first pass-gate transistor TA1. The third active contact AC3 may be electrically connected through the first via VI1 to the first bit line BL1 (e.g., see FIG. 5A).

The fourth active contact AC4 may be electrically connected to the second source/drain of the first pull-up transistor TU1. The fourth active contact AC4 may be electrically connected through the first via VI1 to the power line VDD (e.g., see FIG. 5B).

The fifth active contact AC5 may be electrically connected to the first source/drain of the second pull-up transistor TU2. The fifth active contact AC5 may extend in the first direction D1 to electrically connect with the common source/drain (or the first source/drain) of the second pull-down and pass-gate transistors TD2 and TA2.

The second gate contact GC2 and the fifth active contact AC5 may constitute the second common contact SHC2. The fifth active contact AC5 and the second gate electrode GE2 may be electrically connected to each other through the second common contact SHC2. For example, the common source/drain of the second pull-up and pull-down transistors TU2 and TU2 may be electrically connected through the second common contact SHC2 to the common gate of the first pull-up and pull-down transistors TU1 and TD1. The second common contact SHC2 may correspond to the second node N2 of FIG. 1.

The sixth active contact AC6 may be electrically connected to the second source/drain of the second pull-up transistor TU2. The sixth active contact AC6 may be electrically connected through the first via VI1 to the power line VDD (e.g., see FIG. 5C).

The seventh active contact AC7 may be electrically connected to the second source/drain of the second pass-gate transistor TA2. The seventh active contact AC7 may be electrically connected through the first via VI1 to the second bit line BL2.

The eighth active contact AC8 may be electrically connected to the second source/drain of the second pull-down transistor TD2. The eighth active contact AC8 may be electrically connected to the ground line VSS.

The first test cell TC1 and the second test cell TC2 may be provided on the test region TSR. The second test cell TC2 may be disposed adjacent in the second direction D2 to the first test cell TC1. The first and second test cells TC1 and TC2 may be provided in an array configuration. The first and second test cells TC1 and TC2 may be provided thereon with first and second dummy patterns DP1 and DP2, gate electrodes GE, contact patterns CP, and gate contacts GC. The following description focuses on the first test cell TC1 with reference to FIGS. 4 and 5F to 5J.

The device isolation layer ST may define the first and second dummy patterns DP1 and DP2. The first and second dummy patterns DP1 and DP2 may be portions of the substrate 100. A trench TR may be defined between the first and second dummy patterns DP1 and DP2 that are adjacent to each other. The device isolation layer ST may fill the trench TR. The first and second dummy patterns DP1 and DP2 may have their upper portions that vertically protrude beyond the device isolation layer ST. Each of the upper portions of the first and second dummy patterns DP1 and DP2 may be shaped like a fin that vertically protrudes upwards from the device isolation layer ST.

On the test region TSR, the device isolation layer ST may have a flat profile at a top surface thereof. For example, differently from the memory region MCR, the recess region RSR may not be formed on the top surface of the device isolation layer ST on the test region TSR.

According to some embodiments, the first test cell TC1 may include a pair of first dummy patterns DP1 and two pairs of second dummy patterns DP2. An interval between a pair of neighboring first dummy patterns DP1 may be greater than that between a pair of neighboring second dummy patterns DP2.

Unlike the memory cell region MCR, the first and second dummy patterns DP1 and DP2 may not be provided on the first and second dummy patterns DP1 and DP2. Because the first and second source/drain patterns SD1 and SD2 are not formed on the test region TSR, it may be possible to prevent electrical shorts between the first and second source/drain patterns SD1 and SD2 and the gate electrode GE adjacent thereto. Accordingly, the occurrence of an error may be prevented when a short failure is detected as discussed below.

The gate electrodes GE may include first to fourth gate electrodes GE1 to GE4 on the first test cell TC1. The first to fourth gate electrodes GE1 to GE4 may extend in the first direction D1, while running across the first and second dummy patterns DP1 and DP2. The first gate electrode GE1 may be symmetric with respect to the fourth gate electrode GE4, and the second gate electrode GE2 may be symmetric with respect to the third gate electrode GE3.

The second gate electrode GE2 and the fourth gate electrode GE4 may be linearly aligned in the first direction D1. A dielectric pattern SP may intervene between and separate from each other the second gate electrode GE2 and the fourth gate electrode GE4. The first gate electrode GE1 and the third gate electrode GE3 may be linearly aligned in the first direction D1. A dielectric pattern SP may intervene between and separate from each other the first gate electrode GE1 and the third gate electrode GE3. For example, the first to fourth gate electrodes GE1 to GE4 on the first test cell TC1 may have their configurations respectively substantially the same as those of the first to fourth gate electrodes GE1 to GE4 o the first bit cell CE1.

Figure 5I:
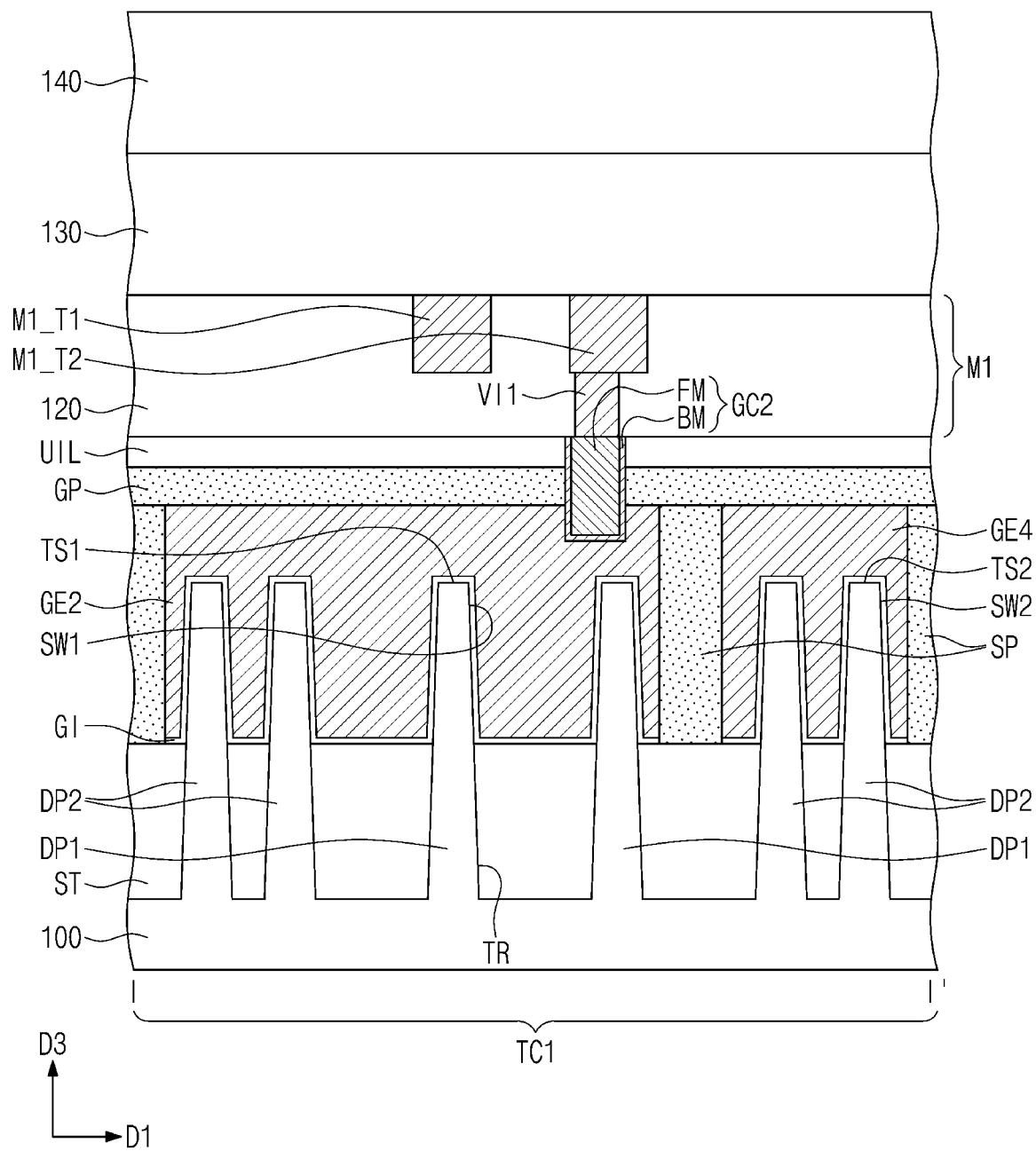
Figure 5J:
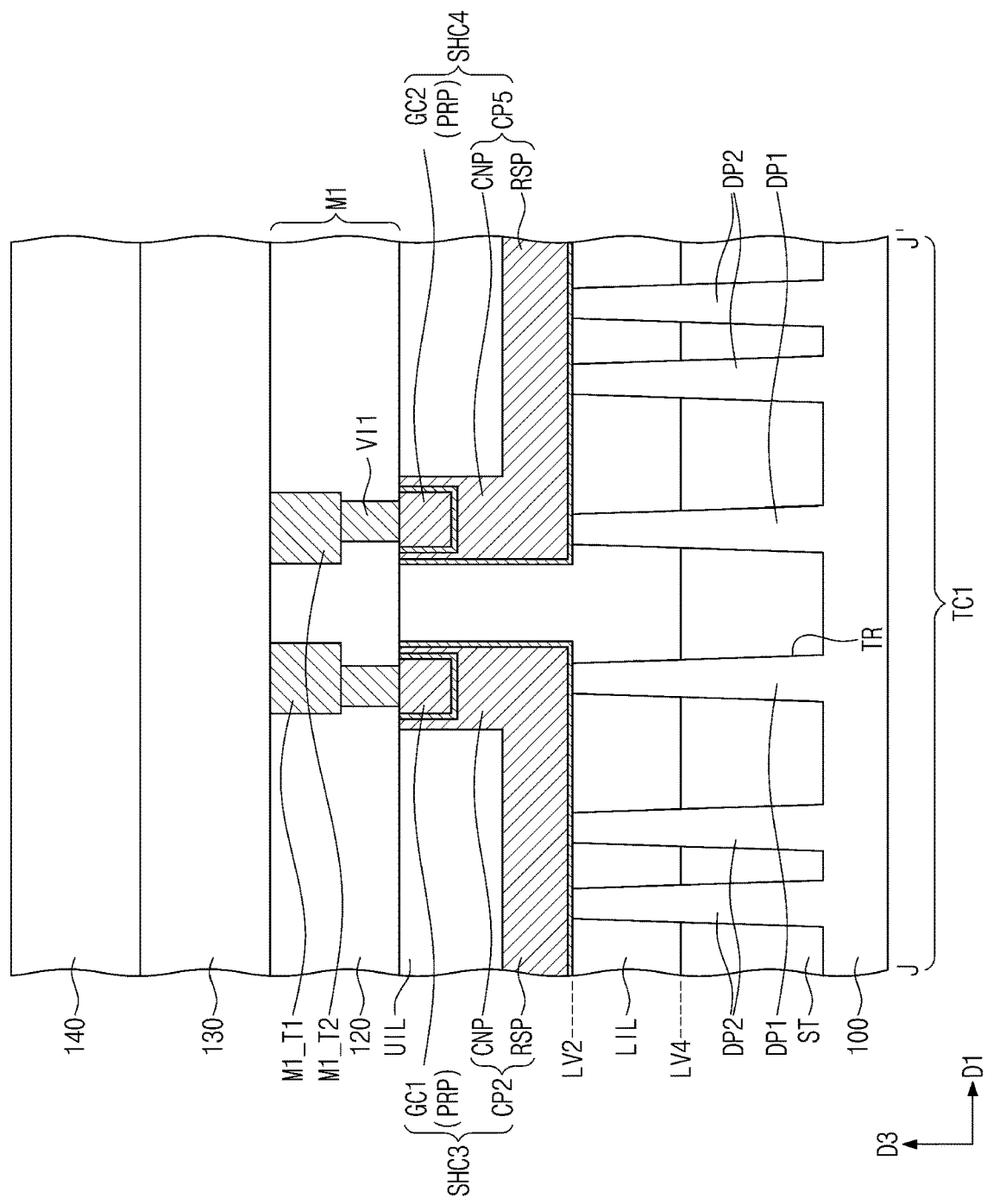
Figure 6A:
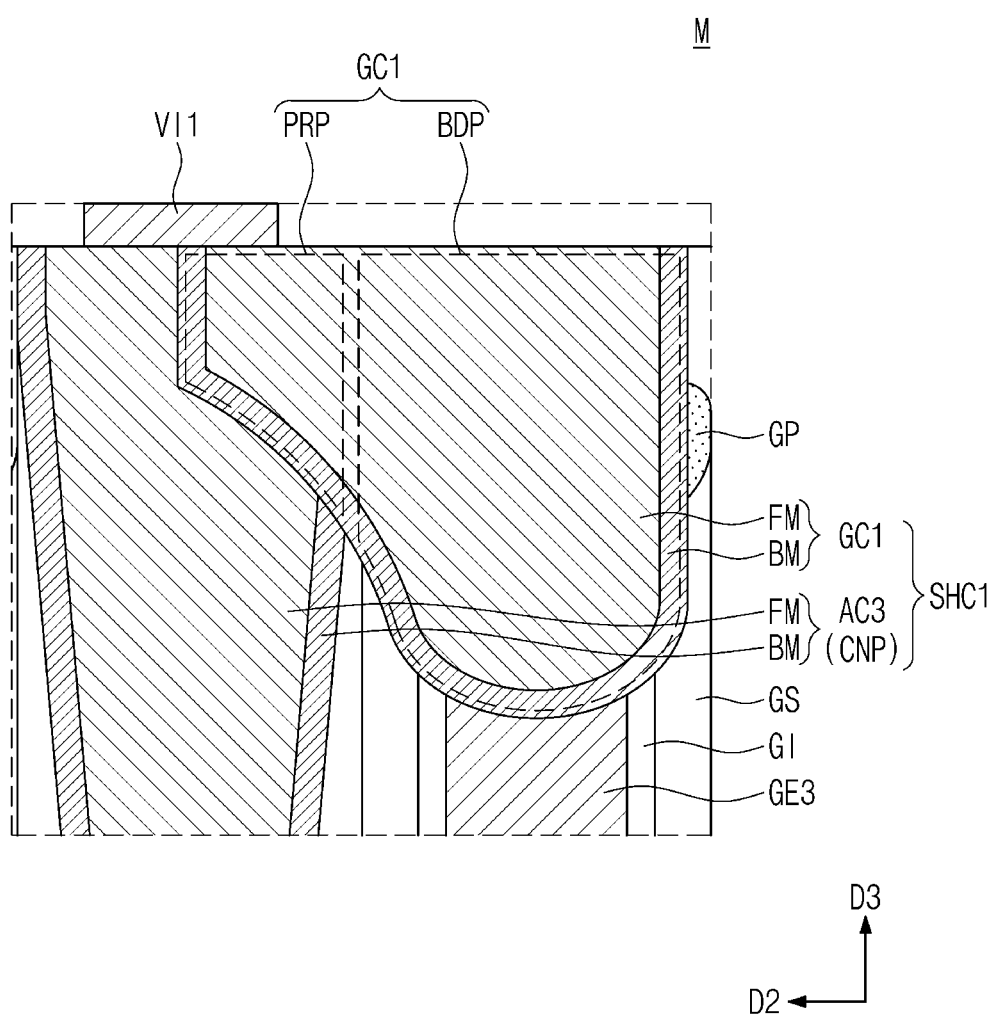
FIG. 6A illustrates an enlarged cross-sectional view showing section M of FIG. 5B.
Figure 6B:
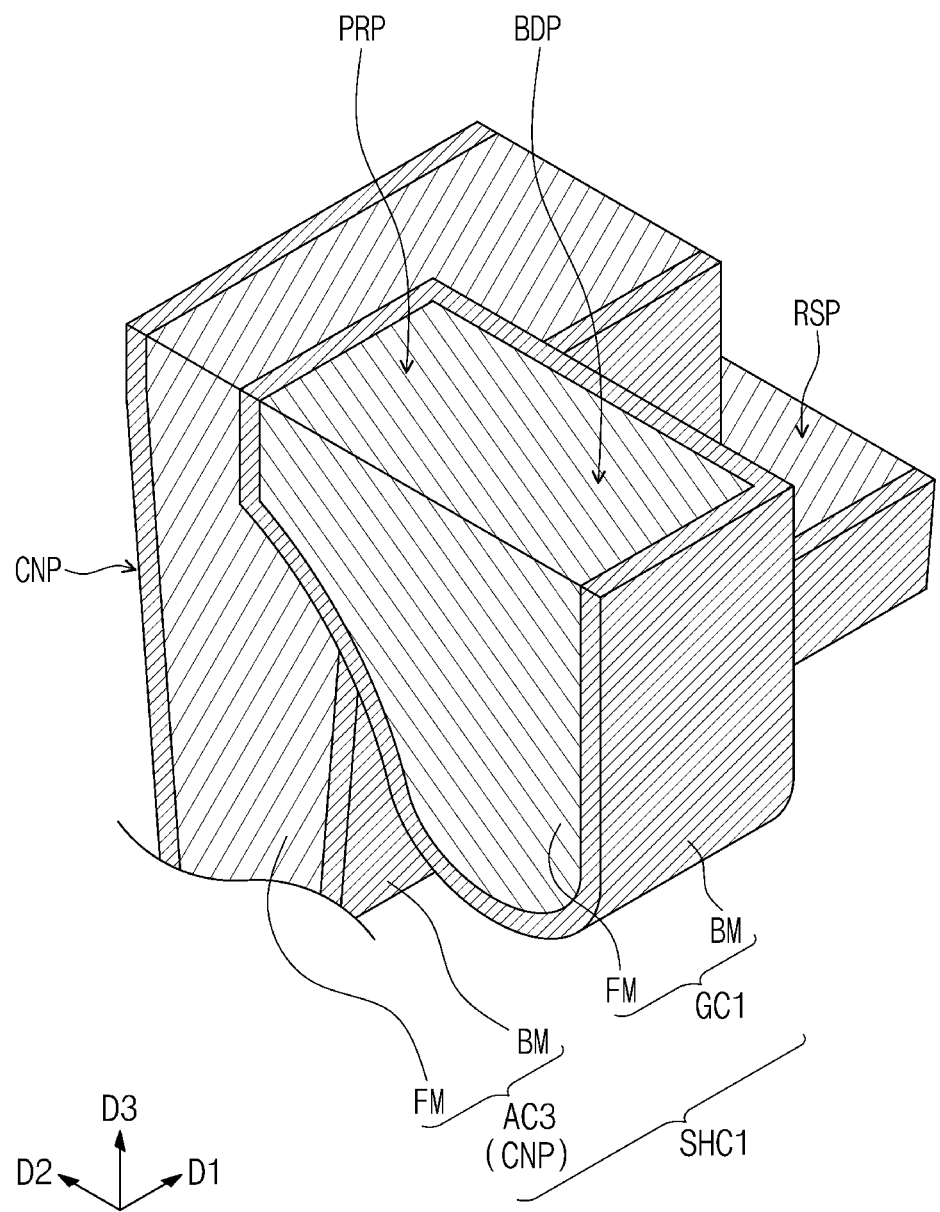
FIG. 6B illustrates a simplified perspective view showing a first common contact of FIG. 6A.
Figure 7A:
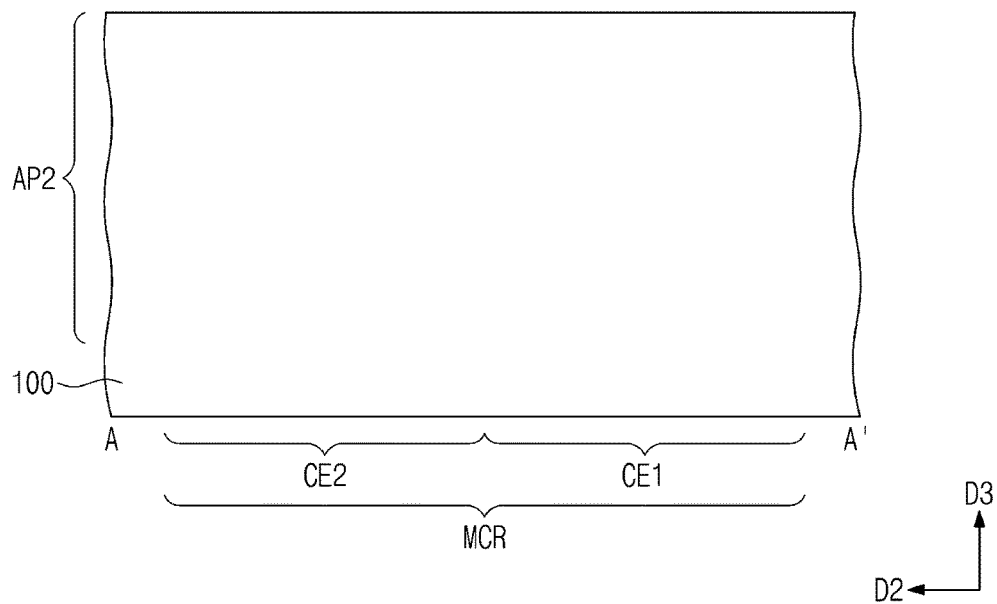
FIGS. 7A to 11H illustrate cross-sectional views showing a method of fabricating a semiconductor memory device according to some embodiments of the present disclosure.
Figure 7B:
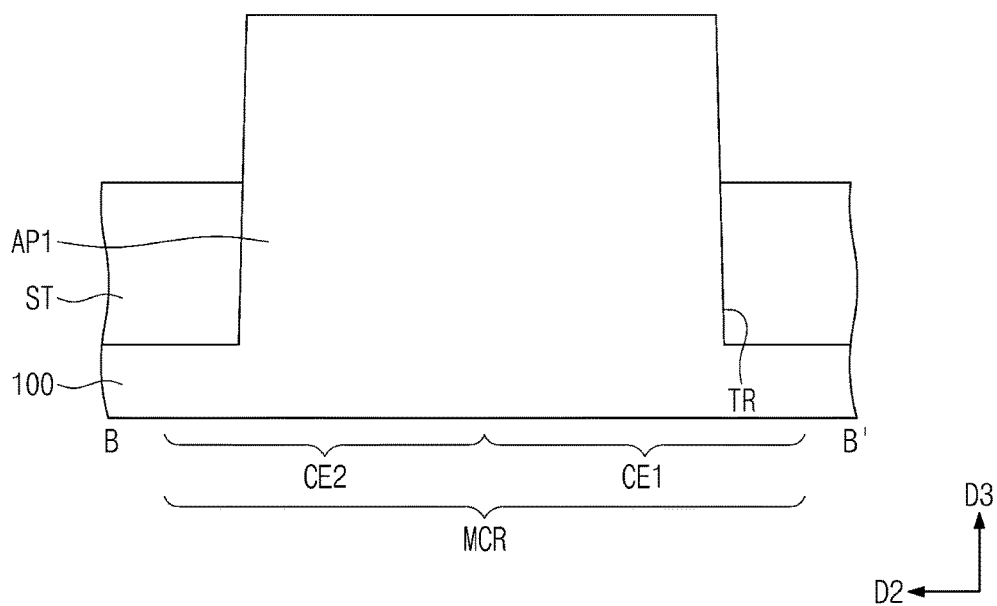
Figure 7C:
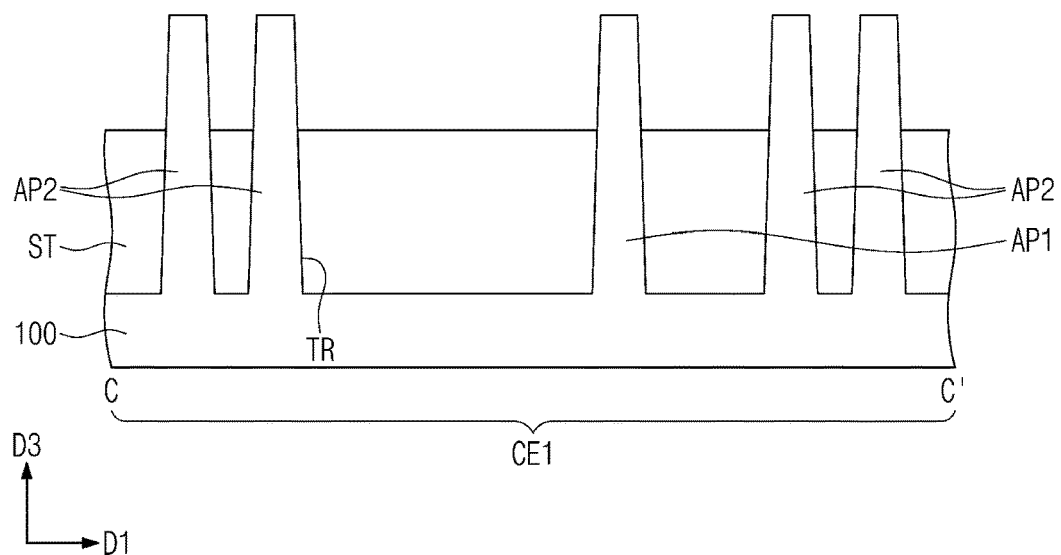
Figure 7D:
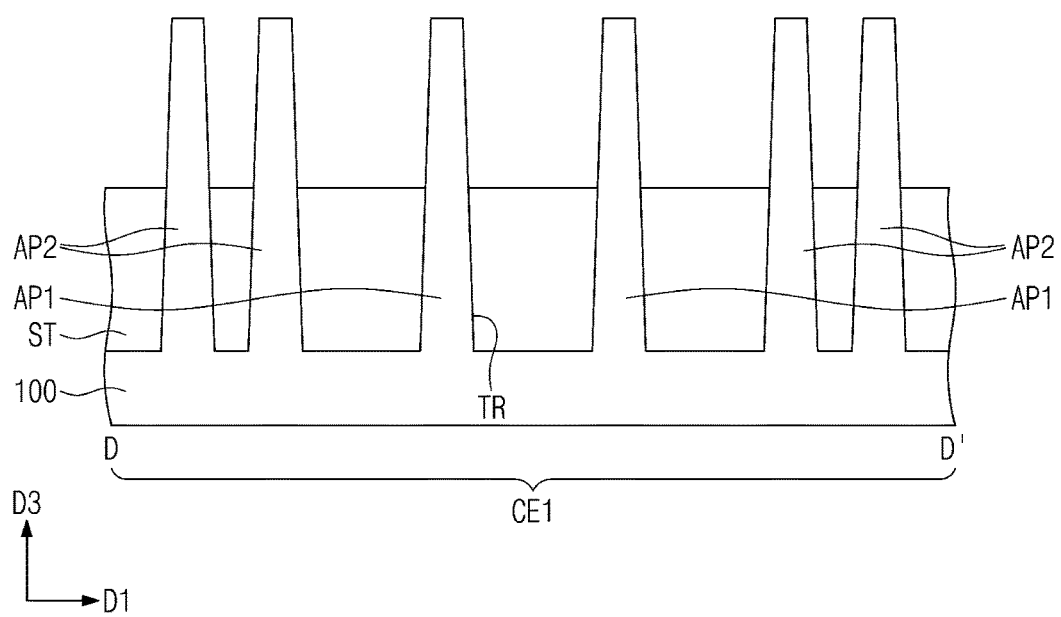
Figure 7E:
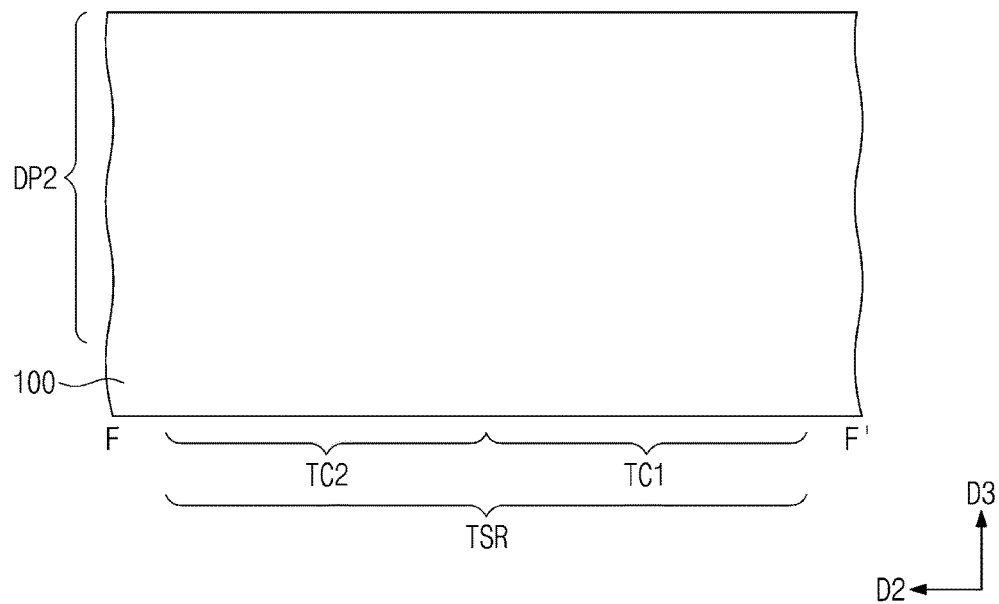
Figure 7F:
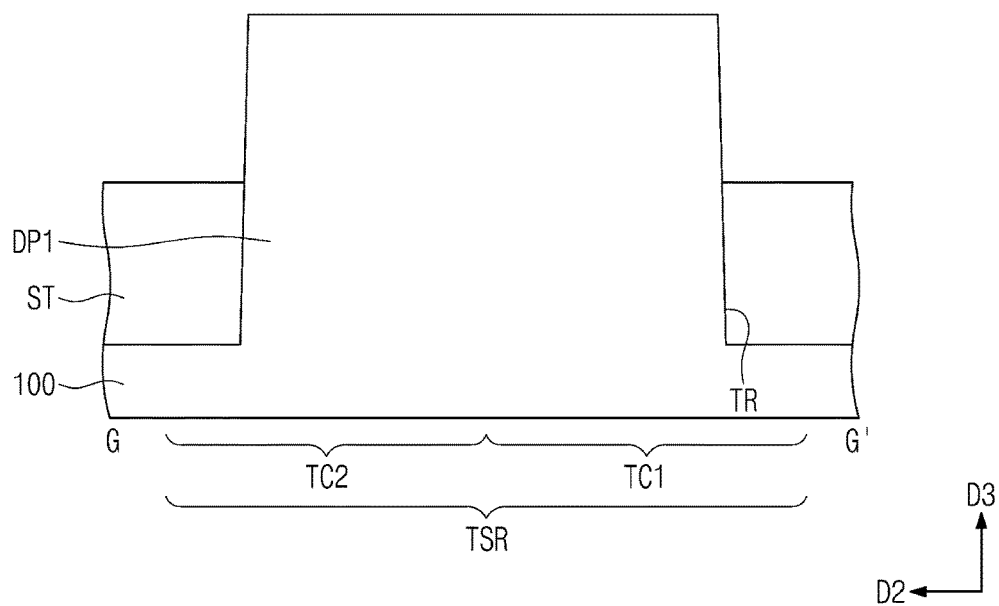
Figure 7G:
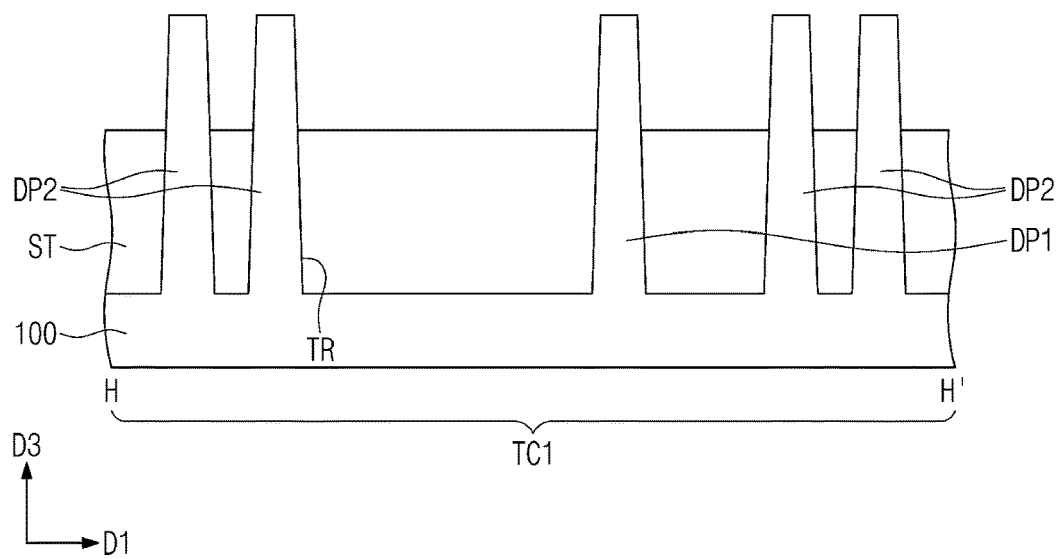
Figure 7H:
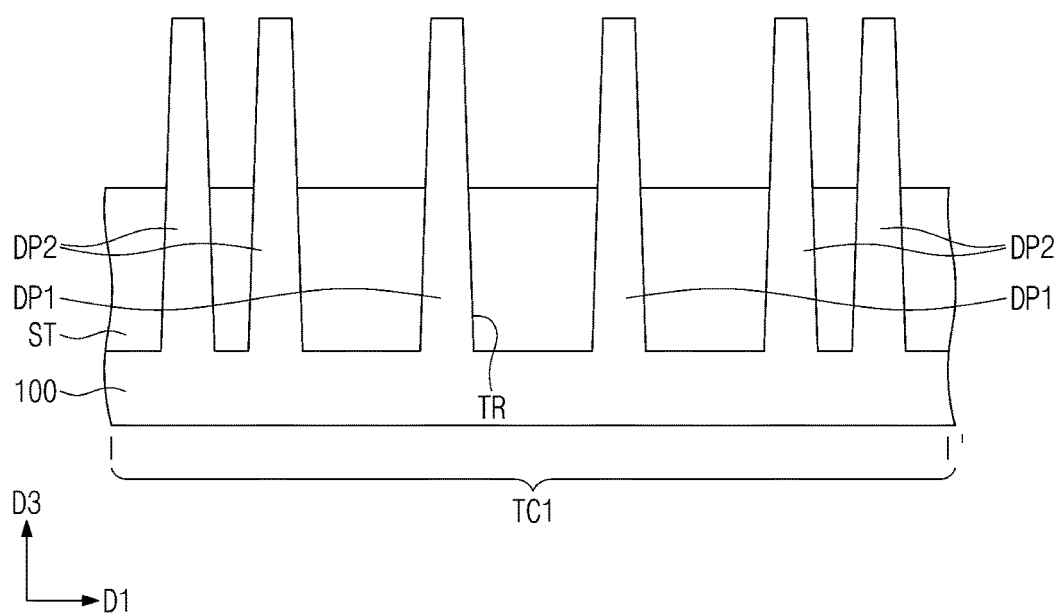
Figure 8A:
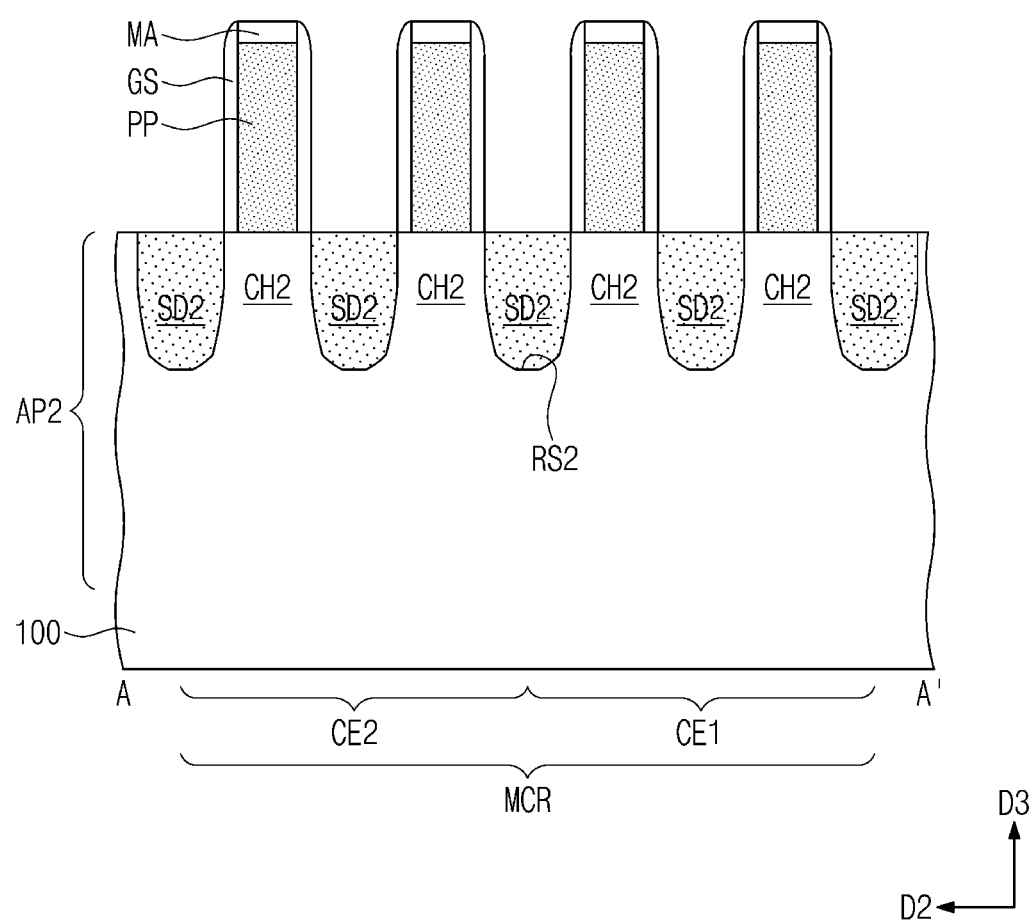
Figure 8B:
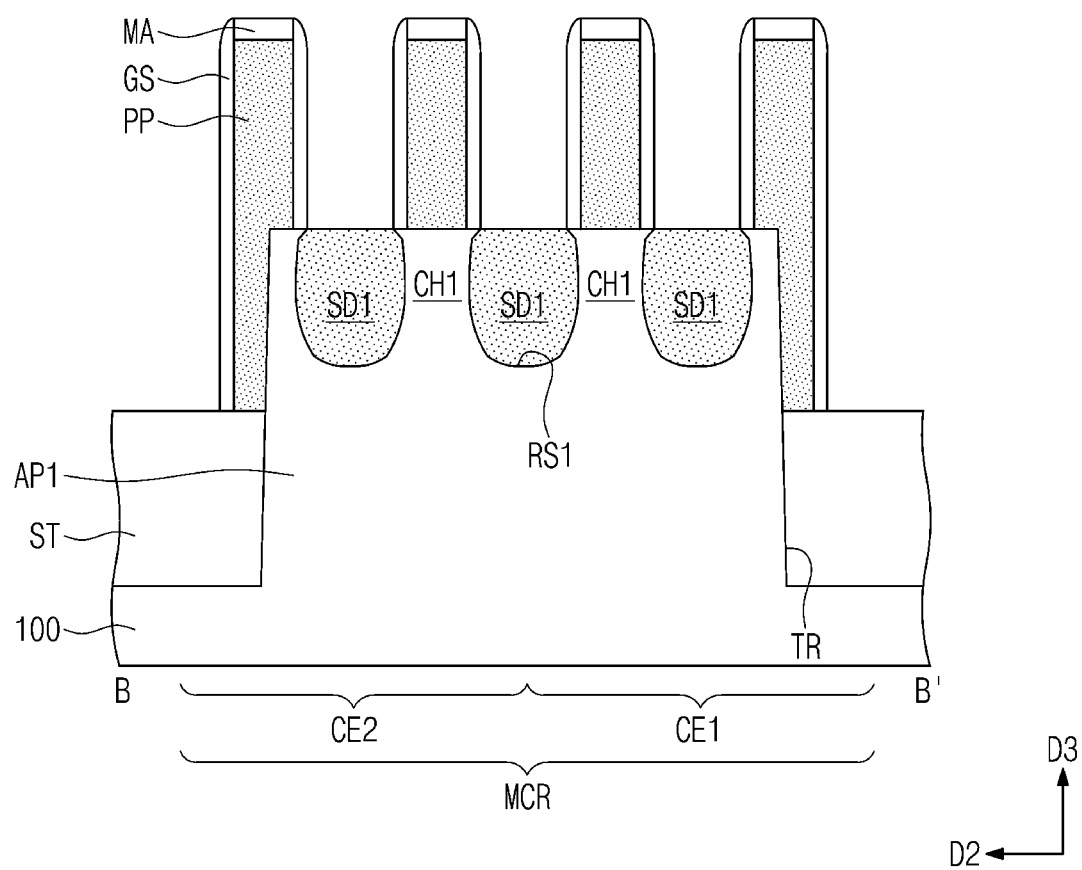
Figure 8C:
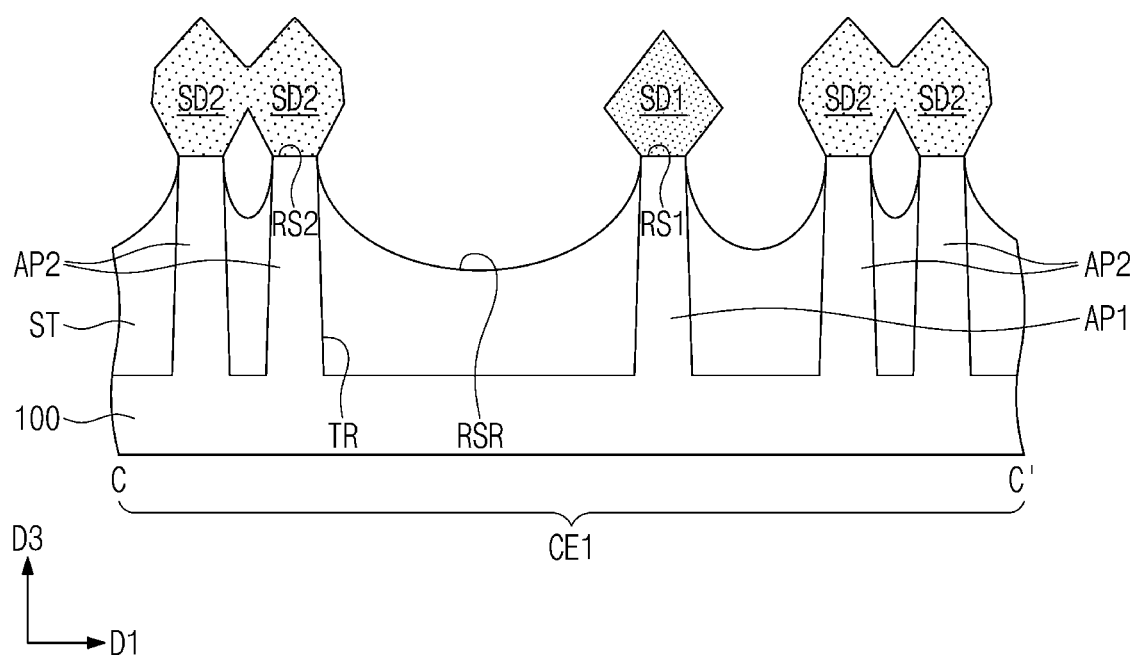
Figure 8D:
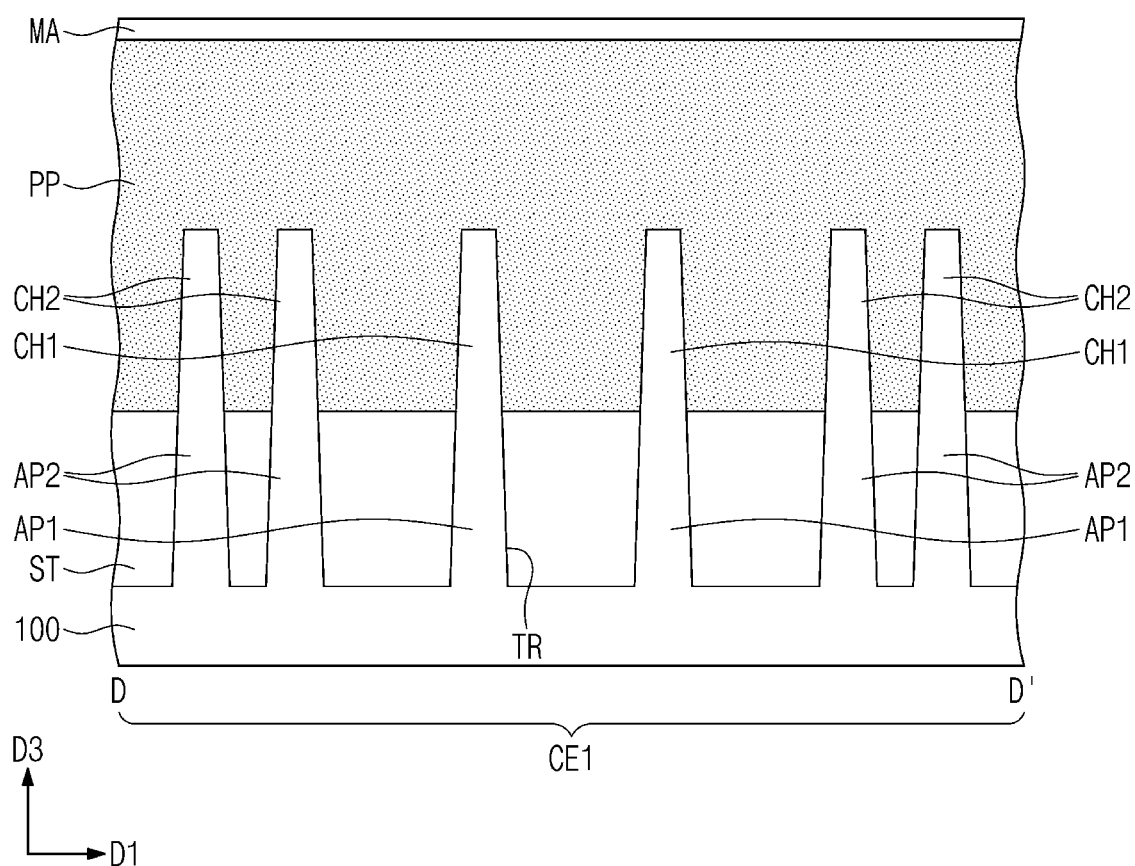
Figure 8E:
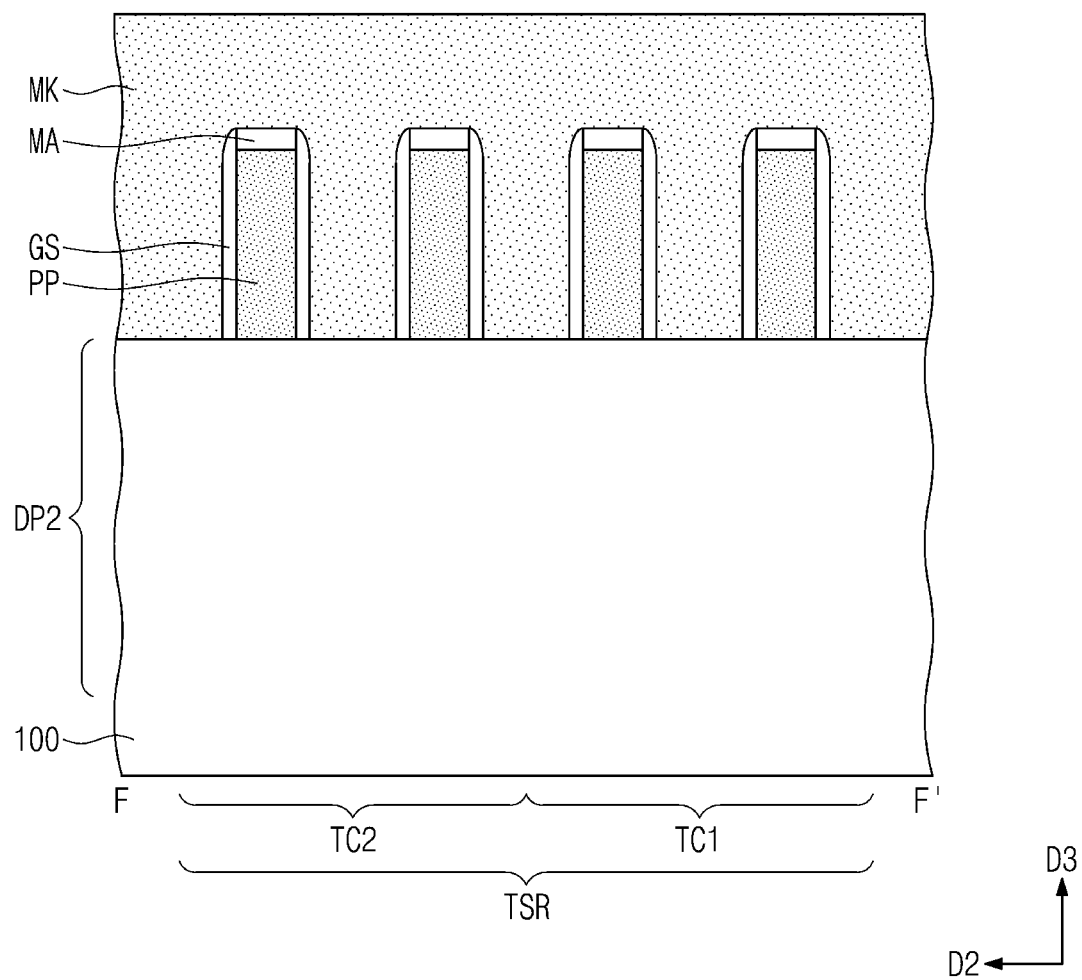
Figure 8F:
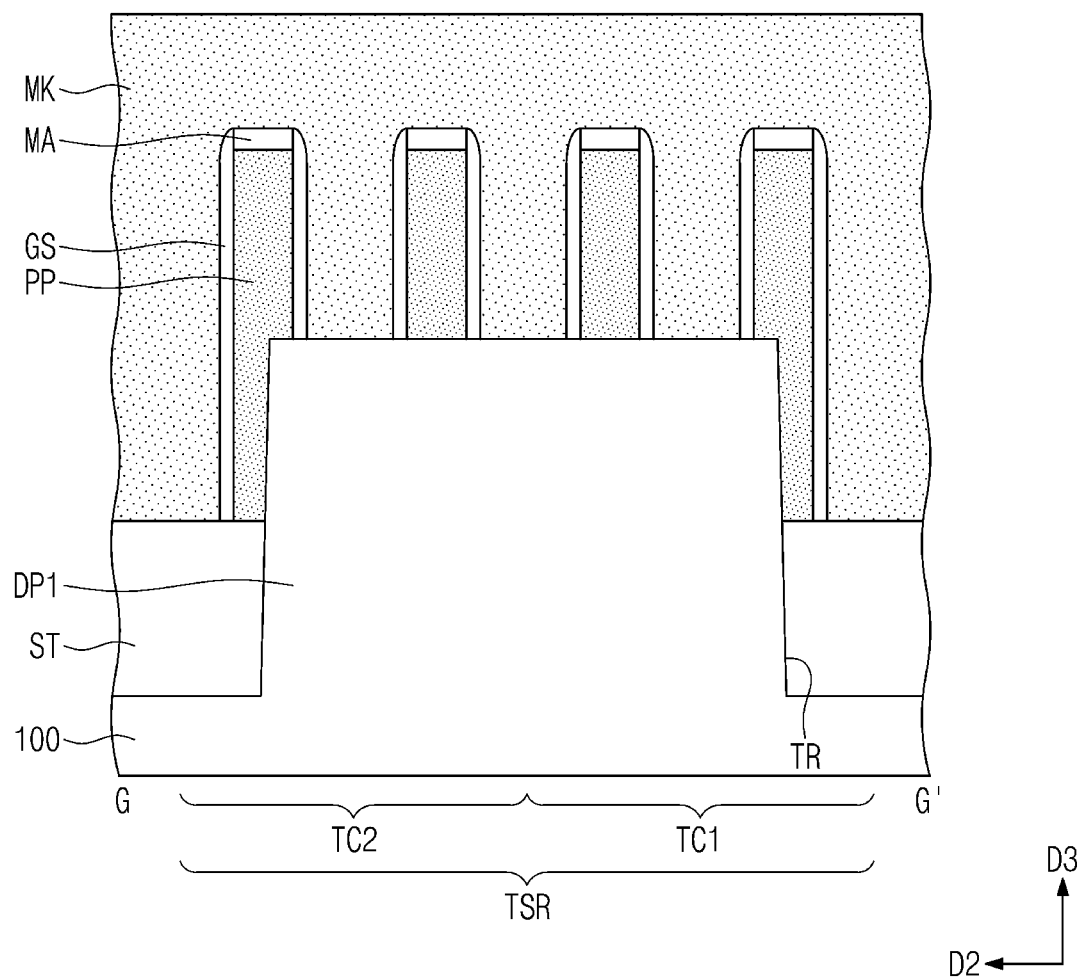
Figure 8G:
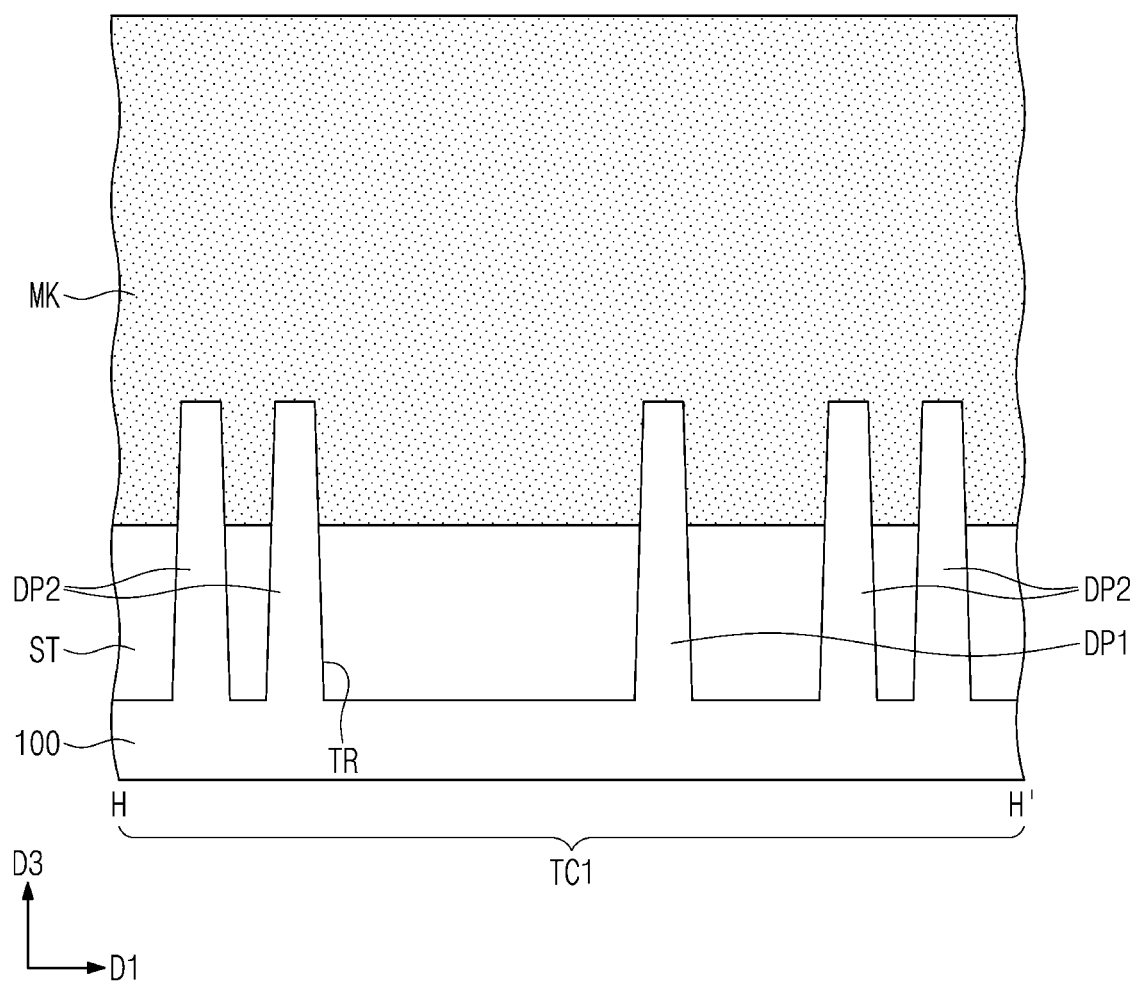
Figure 8H:
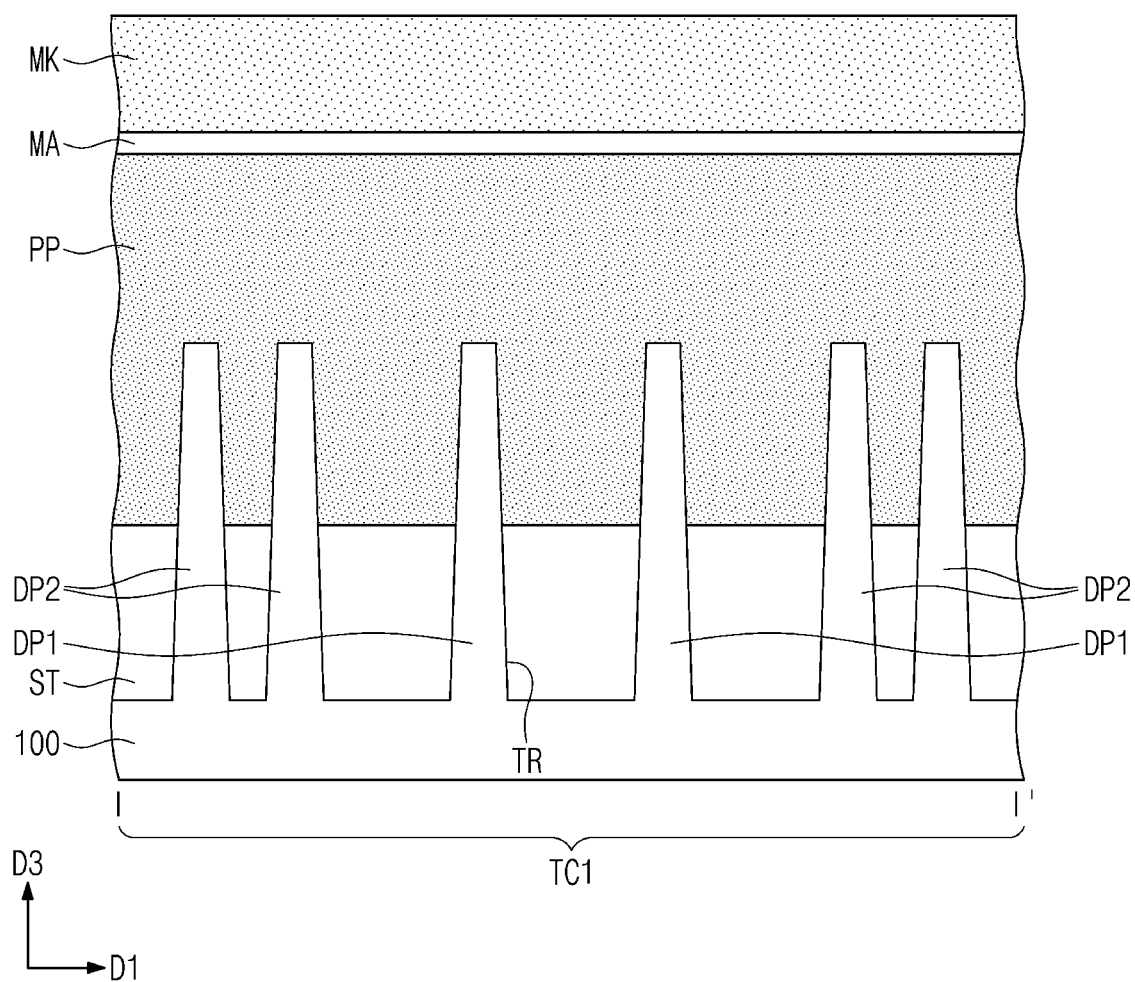
Figure 9A:
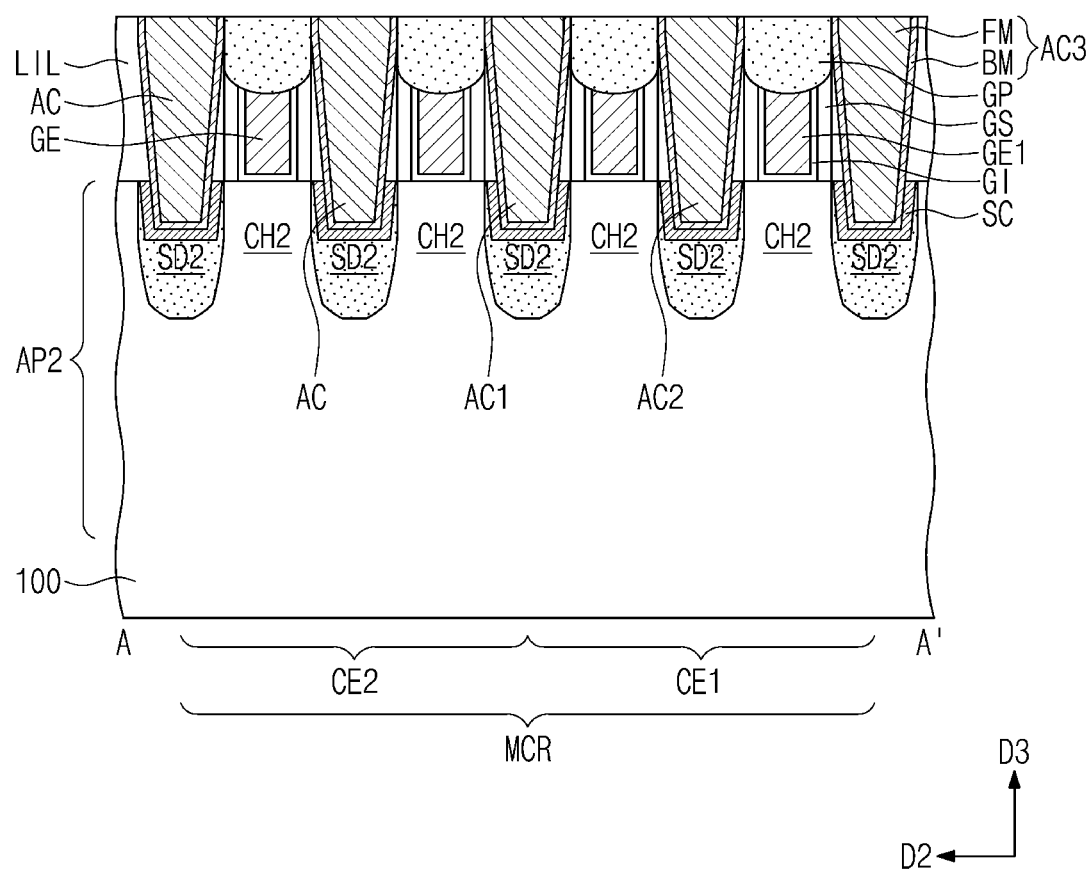
Figure 9B:
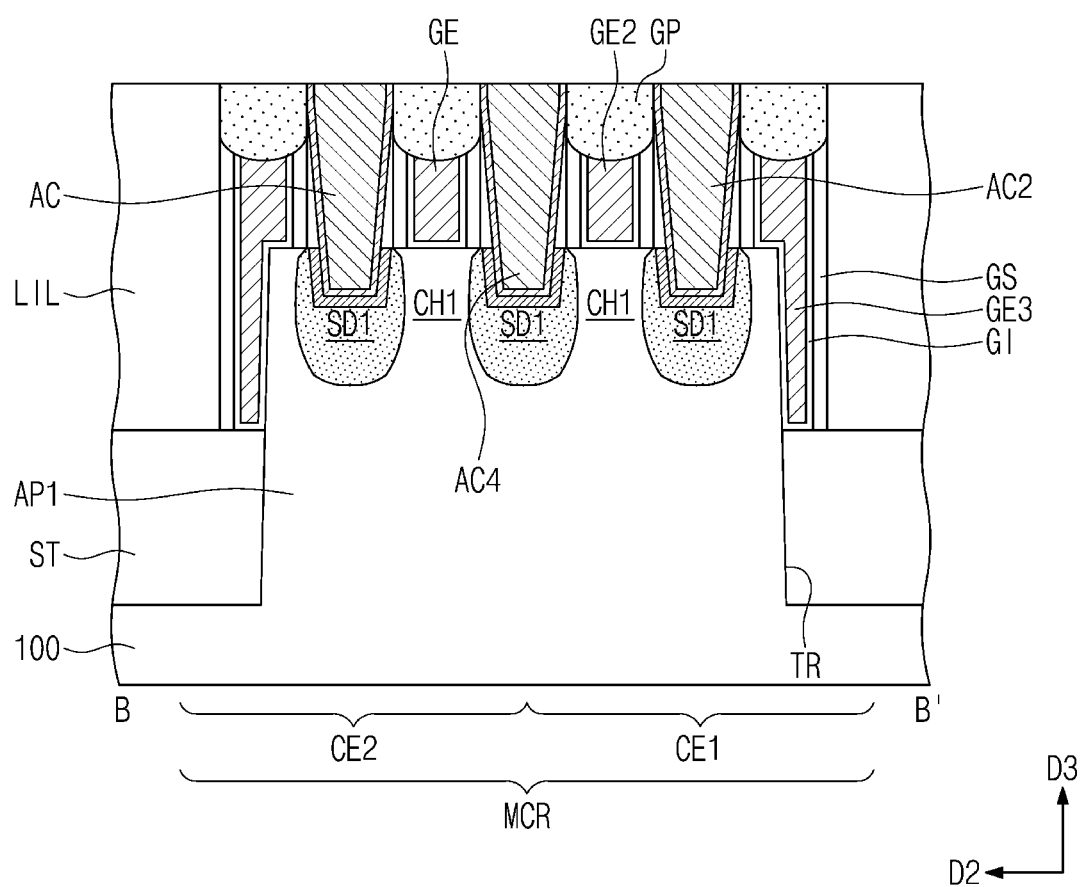
Figure 9C:
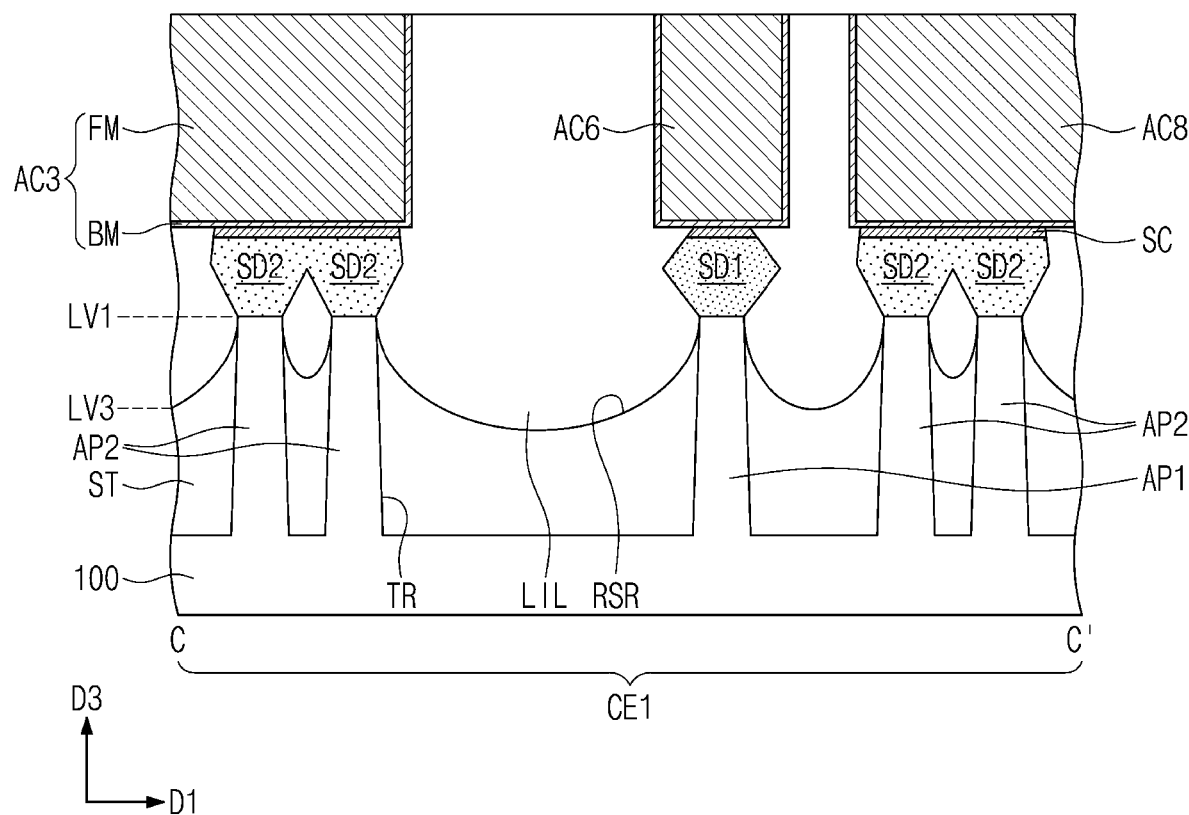
Figure 9D:
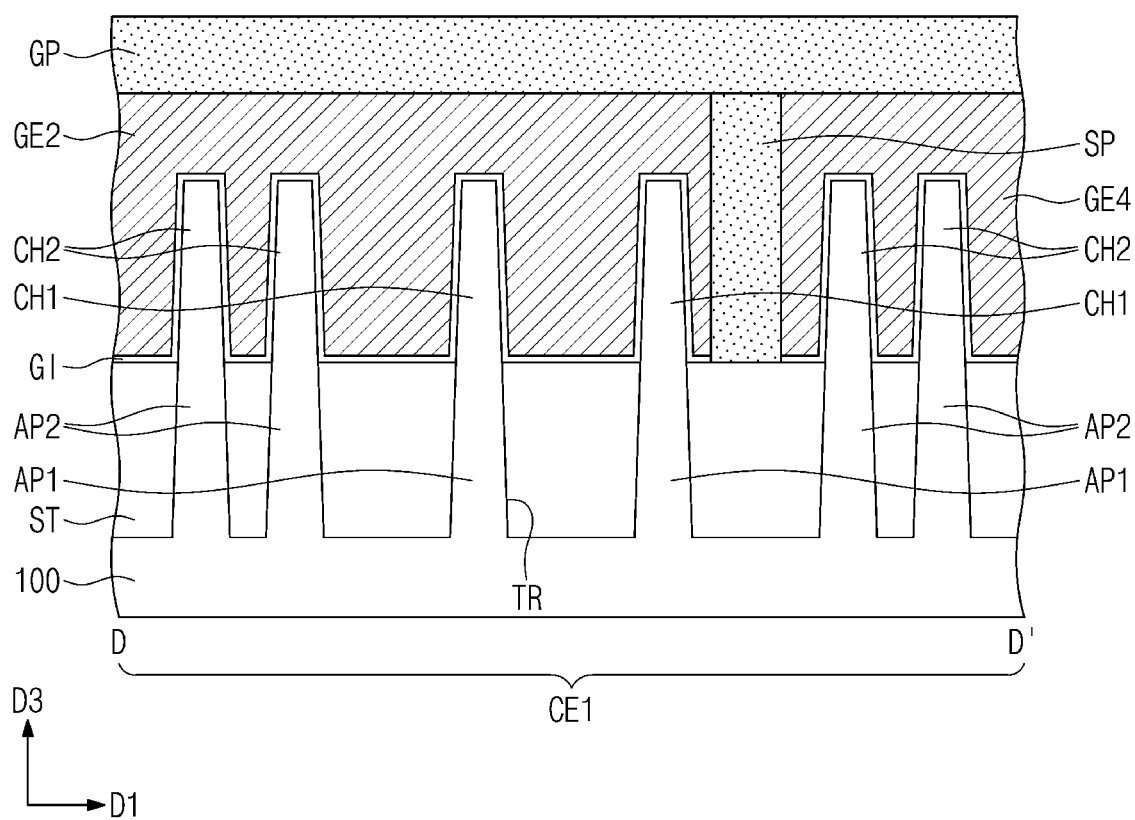
Figure 9E:
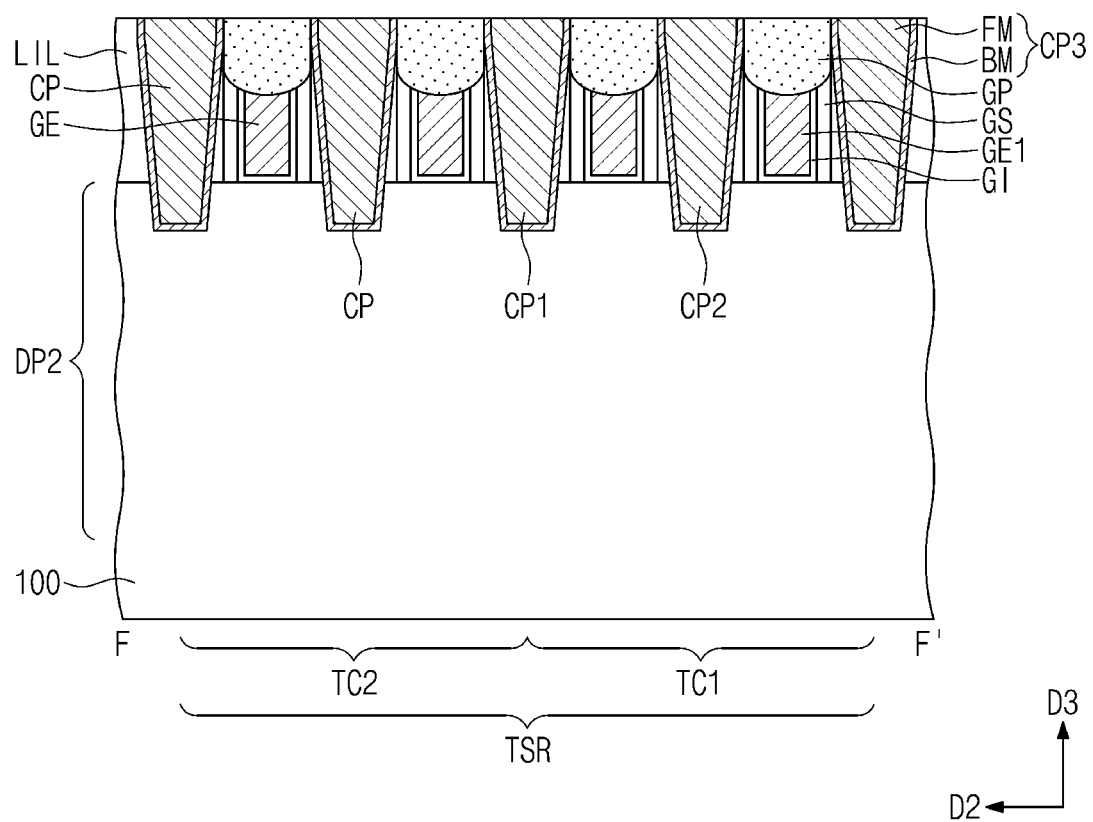
Figure 9F:
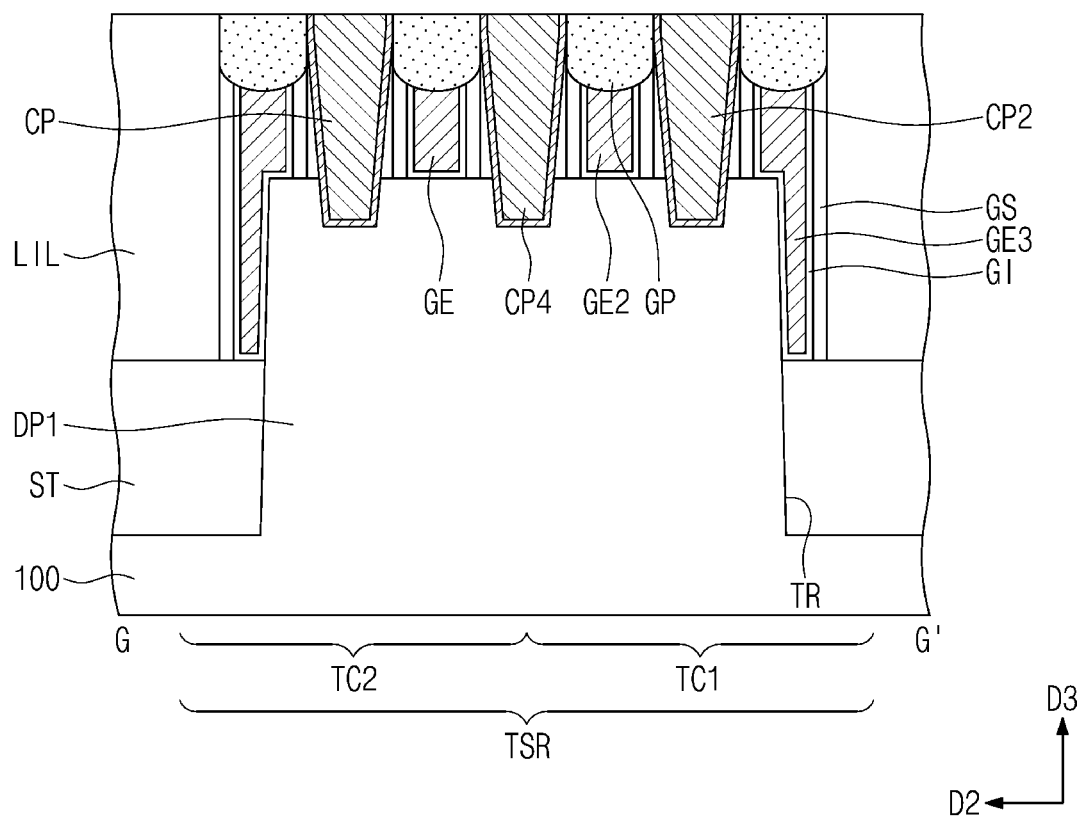
Figure 9G:
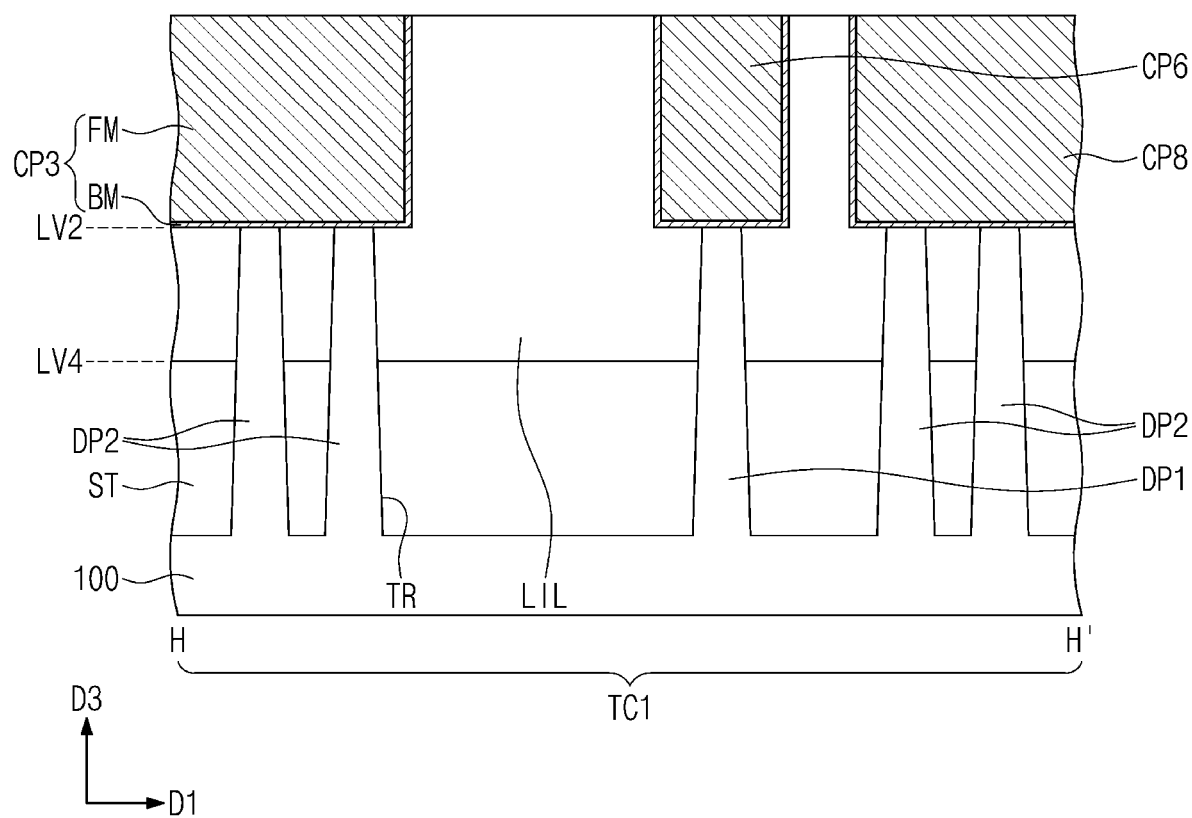
Figure 9H:
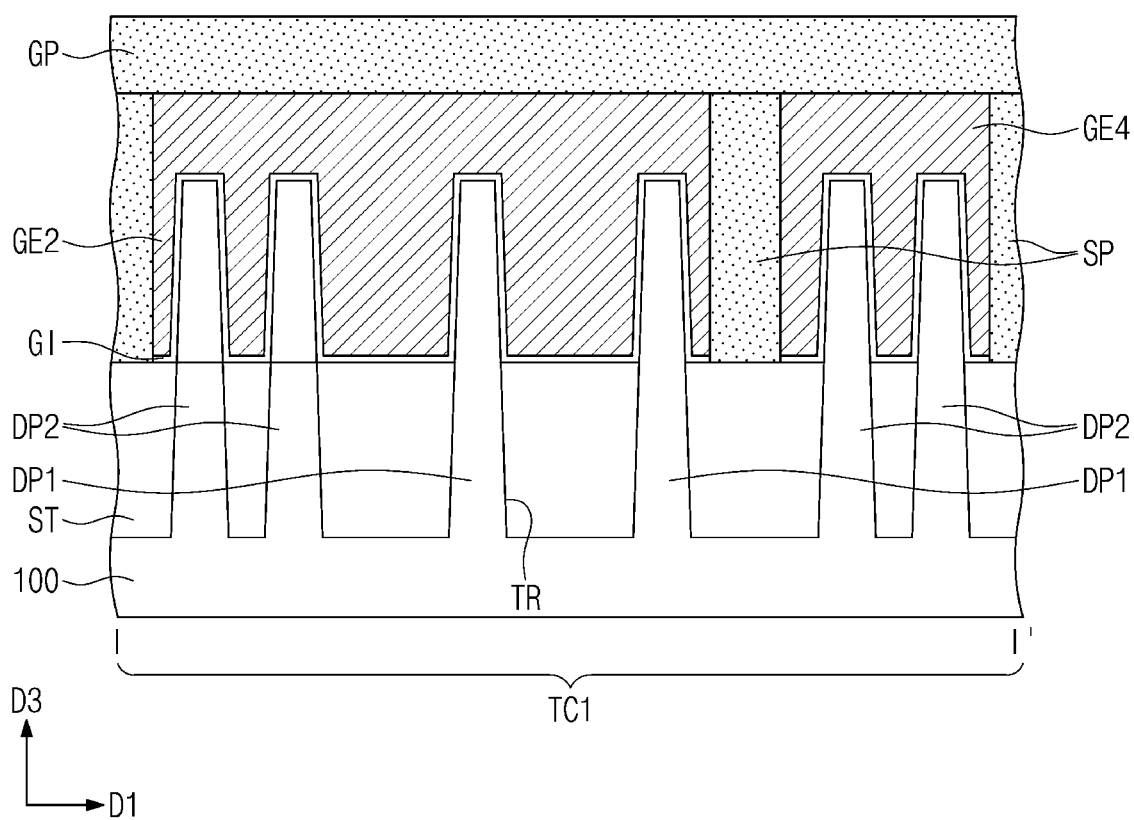
Figure 10A:
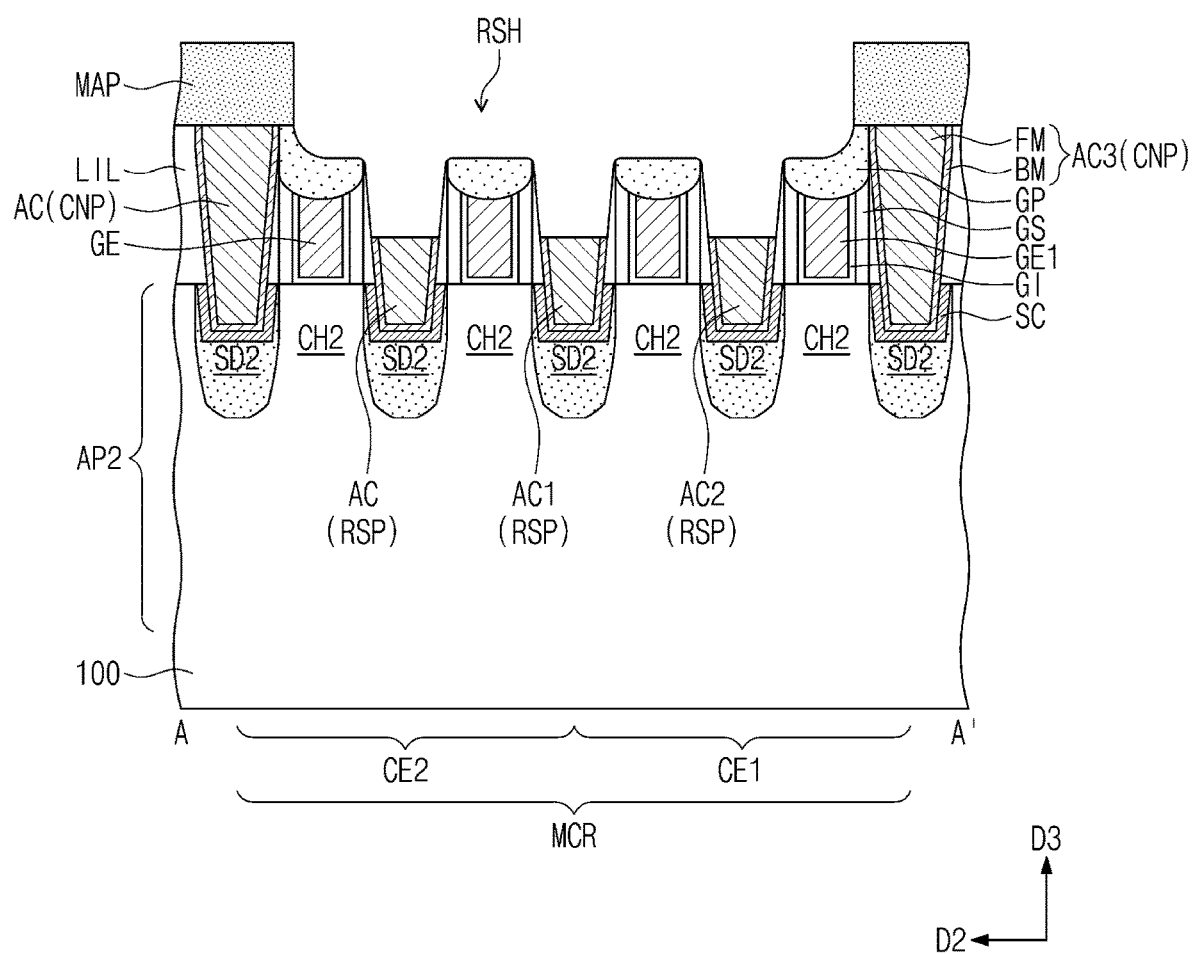
Figure 10B:
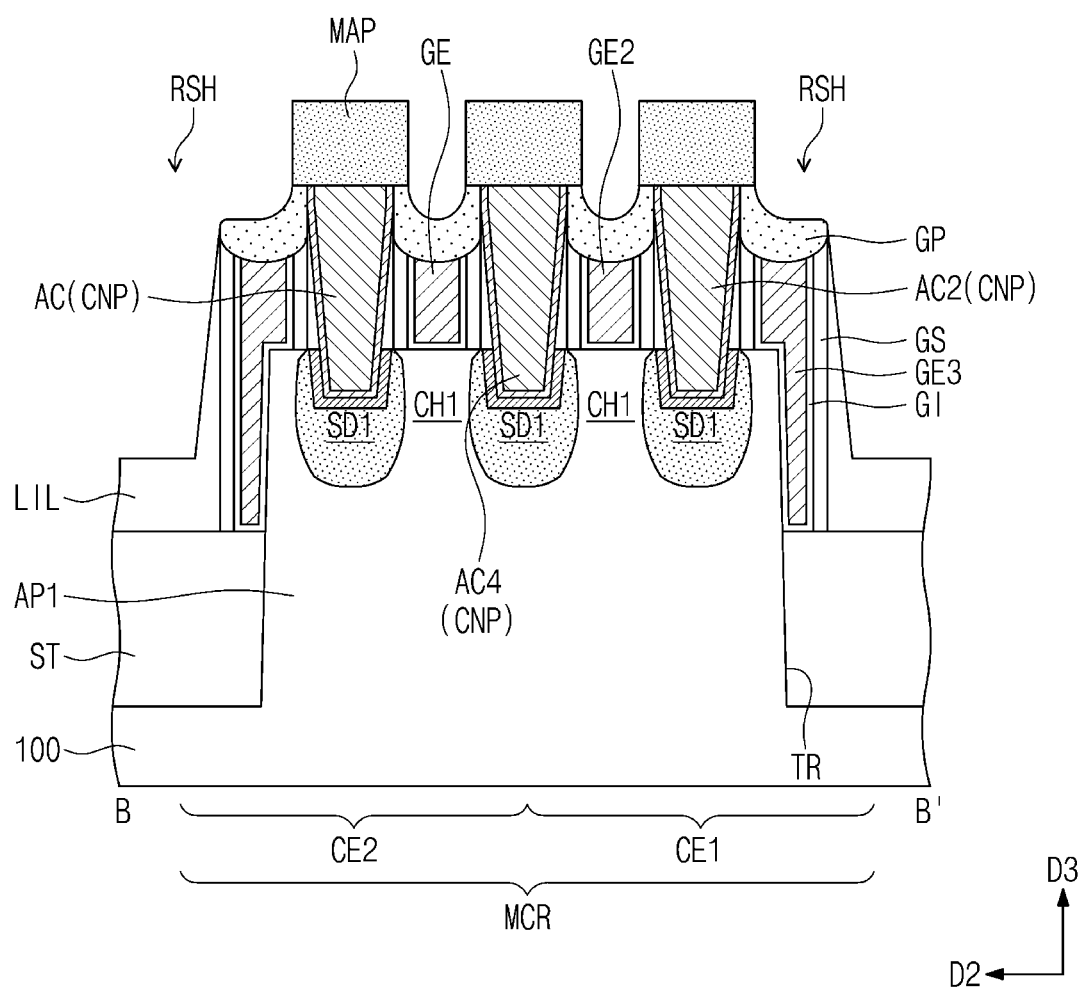
Figure 10C:
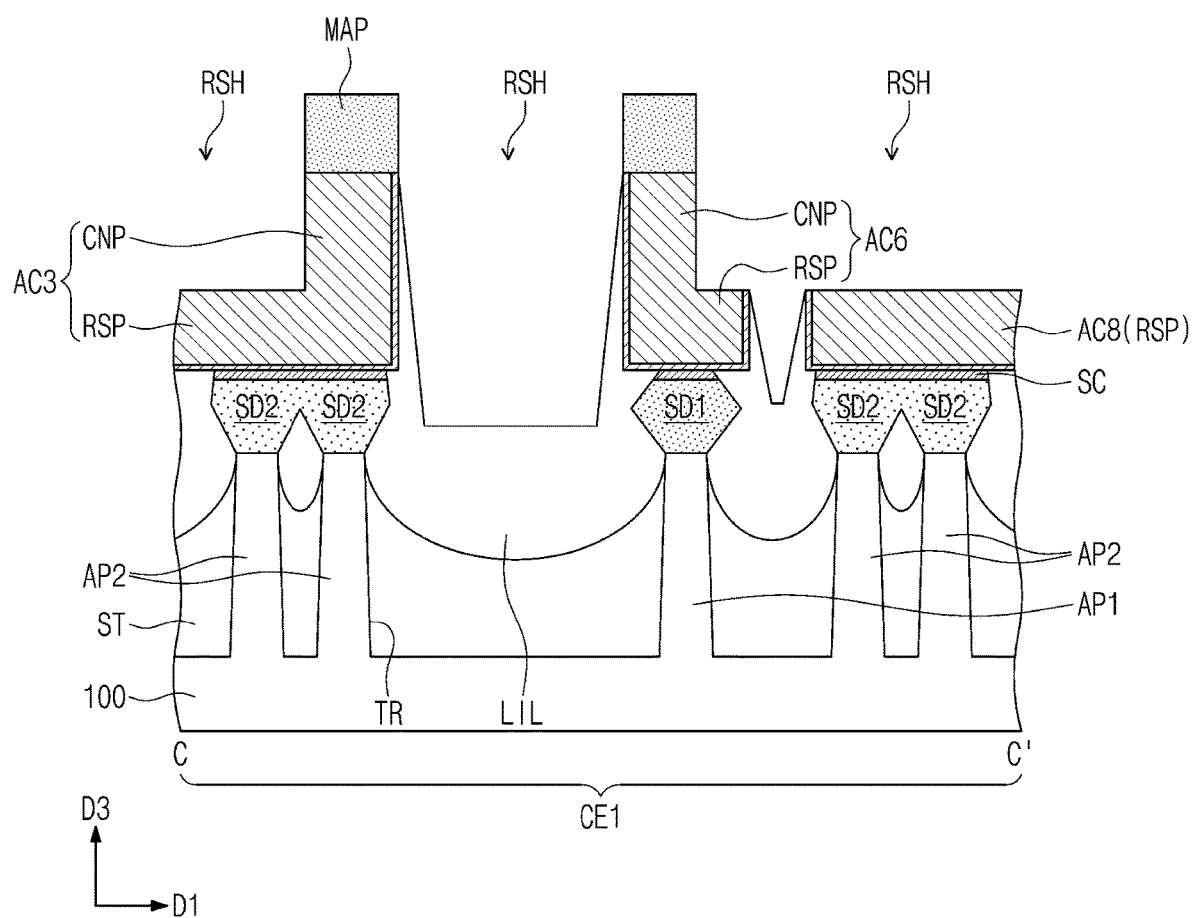
Figure 10D:
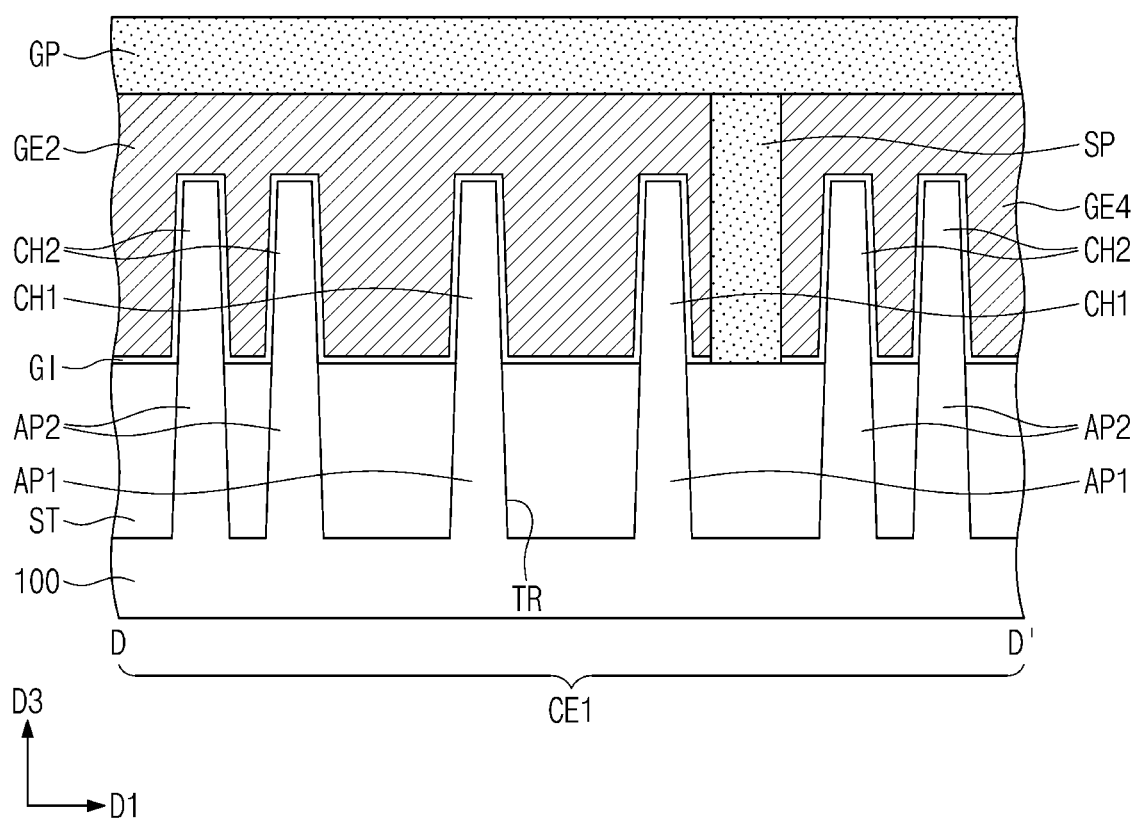
Figure 10E:
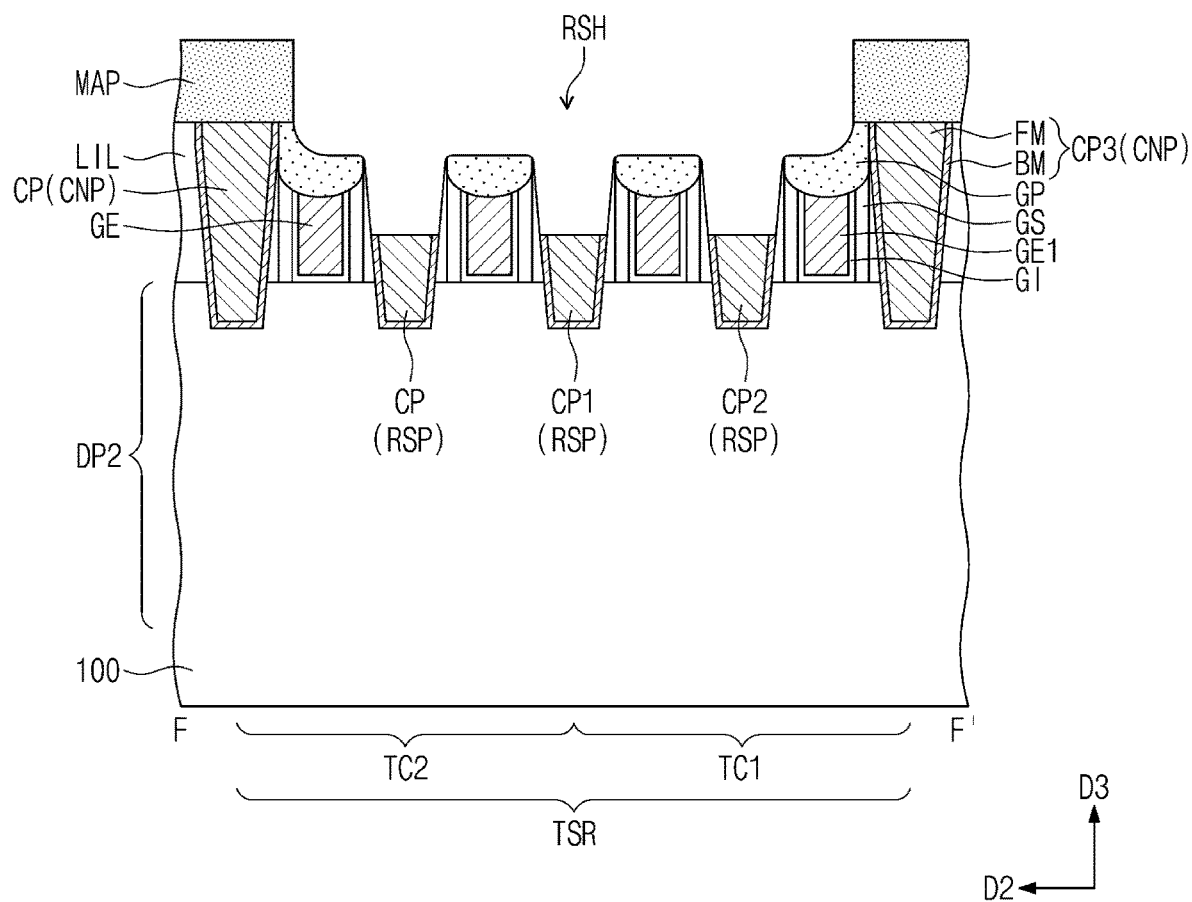
Figure 10F:
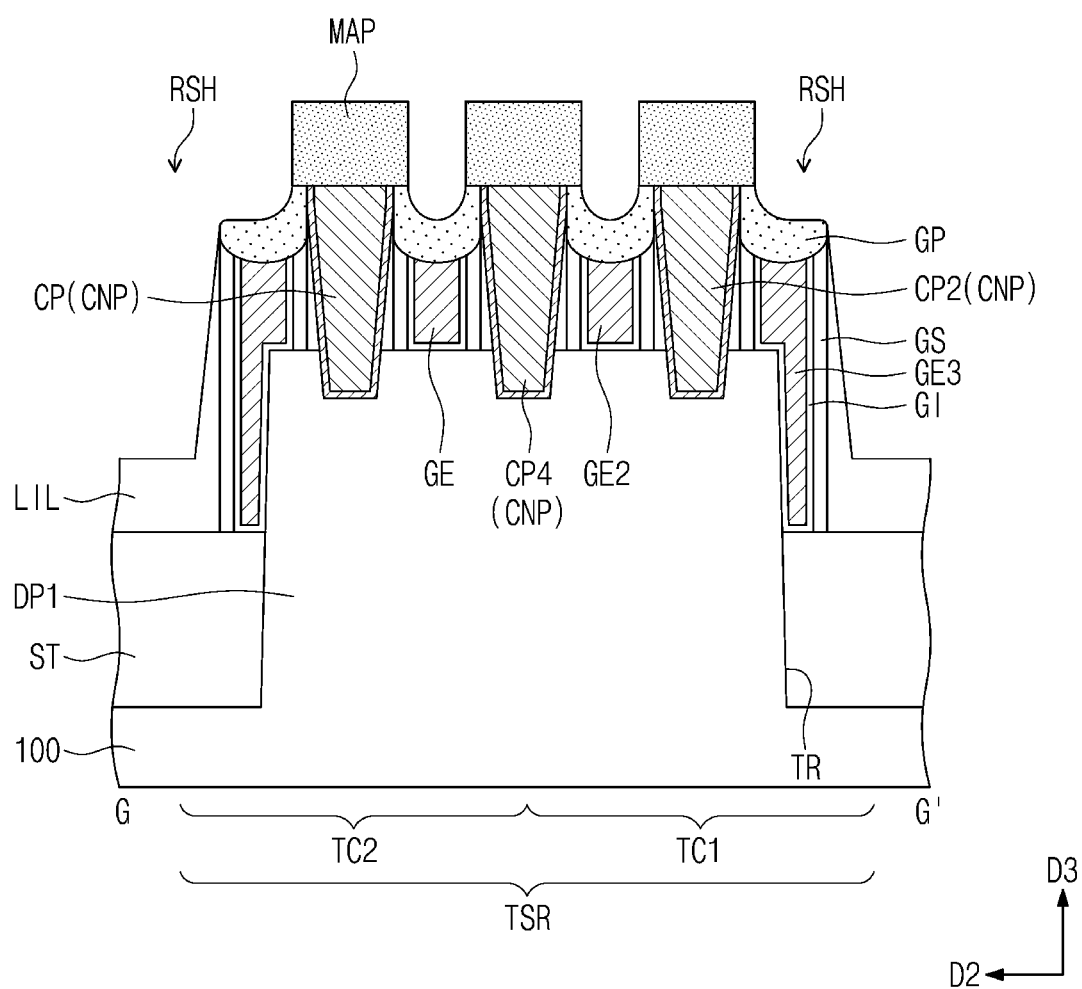
Figure 10G:
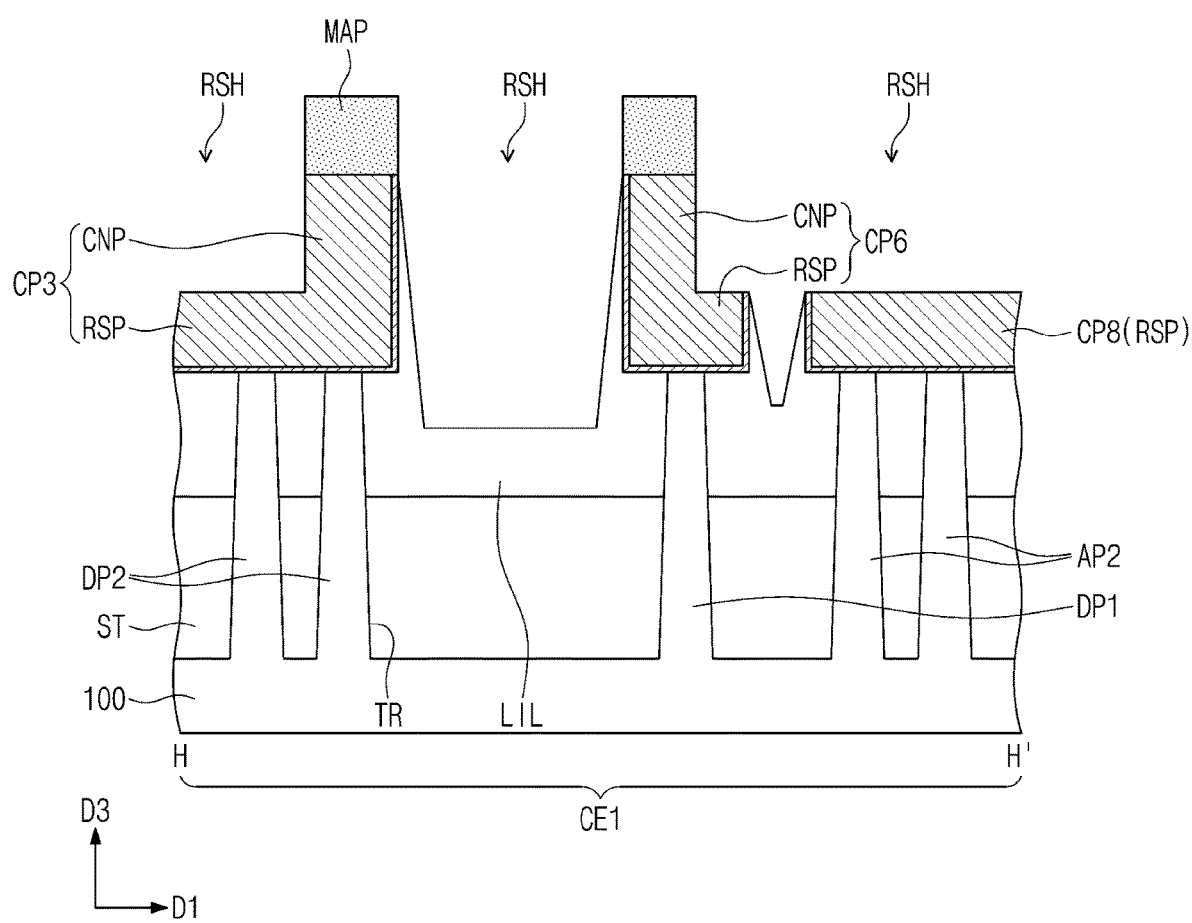
Figure 10H:
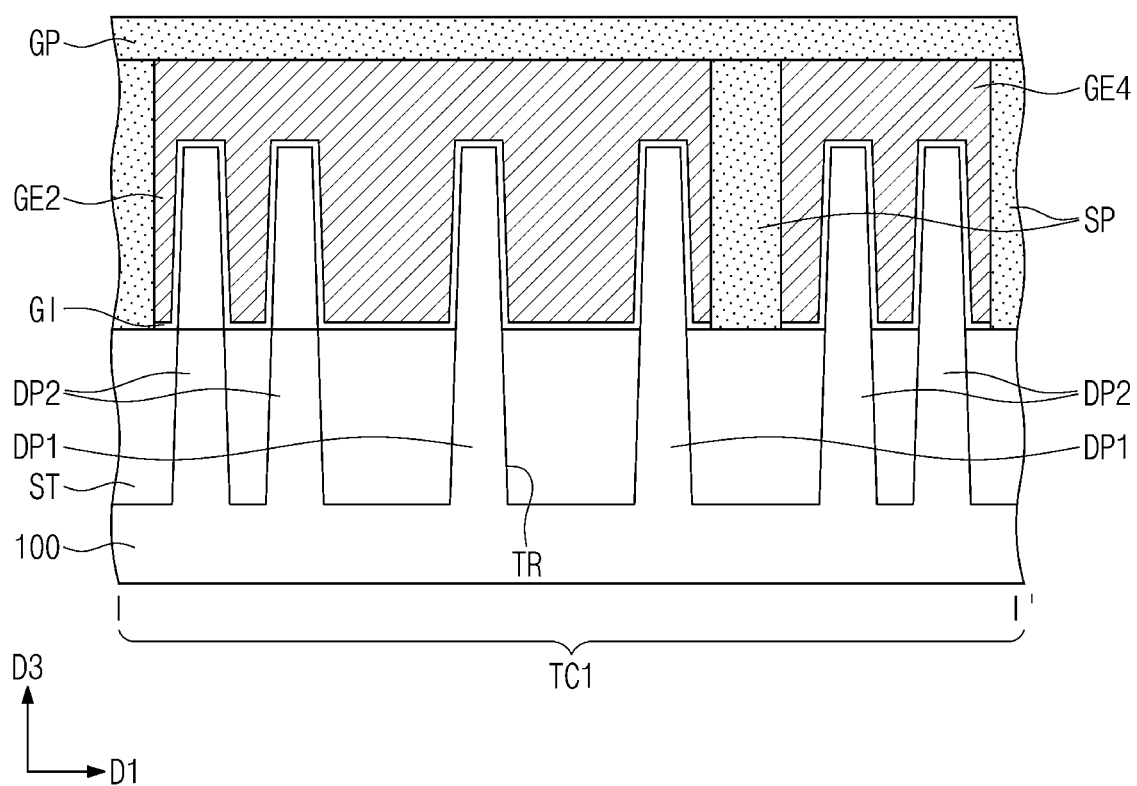
Figure 11A:
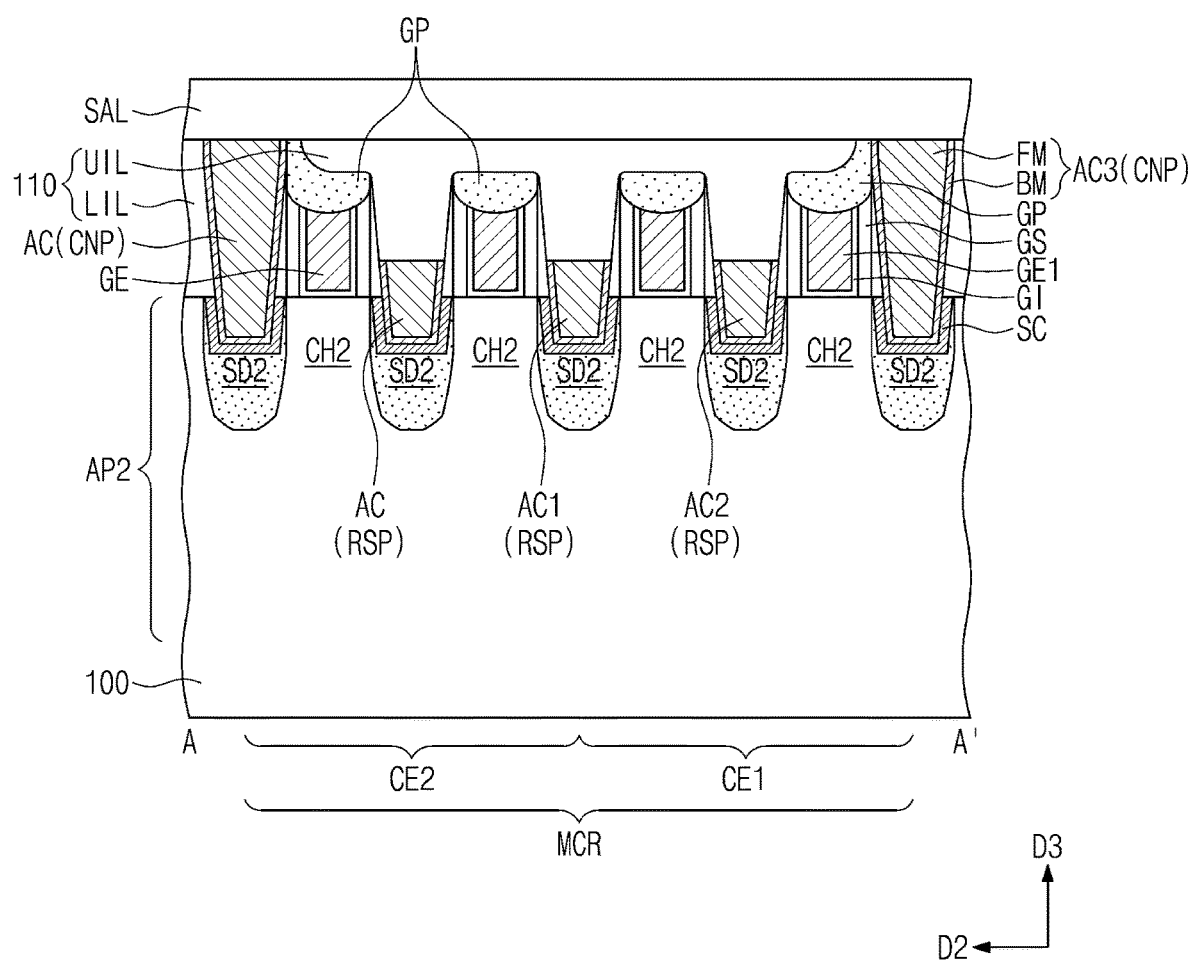
Figure 11B:
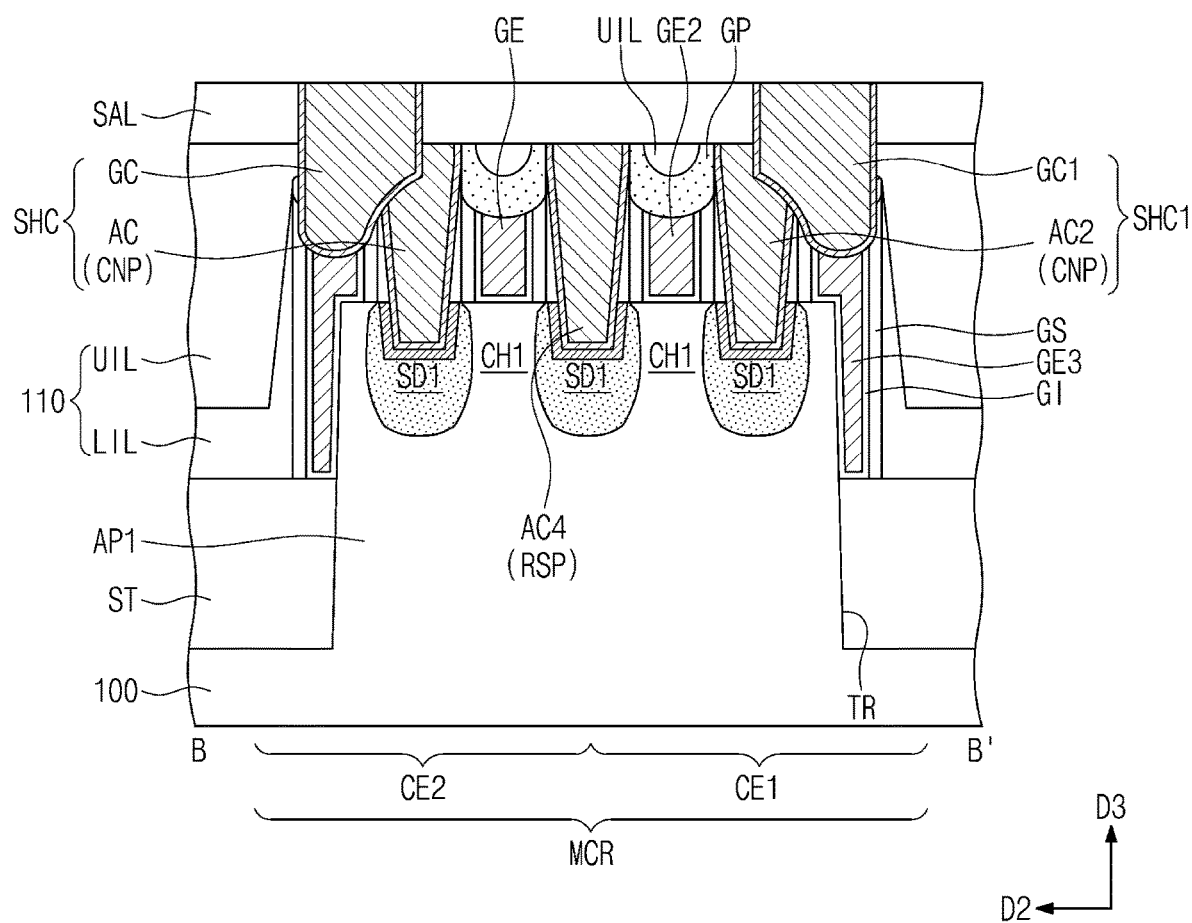
Figure 11C:
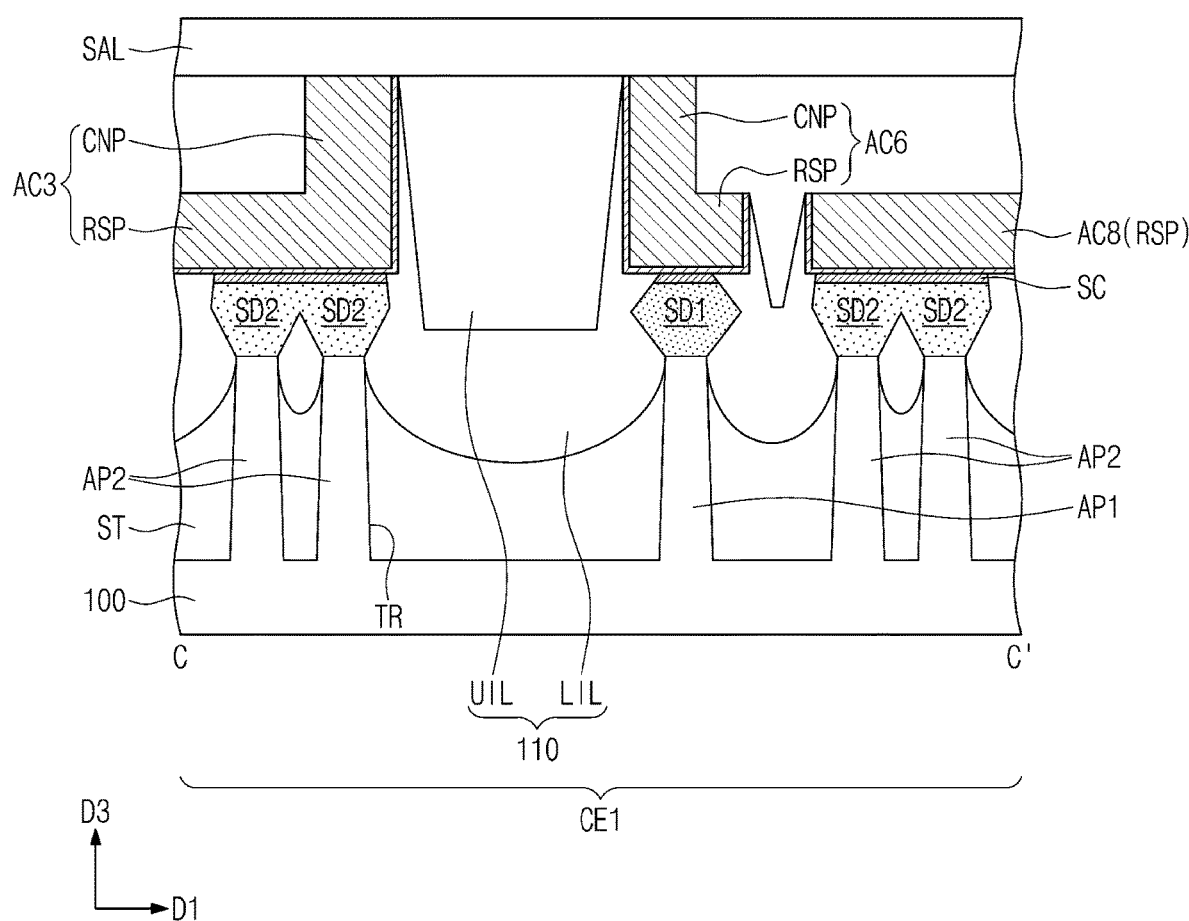
Figure 11D:
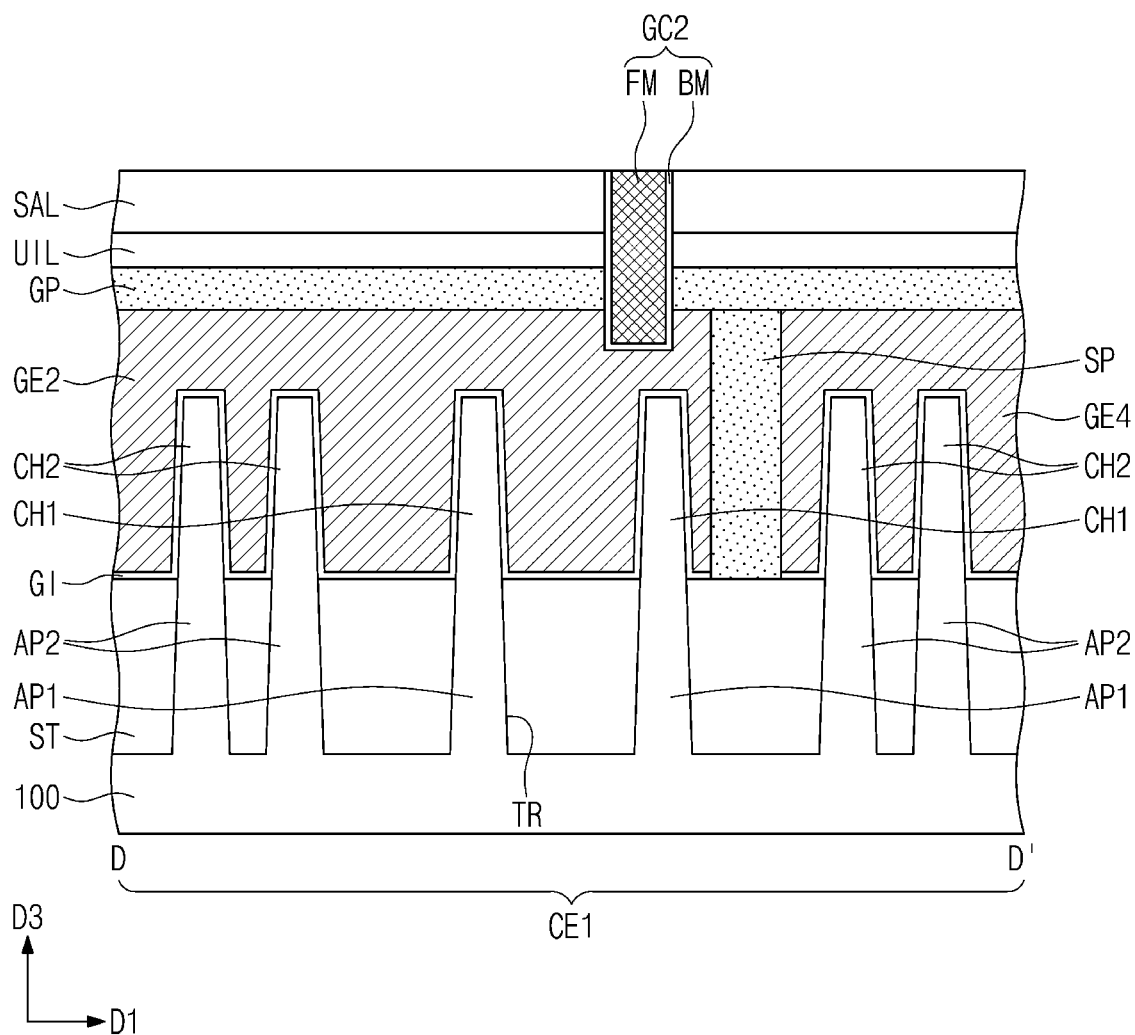
Figure 11E:
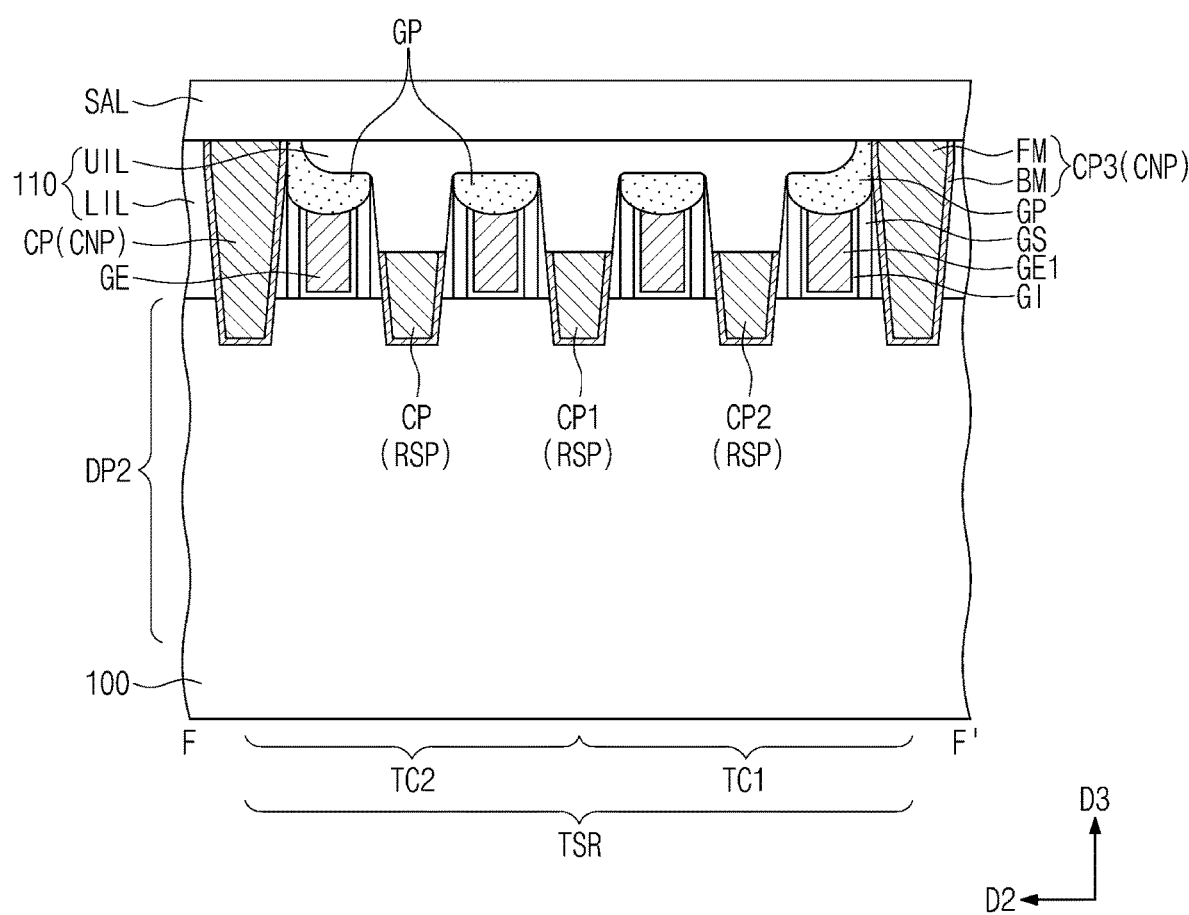
Figure 11F:
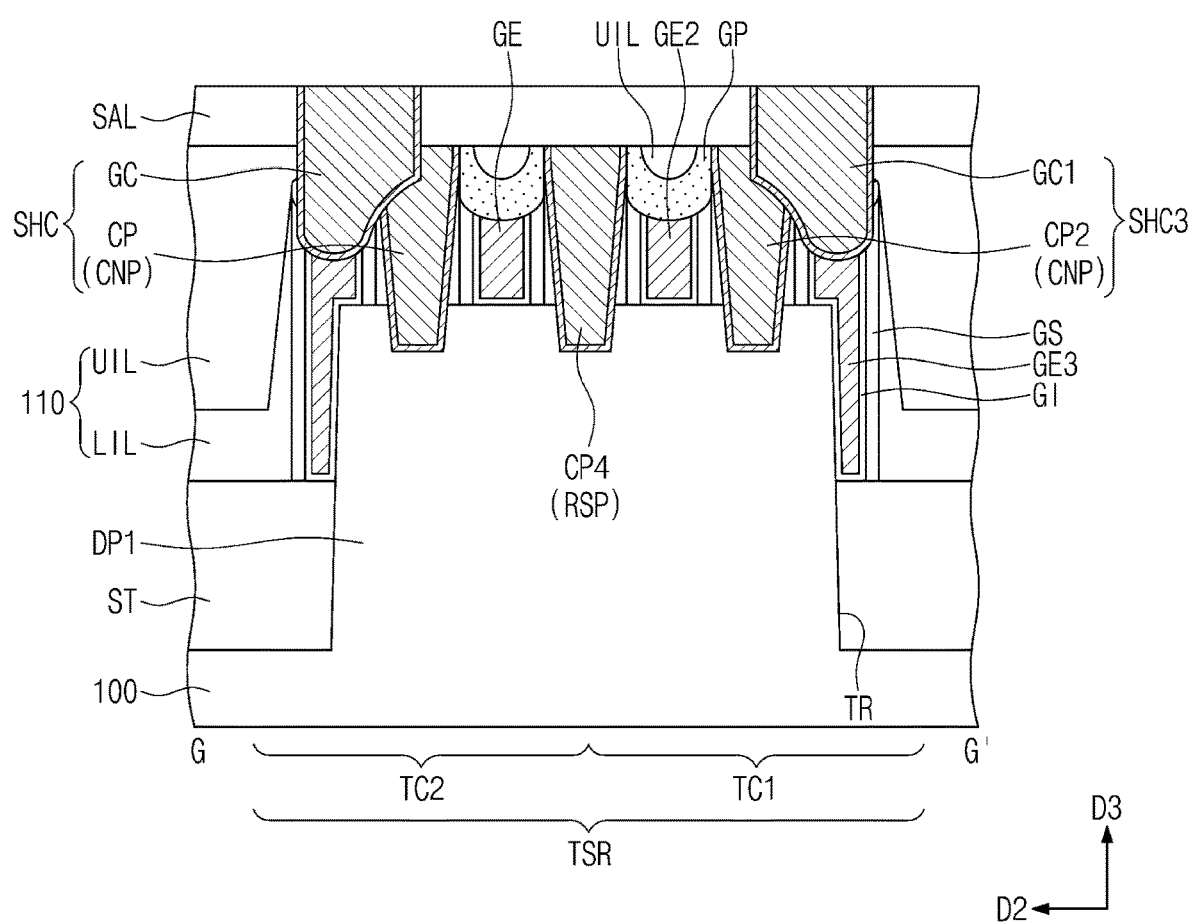
Figure 11G:
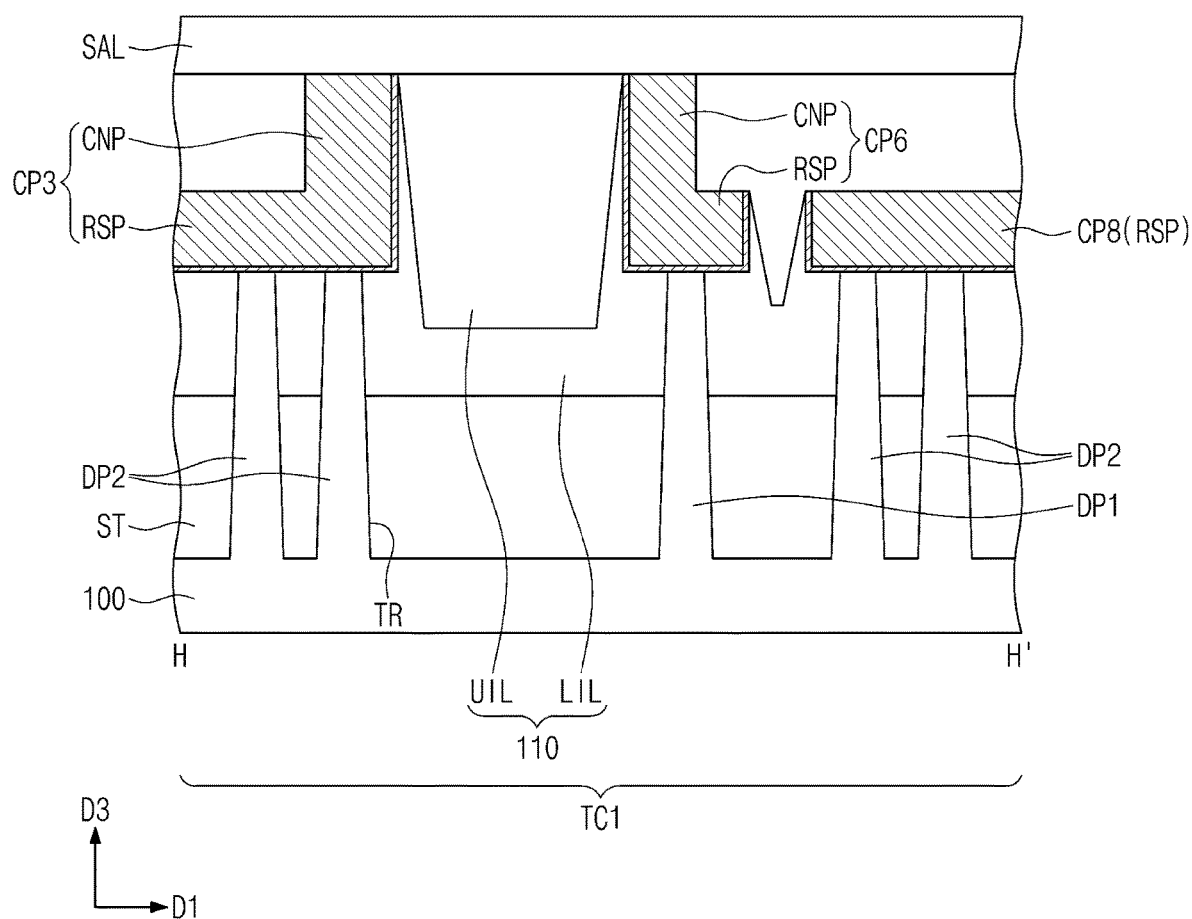
Figure 11H:
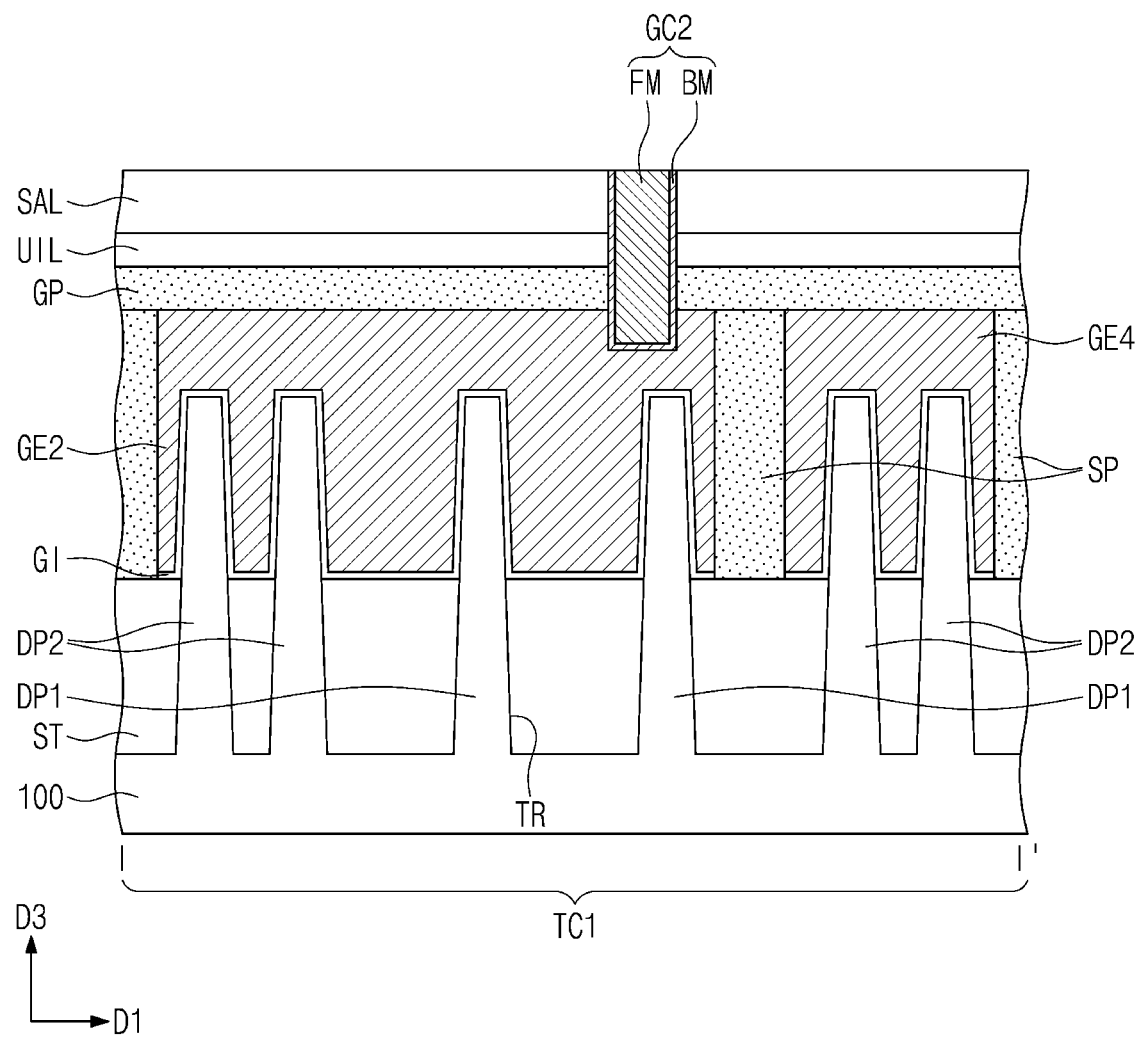

Dielectric patterns SP may be disposed on sidewalls in the first direction D1 of the gate electrode GE on the test region TSR (e.g., see FIG. 5I). The gate electrode GE on the test region TSR may be interposed between the dielectric patterns SP.

A pair of gate spacers GS may be disposed on opposite sidewalls of the gate electrode GE. The pair of gate spacers GS may extend in the first direction D1 along the gate electrode GE. The pair of gate spacers GS may have their top surfaces higher than that of the gate electrode GE. The top surfaces of the pair of gate spacers GS may be covered with a gate capping pattern GP which is discussed below in reference to FIG. 5D. A gate dielectric layer GI may be interposed between the gate electrode GE and the first dummy pattern DP1 and between the gate electrode GE and the second dummy pattern DP2.

The first interlayer dielectric layer 110 may include a lower dielectric layer LIL and an upper dielectric layer UIL. The upper dielectric layer UIL may cover the gate capping patterns GP and a recess part RSP of an active contact AC which is discussed below in reference to FIGS. 4 and 11A to 11H. The upper dielectric layer UIL may include a dielectric material the same as or different from that of the lower dielectric layer LIL. For example, the lower dielectric layer LIL may include SiO, and the upper dielectric layer UIL may include SiO, SiOC, SiC, or a combination thereof.

Contact patterns CP may penetrate the first interlayer dielectric layer 110 to contact top surfaces of the first and second dummy patterns DP1 and DP2. The contact patterns CP may have their top surfaces coplanar with that of the first interlayer dielectric layer 110. The contact patterns CP may include first to eighth contact patterns CP1 to CP8 on the first test cell TC1.

The contact pattern CP may be a self-aligned contact. For example, the gate capping pattern GP and the gate spacer GS may be used to form the contact pattern CP in a self-alignment manner. The contact pattern CP may cover at least a portion of a sidewall of the gate capping pattern GP.

The contact pattern CP may include a connection part CNP and a recess part RSP. The connection part CNP of the contact pattern CP may have a top surface higher than that of the recess part RSP. The top surface of the connection part CNP included in the contact pattern CP may be coplanar with that of the first interlayer dielectric layer 110. The upper dielectric layer UIL may be provided on the top surface of the recess part RSP included in the contact pattern CP. The contact pattern CP may have a structure substantially the same as that of the active contact AC. For example, the first to eighth contact patterns CP1 to CP8 on the test cell TC1 may have their configurations respectively substantially the same as those of the first to eighth active contacts AC1 to AC8 on the first bit cell CE1.

A first via VI1 may be disposed on the connection part CNP. For example, the connection part CNP may extend in a vertical direction or the third direction D3 to contact the first via VI1. One of the contact patterns CP may be electrically connected to the first wiring layer M1 through the connection part CNP and the first via VI1.

The connection part CNP of the second contact pattern CP2 among the contact patterns CP may be in contact with a first gate contact GC1 (e.g., see FIG. 5G). The second contact pattern CP2 may be electrically connected through the connection part CNP to the first gate contact GC1. The connection part CNP of the fifth contact pattern CP5 among the contact patterns CP may be in contact with a second gate contact GC2 (e.g., see FIG. 5G). The fifth contact pattern CP5 may be electrically connected through the connection part CNP to the second gate contact GC2.

The gate contact GC may be provided on the gate electrode GE electrically connected thereto. The gate contact GC may penetrate the first interlayer dielectric layer 110, the gate spacers GS, and the gate capping pattern GP, and may thus be coupled to the gate electrode GE.

The gate contact GC and the connection part CNP of the contact pattern CP may have their top surfaces coplanar with that of the first interlayer dielectric layer 110. The gate contact GC may have a bottom surface higher than that of the contact pattern CP. The bottom surface of the gate contact GC may be located higher than a top surface of the recess part RSP included in the contact pattern CP and lower than a top surface of the connection part CNP included in the contact pattern CP.

Referring back to FIGS. 4 and 5G, on the first test cell TC1, a third common contact SHC3 may be constituted by the first gate contact GC1 and the second contact pattern CP2 in contact with the first gate contact GC1. A fourth common contact SHC4 may be constituted by the second gate contact GC2 and the fifth contact pattern CP5 in contact with the second gate contact GC2.

The first wiring layer M1 may be provided in the second interlayer dielectric layer 120. On the test region TSR, the first wiring layer M1 may include a first test line M1_T1, a second test line M1_T2, and first vias VI1.

The first test line M1_T1 and the second test line M1_T2 may parallel extend in the second direction D2. The first test line M1_T1 and the second test line M1_T2 may be spaced apart from the second wiring layer M2 and the third wiring layer M3. The first test line M1_T1 may be coupled to the third common contact SHC3. The second test line M1_T2 may be coupled to the fourth common contact SHC4. The first vias VI1 may be interposed between the first test line M1_T1 and the third common contact SHC3 and between the second test pattern M1_T2 and the fourth common contact SHC4.

The first via VI1 coupled to the third common contact SHC3 may vertically overlap the connection part CNP of the second contact pattern CP2. The first via VI1 coupled to the fourth common contact SHC4 may vertically overlap the connection part CNP of the fifth contact pattern CP5.

Each of the first and second active patterns AP1 and AP2 may have a top surface whose lowermost level is a first level LV1. On the memory cell region MCR, the first interlayer dielectric layer 110 may have a bottom surface whose lowermost level is a third level LV3 (e.g., see FIGS. 5C and 5E). Each of the dummy patterns DP may have a top surface whose lowermost level is a second level LV2. On the test region TSR, the first interlayer dielectric layer 110 may have a bottom surface whose lowermost level is a fourth level LV4 (e.g., see FIGS. 5H and 5J). The first level LV1 may be lower than the second level LV2. The third level LV3 may be lower than the fourth level LV4. This difference in level may be induced from the fact that none of the first and second source/drain patterns SD1 and SD2 are formed on the test region TSR.

The first test line M1_T1 and the second test line M1_T2 may be provided with different voltages from each other. An increasing voltage difference between the voltages applied to the first and second test lines M1_T1 and M1_T2 may induce destruction of a dielectric material between the second contact pattern CP2 and its adjacent second gate electrode GE2 (or between the fifth contact pattern CP5 and the third gate electrode GE3), with the result that a breakdown voltage may be measured. A distance between the second contact pattern CP2 and its adjacent second gate electrode GE2 may be quantified based on magnitude of breakdown voltage. Therefore, it may be possible to non-destructively measure short failure between the active contact AC and its adjacent gate electrode GE on the memory cell region MCR whose structure is substantially the same, or at least similar, as that of the test region TSR.

To ascertain a short failure between a gate electrode and an active contact, electron beam inspection and nano probing may be used to find a short-circuit area, to cut the short-circuit area, and to perform destructive analysis on the cut short-circuit area. Alternatively or additionally, according to some embodiments of the present disclosure, short failure may be non-destructively measured by employing a voltage ramping method in which different voltages are applied to the first test line M1_T1 and the second test line M1_T2, and in which the difference in voltage is increased. Therefore, it may be possible to decrease a time required for detecting a short failure that occurs between an active contact and a gate electrode due to a reduction in size of semiconductor devices and to cut down costs by preventing wafer consumption resulting from destructive analysis. As a result, it may be possible to overcome difficulties related to detecting failures in a semiconductor memory device when compared to a conventional semiconductor memory device.

Referring to FIGS. 6A and 6B, each of the first gate contact GC1 and the second active contact AC2 included in the first common contact SHC1 may include the barrier pattern BM and the conductive pattern FM. The barrier pattern BM of the first gate contact GC1 may be interposed between the conductive pattern FM of the first gate contact GC1 and the conductive pattern FM of the second active contact AC2.

The first gate contact GC1 may include a body part BDP coupled to the third gate electrode GE3 and a protrusion part PRP that horizontally extend in the second direction D2 from the body part BDP. The protrusion part PRP may vertically overlap the second active contact AC2. The body part BDP may not overlap but may be offset from the second active contact AC2. The protrusion part PRP may be in direct contact with the second active contact AC2. For example, the first gate contact GC1 may be connected through the protrusion part PRP to the second active contact AC2.

The protrusion part PRP may extend from the body part BDP toward a center of the second active contact AC2. The protrusion part PRP may have a shape that is inserted into an upper portion of the second active contact AC2. The protrusion part PRP may have a shape buried in the second active contact AC2.

The protrusion part PRP may be located at a higher level than that a bottom surface of the body part BDP. For example, a lowermost portion of the protrusion part PRP may be higher than a top surface of the third gate electrode GE3. In some embodiments, the protrusion part PRP may have a top surface coplanar with that of the body part BDP. In some embodiments, the protrusion part PRP may have a top surface lower than that of the body part BDP.

As the protrusion part PRP of the first gate contact GC1 has a shape buried in the second active contact AC2, a relatively large contact area may be present between the first gate contact GC1 and the second active contact AC2. Accordingly, a relatively small contact resistance may be provided between the first gate contact GC1 and the second active contact AC2.

The protrusion part PRP of the first gate contact GC1 may be provided to overlap the second active contact AC2. Thus, when the first gate contact GC1 is formed, the protrusion part PRP may cause to obtain an alignment margin between the first gate contact GC1 and the second active contact AC2. For example, the protrusion part PRP may prevent misalignment between the first gate contact GC1 and the second active contact AC2. As a result, a semiconductor memory device may increase in reliability.

Each of the second to fourth common contacts SHC2 to SHC4 may also have substantially the same structure as that of the first common contact SHC1.

FIGS. 7A to 11H illustrate cross-sectional views showing a method of fabricating a semiconductor memory device according to some embodiments of the present disclosure. FIGS. 7A, 8A, 9A, 10A, and 11A illustrate cross-sectional views taken along line A-A' of FIG. 4. FIGS. 7B, 8B, 9B, 10B, and 11B illustrate cross-sectional views taken along line B-B' of FIG. 4. FIGS. 7C, 8C, 9C, 10C, and 11C illustrate cross-sectional views taken along line C-C' of FIG. 4. FIGS. 7D, 8D, 9D, 10D, and 11D illustrate cross-sectional views taken along line D-D' of FIG. 4. FIGS. 7E, 8E, 9E, 10E, and 11E illustrate cross-sectional views taken along F-F' of FIG. 4. FIGS. 7F, 8F, 9F, 10F, and 11F illustrate cross-sectional views taken along line G-G' of FIG. 4. FIGS. 7G, 8G, 9G, 10G, and 11G illustrate cross-sectional views taken along H-H' of FIG. 4. FIGS. 7H, 8H, 9H, 10H, and 11H illustrate cross-sectional views taken along line I-I' of FIG. 4.

Referring to FIGS. 4 and 7A to 7H, a substrate 100 may be provided which includes a memory cell region MCR and a test region TSR. The substrate 100 may be patterned to form trenches TR that define first and second active patterns AP1 and AP2 and first and second dummy patterns DP1 and DP2. For example, the trenches TR may be formed between the first and second active patterns AP1 and AP2 and between the first and second dummy patterns DP1 and DP2.

A device isolation layer ST may be formed on the substrate 100 to fill the trenches TR. The device isolation layer ST may include a dielectric material, such as a silicon oxide layer. The device isolation layer ST may be recessed until upper portions of the first and second active patterns AP1 and AP2 are exposed and upper portions of the first and second dummy patterns DP1 and DP2 are exposed. Therefore, the first and second active patterns AP1 and AP2 may have their upper portions that vertically protrude upwards from the device isolation layer ST.

Referring to FIGS. 4 and 8A to 8H, sacrificial patterns PP may be formed to run across the first and second active patterns AP1 and AP2 and also to run across the first and second dummy patterns DP1 and DP2. The sacrificial patterns PP may each have a linear shape that extends in a first direction D1. For example, the formation of the sacrificial patterns PP may include forming a sacrificial layer on an entire surface of the substrate 100, forming hardmask patterns MA on the sacrificial layer, and using the hardmask patterns MA as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively or additionally, the gate spacer layer may be a multiple layer including at least two selected from SiCN, SiCON, and SiN.

A mask layer MK may be formed to cover the test region TSR. The mask layer MK may cover the test region TSR and may not cover the memory cell region MCR. For example, the mask layer MK may expose the memory cell region MCR.

First source/drain patterns SD1 may be formed on an upper portion of the first active pattern AP1. A pair of first source/drain patterns SD1 may be formed on opposite sides of each of the sacrificial patterns PP. For example, the hardmask patterns MA and the gate spacers GS may be used as an etching mask to etch the upper portion of the first active pattern AP1 to form first recesses RS1. While the upper portion of the first active pattern AP1 is etched, the device isolation layer ST may be recessed between the first active patterns AP1. Therefore, a recess region RSR may be formed on a top surface of the device isolation layer ST on the memory cell region MCR.

A selective epitaxial growth process may be performed in which an inner wall of the first recess RS1 of the first active pattern AP1 is used as a seed layer to form the first source/drain pattern SD1. The formation of the first source/drain patterns SD1 may define a first channel pattern CH1 between a pair of first source/drain patterns SD1. For example, the first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

In some embodiments, impurities may be in-situ doped during the selective epitaxial growth process for forming the first source/drain patterns SD1. In some embodiments, after the first source/drain patterns SD1 are formed, impurities may be doped into the first source/drain patterns SD1. The first source/drain patterns SD1 may be doped to have a first conductivity type (e.g., p-type).

Second source/drain patterns SD2 may be formed on an upper portion of the second active pattern AP2. A pair of second source/drain patterns SD2 may be formed on opposite sides of each of the sacrificial patterns PP. For example, the hardmask patterns MA and the gate spacers GS may be used as an etching mask to etch the upper portion of the second active pattern AP2 to form second recesses RS2.

A selective epitaxial growth process may be performed in which an inner wall of the second recess RS2 of the second active pattern AP2 is used as a seed layer to form the second source/drain pattern SD2. The formation of the second source/drain patterns SD2 may define a second channel pattern CH2 between a pair of second source/drain patterns SD2. For example, the second source/drain patterns SD2 may include the same semiconductor element (e.g., Si) as that of the substrate 100. The second source/drain patterns SD2 may be doped to have a second conductivity type (e.g., n-type).

Different processes may be performed to sequentially form the first source/drain patterns SD1 and the second source/drain patterns SD2. For example, the first and second source/drain patterns SD1 and SD2 may not be formed at the same time.

The mask layer MK may prevent the formation of the first and second source/drain patterns SD1 and SD2 on the test region TSR. The mask layer MK may allow the device isolation layer ST to have a flat profile at its top surface on the test region TSR.

Referring to FIGS. 4 and 9A to 9H, a lower dielectric layer LIL may be formed to cover the first and second source/drain patterns SD1 and SD2, the hardmask patterns MA, and the gate spacers GS. For example, the lower dielectric layer LIL may include a silicon oxide layer.

The lower dielectric layer LIL may be planarized until top surfaces of the sacrificial patterns PP are exposed. An etch-back or chemical mechanical polishing (CMP) process may be employed to planarize the lower dielectric layer LIL. The hardmask patterns MA may all be removed during the planarization process. As a result, the lower dielectric layer LIL may have a top surface coplanar with those of the sacrificial patterns PP and those of the gate spacers GS.

The exposed sacrificial pattern PP may be partially removed and then a dielectric material may be filled to form a dielectric pattern SP. The dielectric pattern SP may divide a gate electrode GE into first to fourth gate electrodes GE1 to GE4 which are subsequently formed.

The sacrificial patterns PP may be replaced with gate electrodes GE. For example, the exposed sacrificial patterns PP may be selectively removed. The removal of the sacrificial pattern PP may form an empty space. A gate dielectric layer GI and the gate electrode GE may be formed in the empty space where the sacrificial pattern PP is removed.

The gate electrode GE and the gate spacer GS may be recessed, and a gate capping pattern GP may be formed on the recessed gate electrode GE and the recessed gate spacer GS. The gate capping pattern GP may include a material having an etch selectivity with respect to the lower dielectric layer LIL.

Active contacts AC and contact patterns CP may be formed to penetrate the lower dielectric layer LIL and to electrically connect with the first and second source/drain patterns SD1 and SD2. For example, a first photolithography process may be performed to form first contact holes in the lower dielectric layer LIL. The first contact holes may define the active contacts AC and the contact patterns CP. The first contact holes may expose the first and second source/drain patterns SD1 and SD2 and the first and second dummy patterns DP1 and DP2. The gate capping patterns GP may be used as an etching mask to form the first contact holes in a self-alignment manner.

Silicide patterns SC may be formed on the first and second source/drain patterns SD1 and SD2 exposed to the first contact holes. A barrier pattern BM and a conductive pattern FM may be sequentially formed in the first contact hole to form the active contact AC. The active contact AC may have a top surface coplanar with that of the gate capping pattern GP and that of the lower dielectric layer LIL.

A contact pattern CP may be formed on the first and second dummy patterns DP1 and DP2 exposed to the first contact holes. The formation of the contact pattern CP may include sequentially forming a barrier pattern BM and a conductive pattern FM in the first contact hole. The contact pattern CP may have a top surface coplanar with that of the gate capping pattern GP and that of the lower dielectric layer LIL.

Referring to FIGS. 4 and 10A to 10H, a mask pattern MAP may be formed on a partial area of the active contact AC and a partial area of the contact pattern CP. The mask pattern MAP may define an area where a connection part CNP of the active contact AC is to be formed and an area where a connection part CNP of the contact pattern CP is to be formed.

The mask pattern MAP may be used as an etching mask to etch a remaining region other than the mask pattern MAP to form a recess hole RSH. During the etching process for forming the recess hole RSH, an upper portion of the gate capping pattern GP may be recessed. While the etching process is performed, a remaining region of the active contact AC that is not covered with the mask pattern MAP may be recessed to form a recess part RSP, and a remaining region of the contact pattern CP that is not covered with the mask pattern MAP may also be recessed to form a recess part RSP. The recess part RSP of the active contact AC and the recess part RSP of the contact pattern CP may have their top surfaces lower than that of the gate electrode GE. An upper portion of the lower dielectric layer LIL may also be recessed during the etching process.

Referring to FIGS. 4 and 11A to 11H, an upper dielectric layer UIL may be formed to fill the recess hole RSH. The upper dielectric layer UIL may include a dielectric material the same as or different from that of the lower dielectric layer LIL. The upper dielectric layer UIL may cover the top surface of the recess part RSP included in the active contact AC and also cover the top surface of the recess part RSP included in the contact pattern CP. The upper dielectric layer UIL and the lower dielectric layer LIL may constitute a first interlayer dielectric layer 110.

A sacrificial dielectric layer SAL may be formed on the first interlayer dielectric layer 110. A gate contact GC may be formed to penetrate the sacrificial dielectric layer SAL and the gate capping pattern GP and to electrically connect with the gate electrode GE.

For example, a second photolithography process may be performed to form second contact holes that penetrate the sacrificial dielectric layer SAL. The second contact hole may define the gate contact GC. The second contact hole may expose the top surface of the gate electrode GE. A barrier pattern BM and a conductive pattern FM may be sequentially formed in the second contact hole to form the gate contact GC. The gate contact GC may have a top surface coplanar with that of the sacrificial dielectric layer SAL.

A first gate contact GC1 of the gate contacts GC may be formed to partially overlap a second active contact AC2. Therefore, the first gate contact GC1 may be coupled to a top surface of a third gate electrode GE3, while penetrating the upper portion of the second active contact AC2. The first gate contact GC1 and the second active contact AC2 may directly contact each other to form a first common contact SHC1. Second to fourth common contacts SHC2 to SHC4 may be formed by substantially the same process.

According to a method of fabricating a semiconductor memory device in accordance of the present disclosure, the active contact AC may be formed, and then the gate contact GC may be formed such that its portion overlaps the active contact AC. Therefore, the gate contact GC may be formed to include a protrusion part (e.g., see PRP of FIG. 6A) that is buried in the active contact AC. As a result, a common contact SHC or a first node (e.g., see N1 of FIG. 1) may decrease in electric resistance, and a static random access memory (SRAM) cell may increase in operating speed or electrical properties.

Referring back to FIGS. 4 and 5A to 5J, the gate contacts GC and the sacrificial dielectric layer SAL may undergo a planarization process until top surfaces of the active contacts AC and the contact patterns CP are exposed. Thus, the sacrificial dielectric layer SAL may be completely removed. The top surface of the gate contact GC may be coplanar with that of the active contact AC and that of the contact pattern CP.

Second, third, and fourth interlayer dielectric layers 120, 130, and 140 may be sequentially formed on the first interlayer dielectric layer 110. A back-end-of-line (BEOL) process may be performed to form a first wiring layer M1 in the second interlayer dielectric layer 120, a second wiring layer M2 in the third interlayer dielectric layer 130, and a third wiring layer M3 in the fourth interlayer dielectric layer 140. The second wiring layer M2 and the third wiring layer M3 may be formed only on the memory cell region MCR. The first wiring layer M1 may include first and second test lines M1_T1 and M1_T2 on the test region TSR.

Figure 12A:
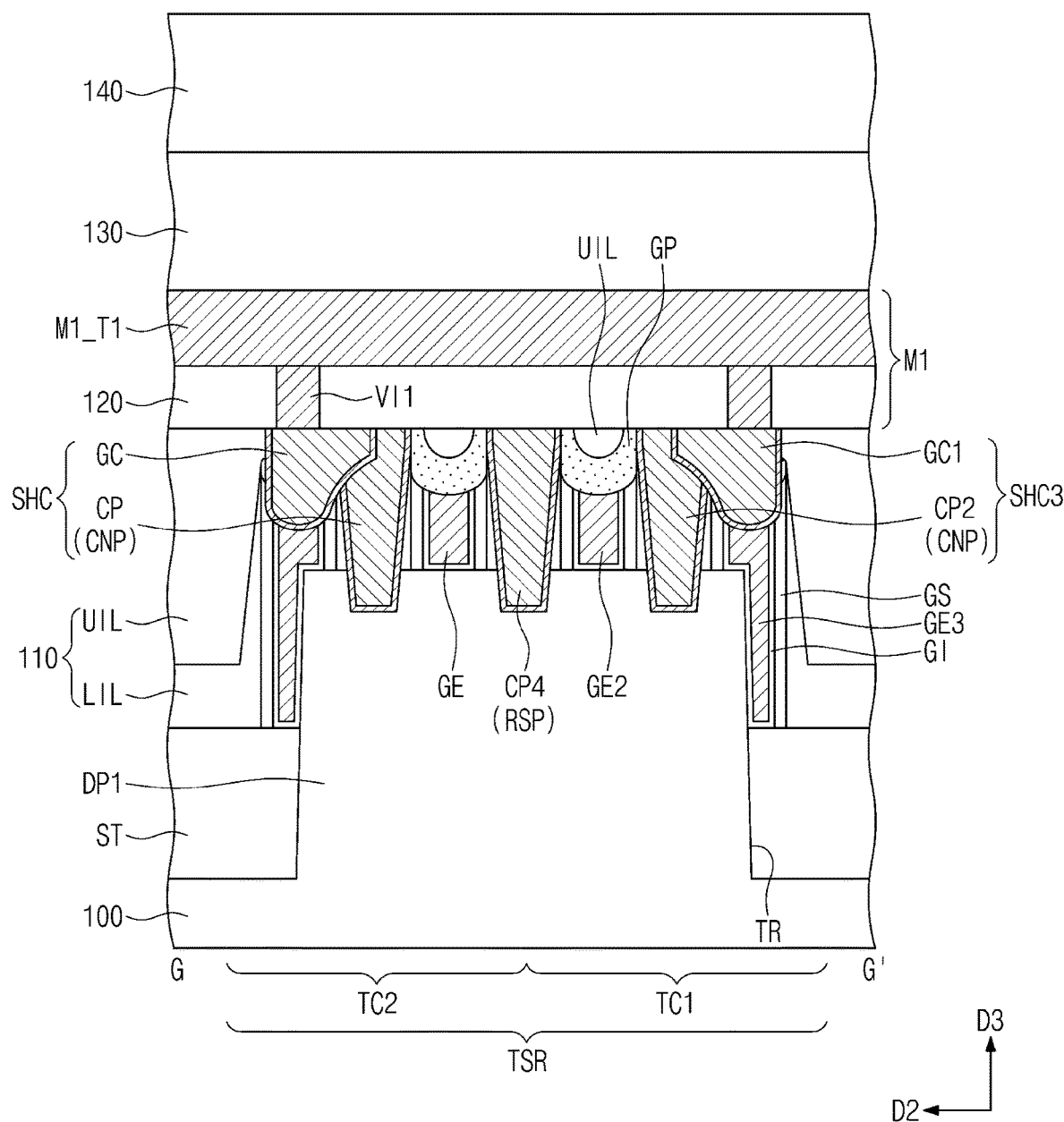
FIGS. 12A, 12B, and 12C illustrate cross-sectional views respectively taken along lines G-G', I-I', and J-J' of FIG. 4, showing a semiconductor memory device according to some embodiments of the present disclosure.
Figure 12B:
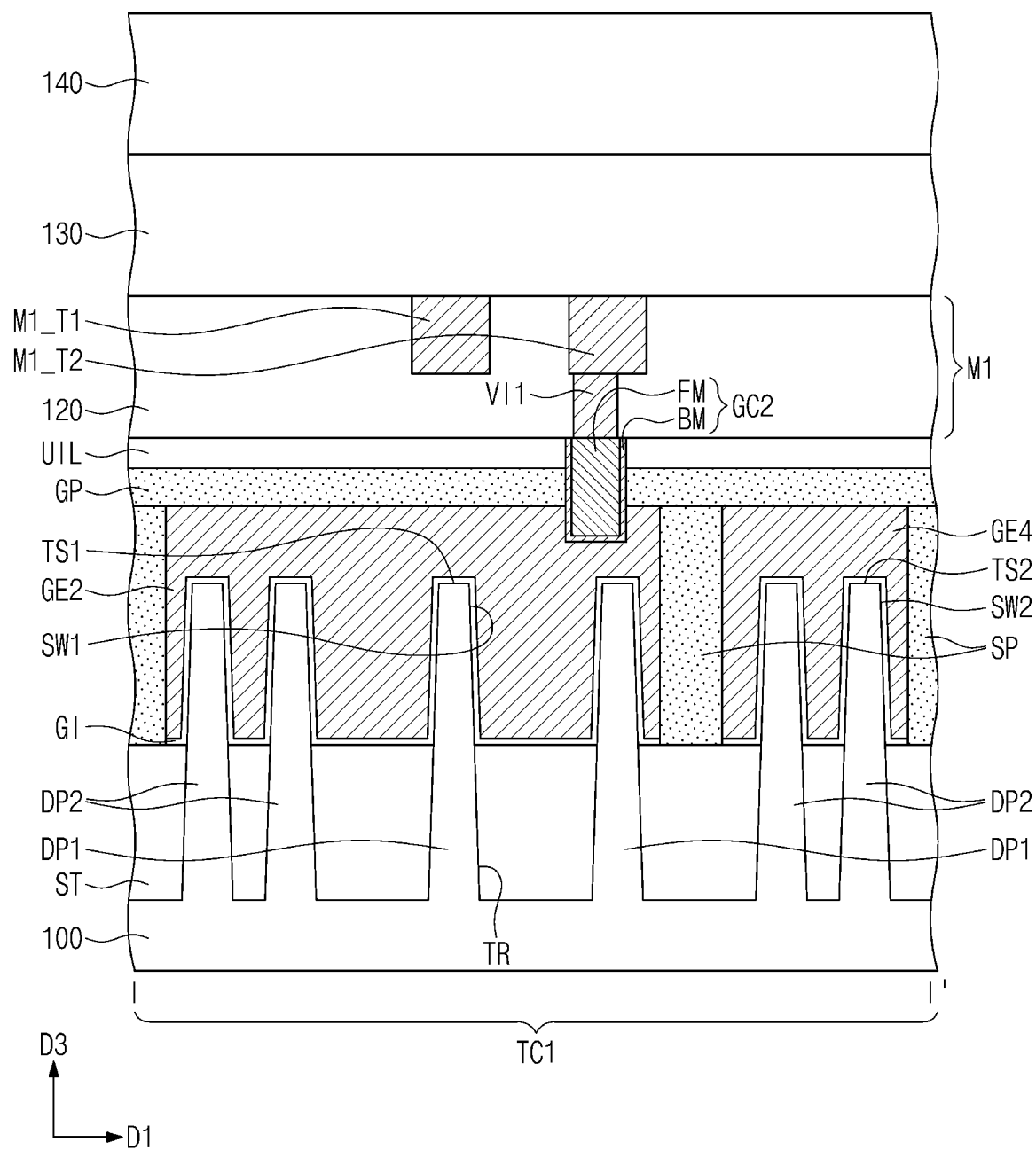
Figure 12C:
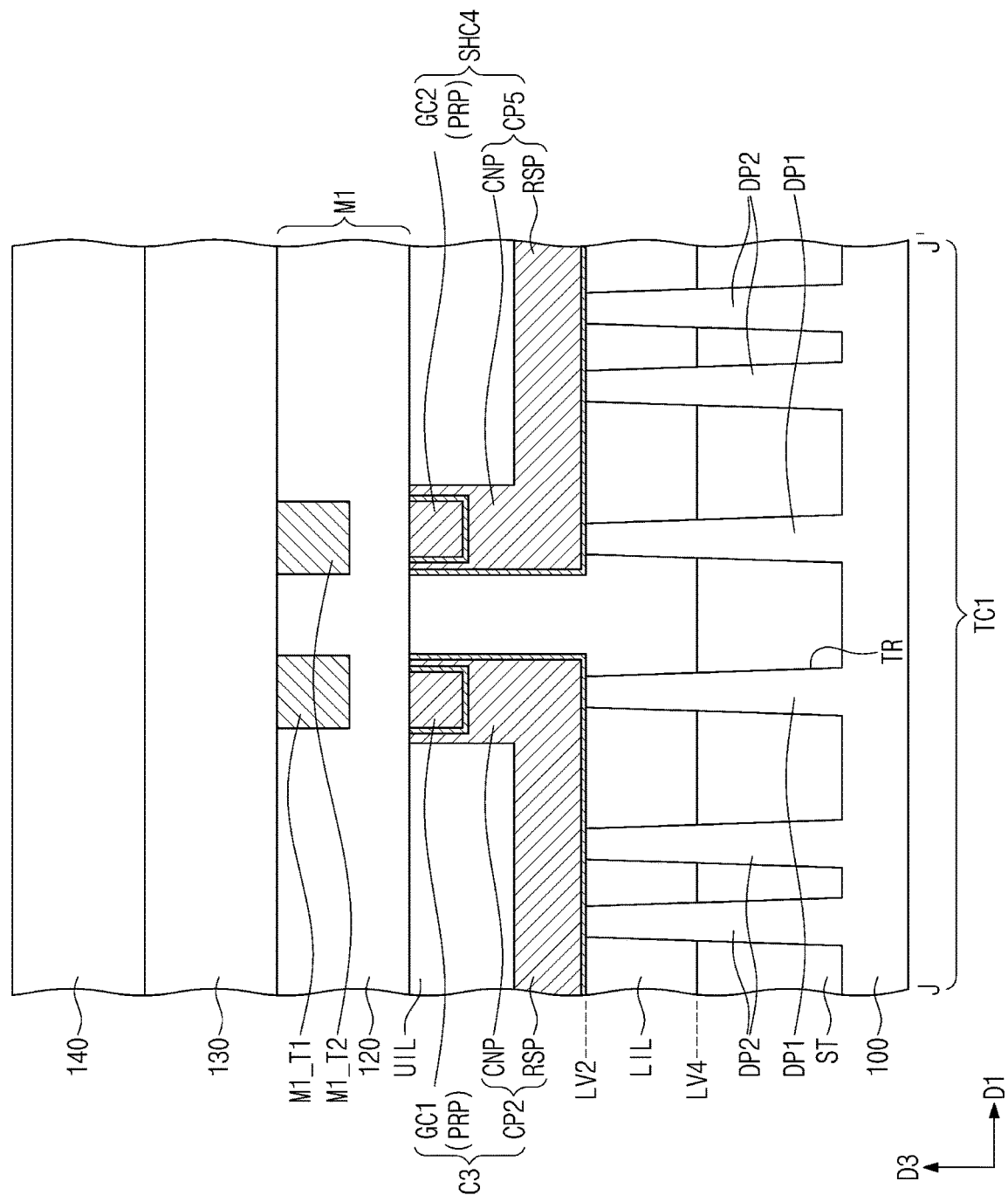

FIGS. 12A, 12B, and 12C illustrate cross-sectional views respectively taken along lines G-G', I-I', and J-J' of FIG. 4, showing a semiconductor memory device according to some embodiments of the present disclosure. In the embodiment that follows, omission is made to avoid repetitive description with reference to FIGS. 4 and 5A to 5J, and differences are explained in detail.

Referring to FIGS. 4 and 12A to 12C, the first via VI1 between the first test line M1_T1 and the third common contact SHC3 may be horizontally offset from the second contact pattern CP2. The first via VI1 between the second test line M1_T2 and the fourth common contact SHC4 may be horizontally offset from the fifth contact pattern CP5.

The first via VI1 between the first test line M1_T1 and the third common contact SHC3 may vertically overlap the third gate electrode GE3. The first via VI1 between the second test line M1_T2 and the fourth common contact SHC4 may vertically overlap the second gate electrode GE2. For example, a position of the first via VI1 may be freely changed on the third common contact SHC3 or the fourth common contact SHC4.

Figure 13A:
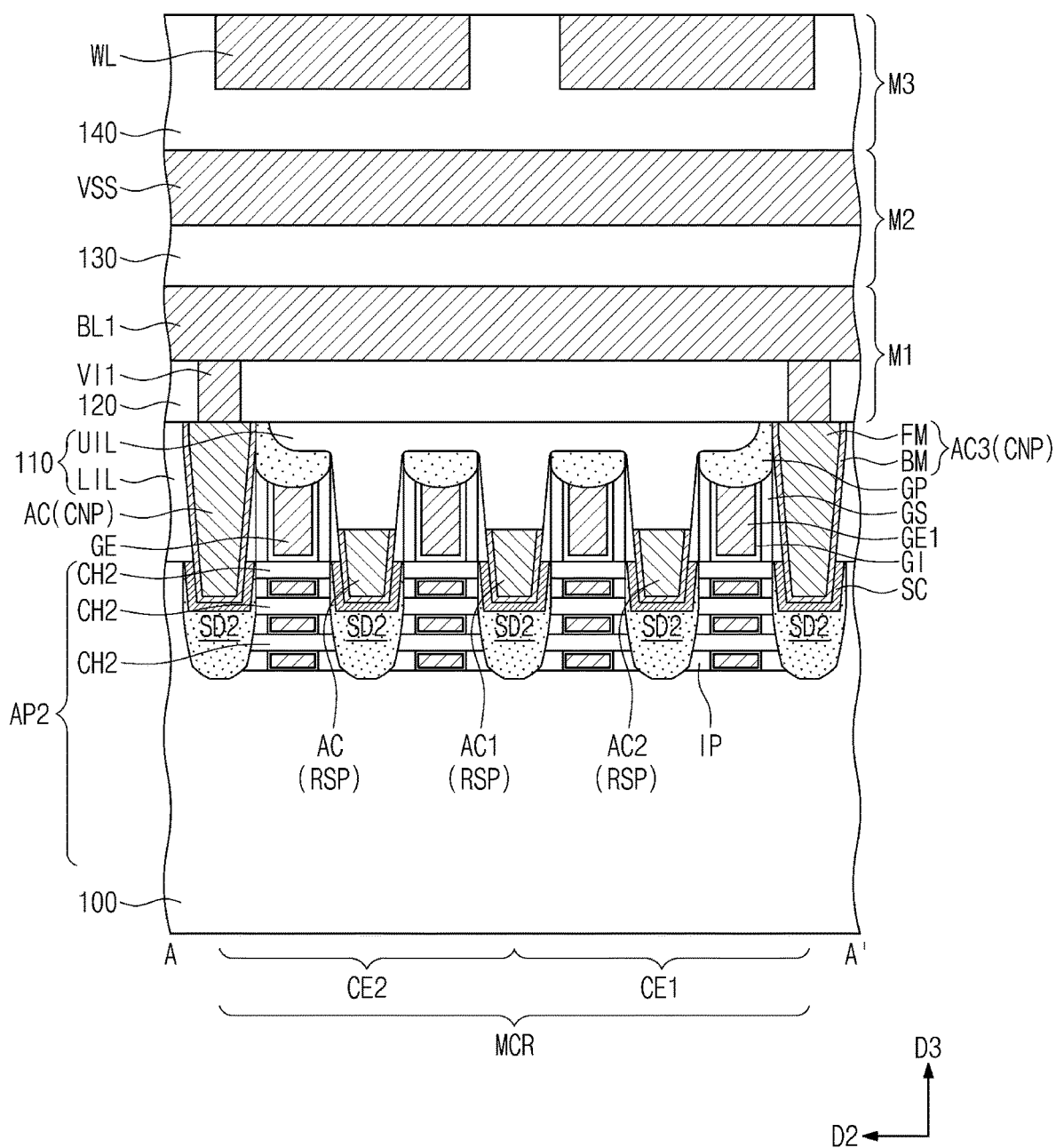
FIGS. 13A, 13B, and 13C illustrate cross-sectional views respectively taken along lines A-A', B-B', and D-D' of FIG. 4, showing a semiconductor memory device according to some embodiments of the present disclosure.
Figure 13B:
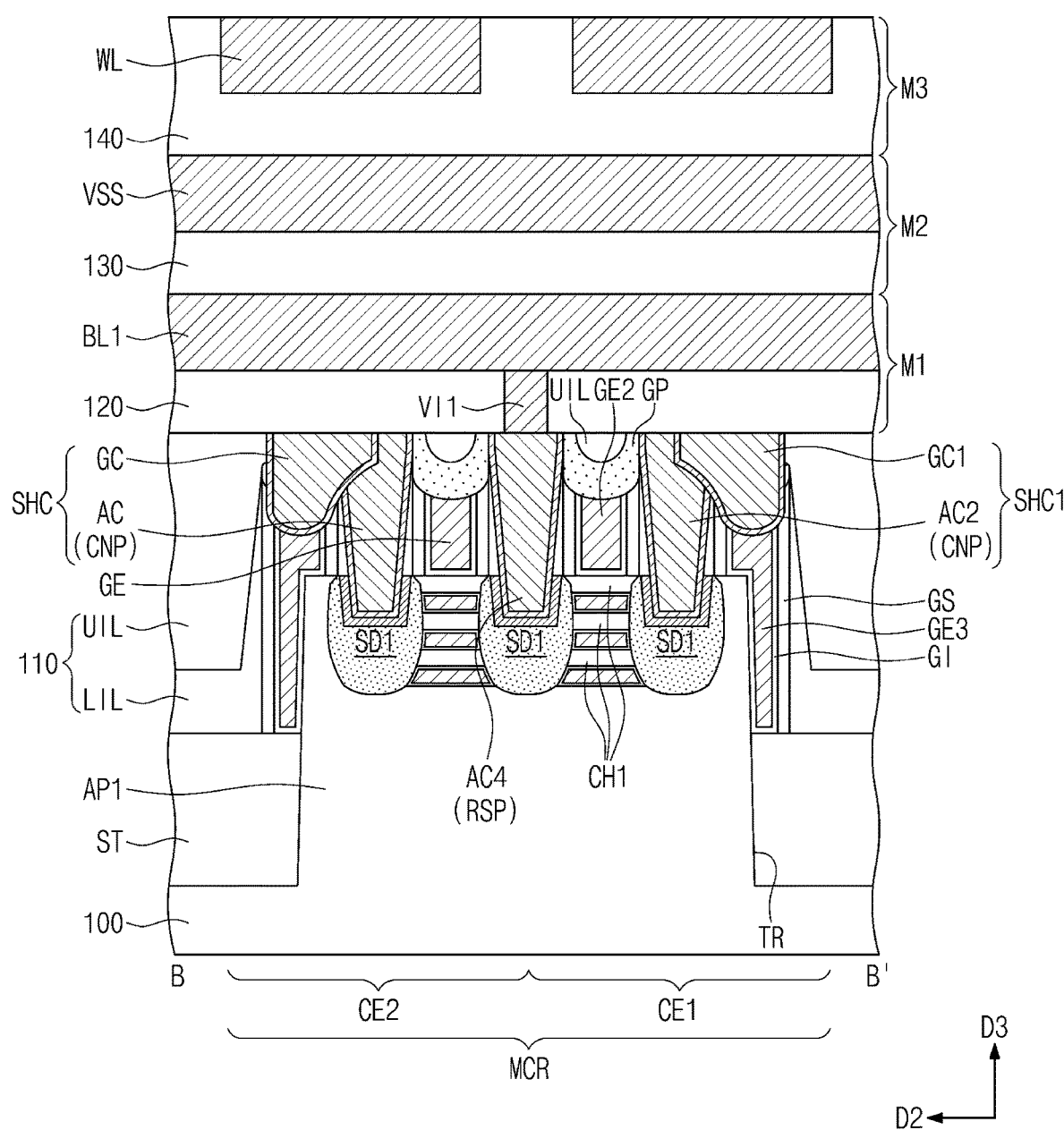
Figure 13C:
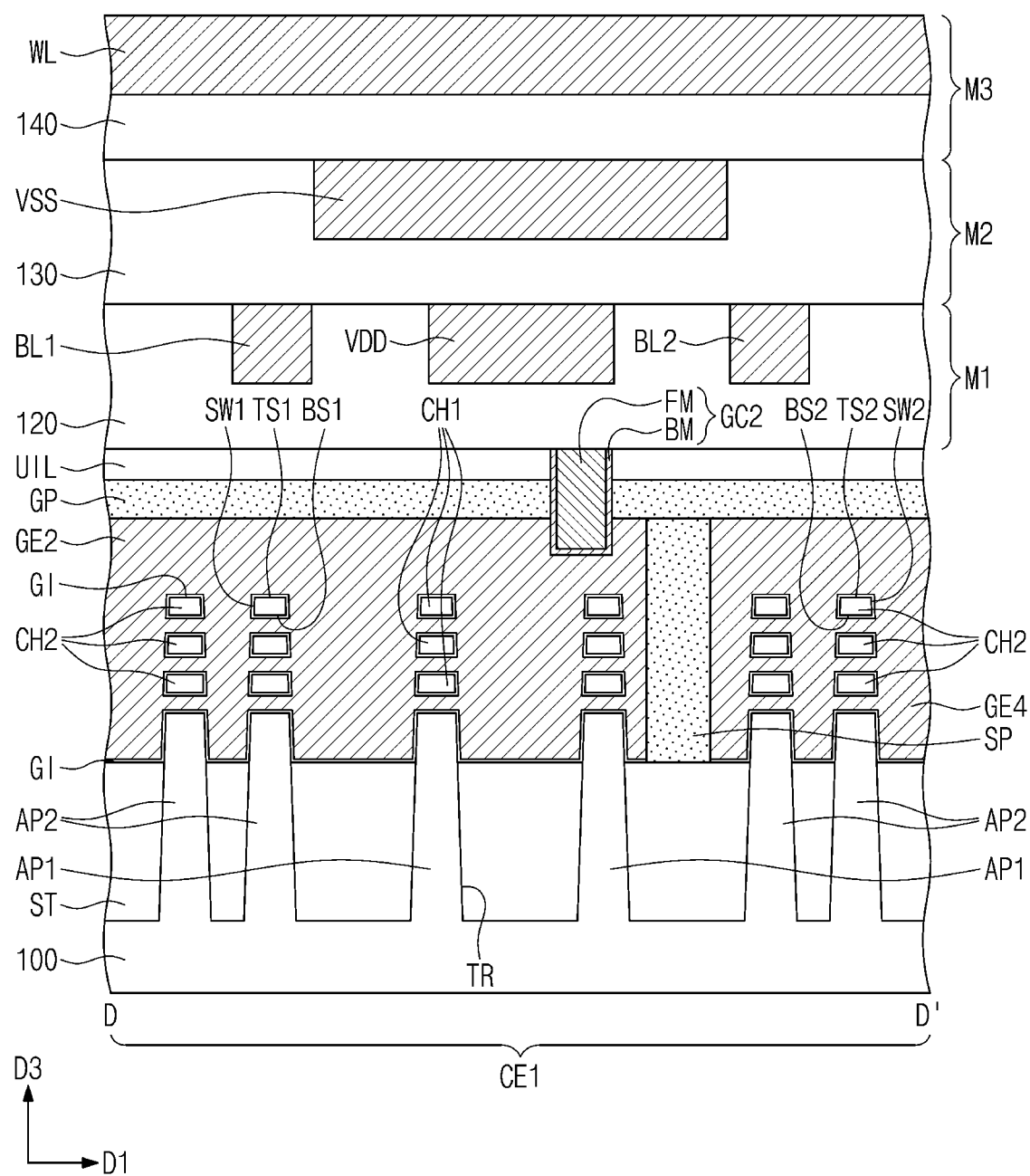

FIGS. 13A, 13B, and 13C illustrate cross-sectional views respectively taken along lines A-A', B-B', and D-D' of FIG. 4, showing a semiconductor memory device according to some embodiments of the present disclosure. In the embodiment that follows, omission is made to avoid repetitive description with reference to FIGS. 4 and 5A to 5J, and differences are explained in detail.

Referring to FIGS. 4 and 13A to 13C, first and second active patterns AP1 and AP2 may be provided on a substrate 100. The first active pattern AP1 may include first channel patterns CH1 that are vertically stacked. The stacked first channel patterns CH1 may be spaced apart from each other in the third direction D3. The stacked first channel patterns CH1 may vertically overlap each other. The second active pattern AP2 may include second channel patterns CH2 that are vertically stacked. The stacked second channel patterns CH2 may be spaced apart from each other in the third direction D3. The stacked second channel patterns CH2 may vertically overlap each other. The first and second channel patterns CH1 and CH2 may include at least one material selected from silicon (Si), germanium (Ge), and silicon-germanium (SiGe), or a combination thereof.

The first active pattern AP1 may further include first source/drain patterns SD1. The stacked first channel patterns CH1 may be interposed between a pair of neighboring first source/drain patterns SD1. The stacked first channel patterns CH1 may connect the pair of neighboring first source/drain patterns SD1 to each other.

The second active pattern AP2 may further include second source/drain patterns SD2. The stacked second channel patterns CH2 may be interposed between a pair of neighboring second source/drain patterns SD2. The stacked second channel patterns CH2 may connect the pair of neighboring second source/drain patterns SD2 to each other.

Gate electrodes GE may be provided to extend in the first direction D1, while running across the first and second channel patterns CH1 and CH2. The gate electrodes GE may each vertically overlap the first and second channel patterns CH1 and CH2.

The gate electrode GE may surround each of the first channel patterns CH1. For example, the gate electrode GE may be provided on a first top surface TS1, first sidewalls SW1, and a first bottom surface BS1 of each of the first channel patterns CH1 (e.g., see FIG. 13C). The gate electrode GE may surround each of the second channel patterns CH2. For example, the gate electrode GE2 may be provided on a second top surface TS2, second sidewalls SW2, and a second bottom surface BS2 of each of the second channel patterns CH2 (e.g., see FIG. 13C). A transistor according to some embodiments may be a three-dimensional field effect transistor (e.g., multi-bridge channel field effect transistor (MBCFET) or a gate-all-around field effect transistor (GAAFET)) in which the gate electrode GE three-dimensionally surrounds the first and second channel patterns CH1 and CH2.

A gate dielectric layer GI may be provided between the gate electrode GE and each of the first and second channel patterns CH1 and CH2. The gate dielectric layer GI may surround each of the first and second channel patterns CH1 and CH2.

On the second active pattern AP2, an inner spacer IP may be interposed between the gate dielectric layer GI and the second source/drain pattern SD2. The gate dielectric layer GI and the inner spacer IP may separate the gate electrode GE from the second source/drain pattern SD2. In contrast, the inner spacer IP may be omitted on the first active pattern AP1.

According to some embodiments of the present disclosure, short failure may be non-destructively measured by employing a voltage ramping method in which different voltages are applied to a first test line and a second test line, and in which the difference in voltage is increased. Therefore, it may be possible to decrease a time required for detecting short failure that occurs between an active contact and a gate electrode due to a reduction in size of semiconductor devices and to cut down costs by preventing wafer consumption resulting from destructive analysis. As a result, it may be possible to overcome difficulties related to detecting failures in a semiconductor memory device when compared to a conventional semiconductor memory device.

Although the present disclosure have been described in connection with the some example embodiments of the present disclosure illustrated in the accompanying drawings, it will be understood by one of ordinary skill in the art that variations in form and detail may be made therein without departing from the spirit and essential feature of the present disclosure. The above disclosed embodiments should thus be considered illustrative and not restrictive.

What is claimed is:

1. A semiconductor memory device, comprising:
   a substrate that comprises a memory cell region and a test region;
   an active pattern on the memory cell region;
   a source/drain pattern on the active pattern;
   a dummy pattern on the test region;
   a first gate electrode that extends in a first direction on the dummy pattern;
   a first common contact in contact with the dummy pattern and the first gate electrode; and
   a first wiring layer on the first common contact,
   wherein the first wiring layer comprises a first test line electrically connected to the first common contact,
   wherein the first common contact comprises:
      a first contact pattern in contact with the dummy pattern; and
      a first gate contact electrically connected to the first gate electrode,
   wherein the first gate contact comprises:
      a body part coupled to the first gate electrode; and
      a protrusion part that extends from the body part and into the first contact pattern, and
   wherein a lowermost level of a top surface of the active pattern is lower than a lowermost level of a top surface of the dummy pattern.

2. The semiconductor memory device of claim 1, wherein:
the protrusion part vertically overlaps the first contact pattern, and
the body part is horizontally offset from the first contact pattern.

3. The semiconductor memory device of claim 1, wherein a top surface of the body part is coplanar with a top surface of the first contact pattern.

4. The semiconductor memory device of claim 1, wherein:
the first contact pattern comprises a connection part and a recess part other than the connection part;
the connection part is in contact with the protrusion part; and
a top surface of the recess part is lower than a top surface of the connection part.

5. The semiconductor memory device of claim 1, further comprising:
a second gate electrode spaced apart from the first gate electrode in a second direction that intersects the first direction; and
a second common contact spaced apart in the first direction from the first common contact,
wherein the second common contact comprises:
a second contact pattern that contacts the dummy pattern and extends in the first direction; and
a second gate contact electrically connected to the second gate electrode.

6. The semiconductor memory device of claim 5, wherein the first wiring layer further comprises a second test line electrically connected to the second common contact,
wherein a voltage applied to the second test line is different from a voltage applied to the first test line.

7. The semiconductor memory device of claim 1, further comprising a second wiring layer on the first wiring layer,
wherein the second wiring layer is horizontally offset from the first test line.

8. The semiconductor memory device of claim 1, further comprising a first via between the first test line and the first common contact,
wherein the first via vertically overlaps the first contact pattern.

9. The semiconductor memory device of claim 1, further comprising a first via between the first test line and the first common contact,
wherein the first via is horizontally offset from the first contact pattern.

10. The semiconductor memory device of claim 1, wherein the first gate electrode is disposed between dielectric patterns.

11. A semiconductor memory device, comprising:
a memory cell region and a test region on a substrate;
a dummy pattern on the test region;
a first gate electrode that extends in a first direction on the dummy pattern;
a first common contact in contact with the dummy pattern and the first gate electrode;
a second gate electrode spaced apart from the first gate electrode in a second direction that intersects the first direction;
a second common contact spaced apart in the first direction from the first common contact; and
a first wiring layer provided on and coupled to the first and second common contacts,
wherein the first wiring layer comprises a first test line and a second test line that extend in the second direction, the first and second test lines being respectively electrically connected to the first and second common contacts,
wherein the first common contact comprises:
a first contact pattern in contact with the dummy pattern; and
a first gate contact electrically connected to the first gate electrode,
wherein the second common contact comprises:
a second contact pattern in contact with the dummy pattern; and
a second gate contact electrically connected to the second gate electrode, and
wherein the first gate contact comprises:
a first body part coupled to the first gate electrode; and
a first protrusion part that extends from the first body part and into the first contact pattern.

12. The semiconductor memory device of claim 11, wherein the second gate contact includes:
a second body part coupled to the second gate electrode; and
a second protrusion part that extends from the second body part and into the second contact pattern.

13. The semiconductor memory device of claim 11, wherein a voltage applied to the first test line is different from a voltage applied to the second test line.

14. The semiconductor memory device of claim 11, further comprising:
an active pattern on the memory cell region;
a source/drain pattern on the active pattern;
a third gate electrode on the active pattern and extending in the first direction, the third gate electrode being adjacent to the source/drain pattern in the second direction; and
a third common contact coupled to the source/drain pattern and the third gate electrode, the third common contact electrically connecting the source/drain pattern and the third gate electrode to each other,
wherein the third common contact comprises:
an active contact electrically connected to the source/drain pattern; and
a third gate contact electrically connected to the third gate electrode.

15. The semiconductor memory device of claim 14, wherein a lowermost level of a top surface of the active pattern is lower than a lowermost level of a top surface of the dummy pattern.

16. A semiconductor memory device, comprising:
a substrate that includes a memory cell region and a test region;
an active pattern on the memory cell region;
a source/drain pattern on the active pattern;
a dummy pattern on the test region;
a device isolation layer on the substrate, a lower sidewall of each of the active pattern and the dummy pattern, wherein an upper portion of each of the active pattern and the dummy pattern protrudes upwardly from the device isolation layer;
a first gate electrode on the active pattern and extending in a first direction, wherein the first gate electrode and the source/drain pattern are adjacent to each other in a second direction that intersects the first direction;
a first common contact coupled to the source/drain pattern and the first gate electrode, wherein the first common contact electrically connects the source/drain pattern and the first gate electrode to each other;

a second gate electrode that extends in the first direction on the dummy pattern;

a second common contact in contact with the dummy pattern and the second gate electrode;

a gate spacer on a sidewall of each of the first and second gate electrodes;

a gate capping pattern on a top surface of each of the first and second gate electrodes;

an interlayer dielectric layer on the gate capping pattern; and a first wiring layer, a second wiring layer, and a third wiring layer that are sequentially stacked on the interlayer dielectric layer, wherein the first common contact comprises:
 an active contact that penetrates the interlayer dielectric layer and electrically connects with the source/drain pattern; and
 a first gate contact that penetrates the gate capping pattern and electrically connects with the first gate electrode, wherein the second common contact comprises:
 a first contact pattern that penetrates the interlayer dielectric layer and contacts the dummy pattern; and
 a second gate contact that penetrates the gate capping pattern and electrically connects with the second gate electrode, wherein the first gate contact comprises:
 a first body part coupled to the first gate electrode; and
 a first protrusion part that extends from the first body part and into the active pattern, wherein the second gate contact comprises:
 a second body part coupled to the second gate electrode; and
 a second protrusion part that extends from the second body part and into the first contact pattern, wherein the first wiring layer includes a first test line electrically connected to the second common contact, the first test line extending in the second direction, and wherein a lowermost level of a top surface of the active pattern is lower than a lowermost level of a top surface of the dummy pattern.

17. The semiconductor memory device of claim 16, further comprising:
 a third gate electrode spaced apart in the second direction from the second gate electrode; and
 a third common contact spaced apart in the first direction from the second common contact,
 wherein the third common contact comprises:
  a second contact pattern that contacts the dummy pattern and extends in the first direction; and
  a third gate contact electrically connected to the third gate electrode, and
 wherein the first wiring layer further comprises a second test line electrically connected to the third common contact, the second test line extending in the second direction.

18. The semiconductor memory device of claim 16, wherein:
 a top surface of the device isolation layer on the memory cell region comprises a recess region that is recessed downwardly; and
 a top surface of the device isolation layer on the test region is flat.

19. The semiconductor memory device of claim 16, further comprising a channel pattern connected to the source/drain pattern,
 wherein the first gate electrode covers a top surface, a bottom surface, and a sidewall of the channel pattern.

20. The semiconductor memory device of claim 16, wherein:
 the first wiring layer includes a bit line on the memory cell region; and
 the third wiring layer includes a word line on the memory cell region.

* * * * *